(12) United States Patent
Inoue et al.

(10) Patent No.: US 8,038,857 B2
(45) Date of Patent: Oct. 18, 2011

(54) THIN FILM TRANSISTOR, THIN FILM TRANSISTOR SUBSTRATE, PROCESSES FOR PRODUCING THE SAME, LIQUID CRYSTAL DISPLAY USING THE SAME, AND RELATED DEVICES AND PROCESSES; AND SPUTTERING TARGET, TRANSPARENT ELECTROCONDUCTIVE FILM FORMED BY USE OF THIS, TRANSPARENT ELECTRODE, AND RELATED DEVICES AND PROCESSES

(75) Inventors: Kazuyoshi Inoue, Chiba (JP); Shigekazu Tomai, Chiba (JP); Masato Matsubara, Chiba (JP)

(73) Assignee: Idemitsu Kosan Co., Ltd., Chiyoda-ku, Tokyo (JP)

( * ) Notice: Subject to any disclaimer, the term of this patent is extended or adjusted under 35 U.S.C. 154(b) by 296 days.

(21) Appl. No.: 10/592,280

(22) PCT Filed: Mar. 2, 2005

(86) PCT No.: PCT/JP2005/003489
§ 371 (c)(1),
(2), (4) Date: Sep. 8, 2006

(87) PCT Pub. No.: WO2005/086180
PCT Pub. Date: Sep. 15, 2005

(65) Prior Publication Data
US 2007/0170434 A1    Jul. 26, 2007

(30) Foreign Application Priority Data

| Mar. 9, 2004 | (JP) | 2004-065324 |
| Mar. 12, 2004 | (JP) | 2004-070113 |
| Apr. 27, 2004 | (JP) | 2004-130702 |
| Apr. 28, 2004 | (JP) | 2004-132621 |
| Sep. 21, 2004 | (JP) | 2004-272951 |

(51) Int. Cl.
*C23C 14/08* (2006.01)

(52) U.S. Cl. .................. 204/298.13; 252/518.1

(58) Field of Classification Search .................. 428/432, 428/63, 656, 697, 922; 204/192, 298.13; 252/500, 518.1, 519
See application file for complete search history.

(56) References Cited

U.S. PATENT DOCUMENTS
5,667,853 A    9/1997    Fukuyoshi et al.
(Continued)

FOREIGN PATENT DOCUMENTS
JP    59-204625 A2    11/1984
(Continued)

OTHER PUBLICATIONS
JP 2001-011613 machine translation. Obtained Jun. 2009.*
(Continued)

*Primary Examiner* — Timothy M Speer
*Assistant Examiner* — Lauren Robinson
(74) *Attorney, Agent, or Firm* — Millen, White, Zelano & Branigan

(57) ABSTRACT

Provided are a thin film transistor substrate having a transparent electroconductive film in which residues and so on resulting etching are hardly generated; a process for producing the same; and a liquid crystal display using this thin film transistor substrate.

A thin film transistor substrate, comprising a transparent substrate,
a source electrode formed over the transparent substrate, a drain electrode formed over the transparent substrate, and a transparent pixel electrode formed over the transparent substrate, wherein the transparent pixel electrode is a transparent electroconductive film which is made mainly of indium oxide, and further comprises one or two or more oxides selected from tungsten oxide, molybdenum oxide, nickel oxide and niobium oxide, and the transparent pixel electrode is electrically connected to the source electrode or the drain electrode; a process for producing the same; and a liquid crystal display using this thin film transistor substrate.

7 Claims, 11 Drawing Sheets

U.S. PATENT DOCUMENTS

| | | | |
|---|---|---|---|
| 5,972,527 A | 10/1999 | Kaijou et al. | |
| 6,033,542 A | 3/2000 | Yamamoto et al. | |
| 6,042,752 A * | 3/2000 | Mitsui | 252/520.1 |
| 6,252,247 B1 | 6/2001 | Sakata et al. | |
| 6,356,328 B1 | 3/2002 | Shin et al. | |
| 6,534,183 B1 * | 3/2003 | Inoue | 428/432 |
| 6,646,661 B2 | 11/2003 | Lim et al. | |
| 6,689,477 B2 | 2/2004 | Inoue | |
| 6,911,163 B2 | 6/2005 | Abe et al. | |
| 2002/0061410 A1 | 5/2002 | Sasaki et al. | |
| 2003/0148871 A1 | 8/2003 | Inoue et al. | |
| 2003/0184688 A1 | 10/2003 | Kim | |
| 2003/0218153 A1 * | 11/2003 | Abe | 252/500 |
| 2004/0013899 A1 * | 1/2004 | Abe | 428/655 |
| 2004/0070707 A1 | 4/2004 | Lim et al. | |
| 2004/0081836 A1 * | 4/2004 | Inoue et al. | 428/469 |
| 2004/0180217 A1 * | 9/2004 | Inoue et al. | 428/432 |
| 2005/0094047 A1 | 5/2005 | Kim | |
| 2005/0224766 A1 | 10/2005 | Abe | |

FOREIGN PATENT DOCUMENTS

| | | | |
|---|---|---|---|
| JP | 63-184726 A2 | 7/1988 | |
| JP | 01-289140 A2 | 11/1989 | |
| JP | 03-015107 A2 | 1/1991 | |
| JP | 04-253342 A2 | 9/1992 | |
| JP | 04-305627 A2 | 10/1992 | |
| JP | 06-187832 A2 | 7/1994 | |
| JP | 06-234565 A2 | 8/1994 | |
| JP | 07-045555 A2 | 2/1995 | |
| JP | 07-054133 A | 2/1995 | |
| JP | 07-054133 W | 2/1995 | |
| JP | 07-258826 A2 | 10/1995 | |
| JP | 07-301705 A2 | 11/1995 | |
| JP | 08-018058 A2 | 1/1996 | |
| JP | 09-123337 A2 | 5/1997 | |
| JP | 09-150477 A2 | 6/1997 | |
| JP | 10-065174 A2 | 3/1998 | |
| JP | 11-184195 A2 | 7/1999 | |
| JP | 11-253976 A2 | 9/1999 | |
| JP | 11-258625 A2 | 9/1999 | |
| JP | 11-264995 A2 | 9/1999 | |
| JP | 11-264996 A2 | 9/1999 | |
| JP | 11-266021 A2 | 9/1999 | |
| JP | 11-284195 A2 | 10/1999 | |
| JP | 2000-072526 A2 | 3/2000 | |
| JP | 2001-011613 | * | 1/2001 |
| JP | 2001-311954 A2 | 11/2001 | |
| JP | 2002-049058 A2 | 2/2002 | |
| JP | 2002-256424 A2 | 9/2002 | |
| JP | 2003-017706 A2 | 1/2003 | |
| JP | 2003-105532 A2 | 4/2003 | |
| JP | 2003-302647 A2 | 10/2003 | |
| JP | 2004-006221 A2 | 1/2004 | |
| JP | 2004-052102 A2 | 2/2004 | |
| JP | 2004-068054 | 3/2004 | |
| JP | 2004-119272 | 4/2004 | |
| JP | 2004-139780 | 5/2004 | |
| JP | 2004-146136 | 5/2004 | |
| JP | 2004-158315 | 6/2004 | |
| WO | WO/03/014409 | * | 2/2003 |

OTHER PUBLICATIONS

English translation of JP 2004-068054—Published Mar. 4, 2004—Idemitsu Kosan Co Ltd.—"Sputtering Target, Sintered Compact and Electrically Conductive Film Produced by Utilizing Them".

English translation of JP 2004-119272—Published Apr. 15, 2004—Idemitsu Kosan Co Ltd.—"Organic El Device and Substrate Used for lt".

English translation of JP 2004-146136—Published May 20, 2004—Idemitsu Kosan Co Ltd.'—"Electrode Substrate for Organic Electroluminescent (EL) Element, and Its Manufacturing Method and Organic EL Device".

English translation of JP 2004-139780—Published May 13, 2004—Idemitsu Kosan Co Ltd.—"Electrode Substrate for Organic Electroluminescent Device, Organic Electroluminescent Device, and Manufacturing Method of Its Device".

English translation of JP 2004-158315—Published Jun. 3, 2004—Idemitsu Kosan Co Ltd.—"Electrode Substrate for Organic Electroluminescent Element, and Organic EL Light Emitting Device".

* cited by examiner

Fig. 3 (1)
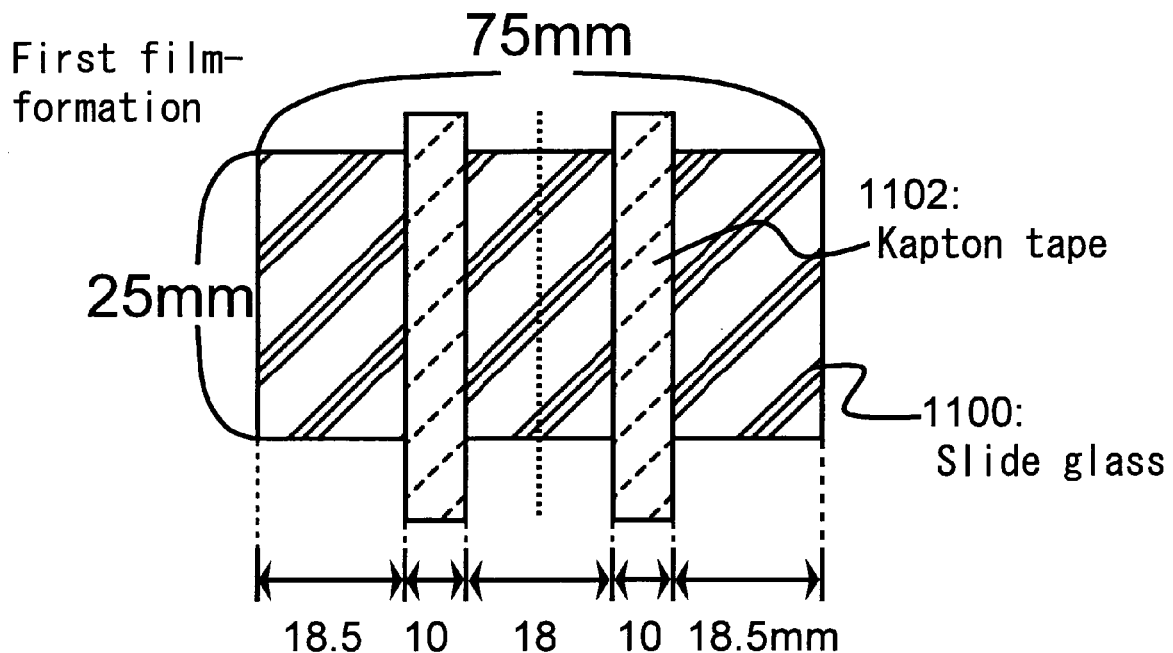
Fig. 3 (2)
After first film-formation
(Lifting-off of kapton tape)
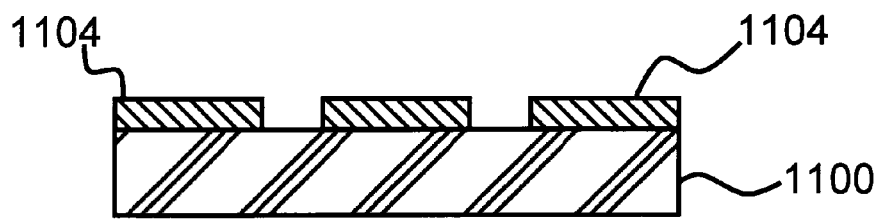

Fig. 4(1)
Second film-formation
1106: Kapton tape
1100: Slide glass
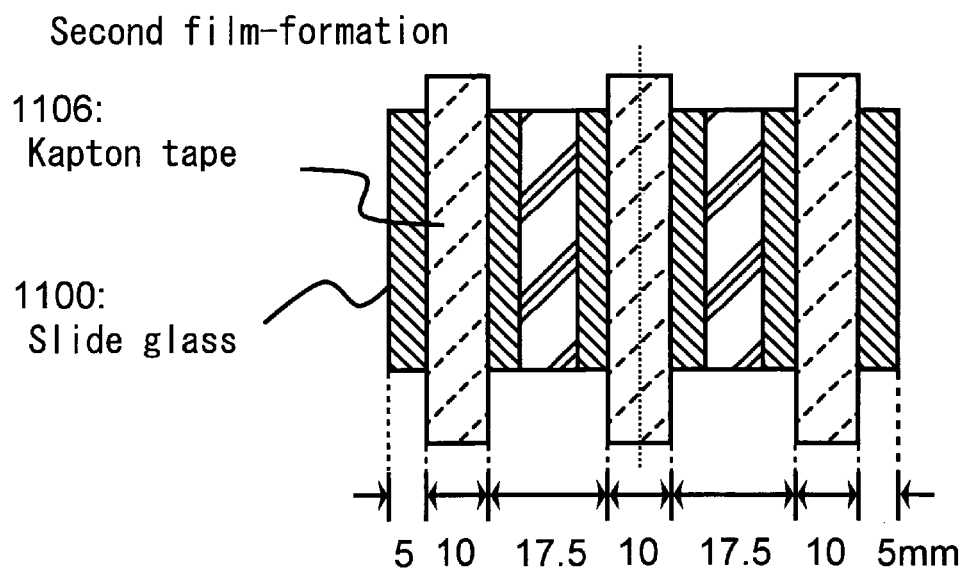
5　10　17.5　10　17.5　10　5mm
Fig. 4(2)  After second film-formation (Lifting-off of kapton tape)
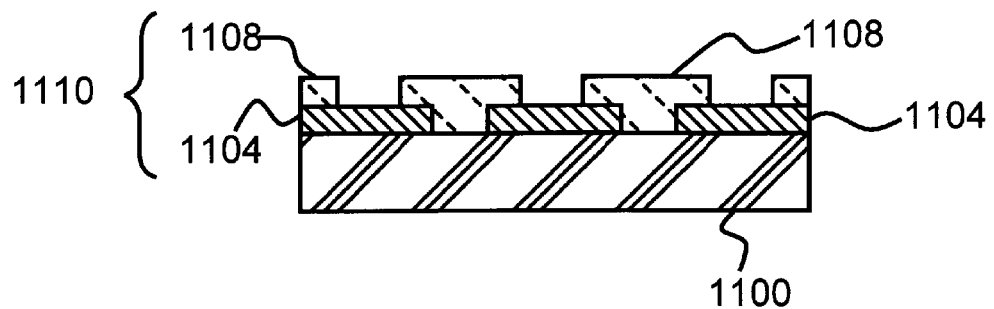

Resistance measurement

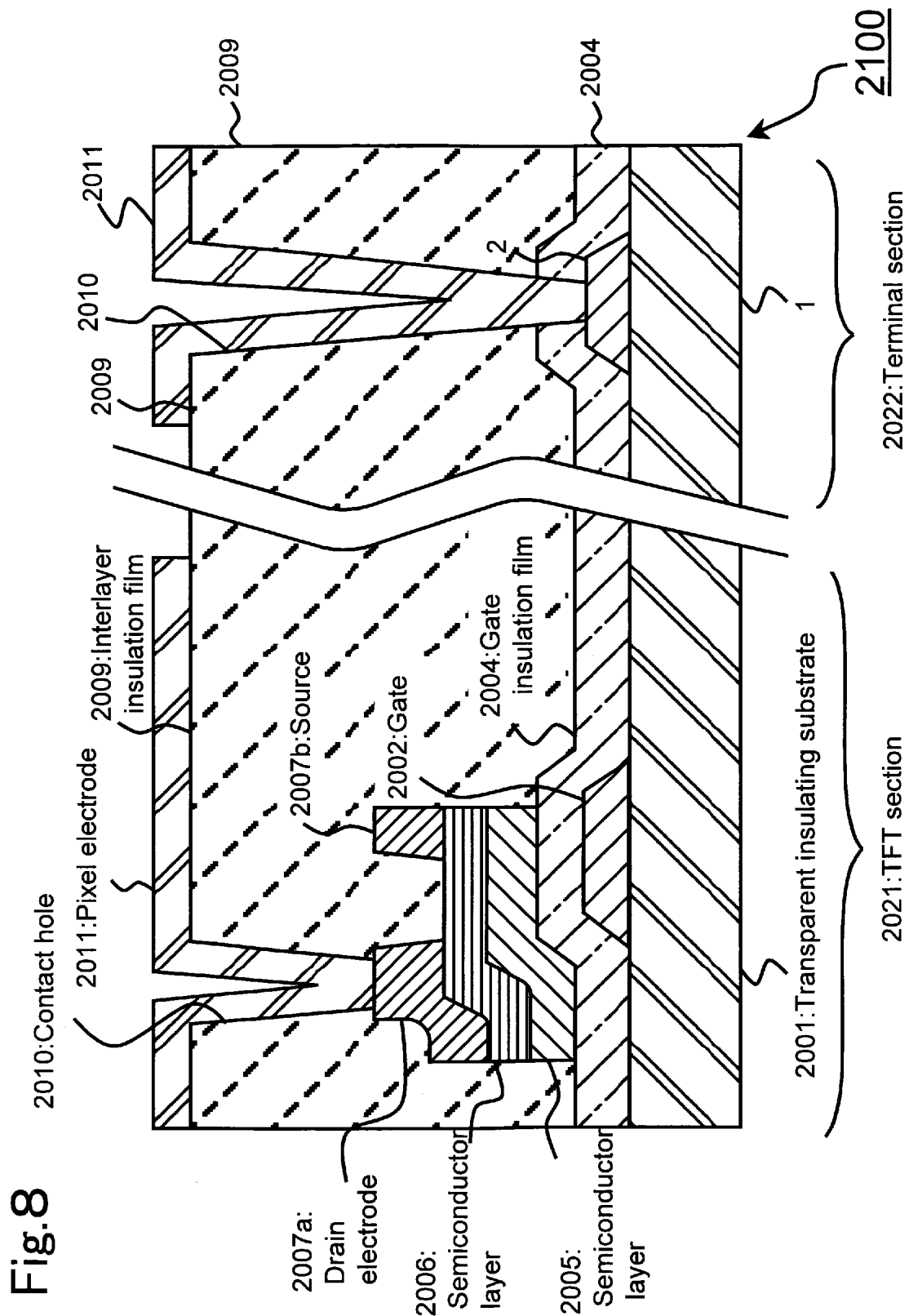

Fig.9
Wiring of a Kelvin pattern
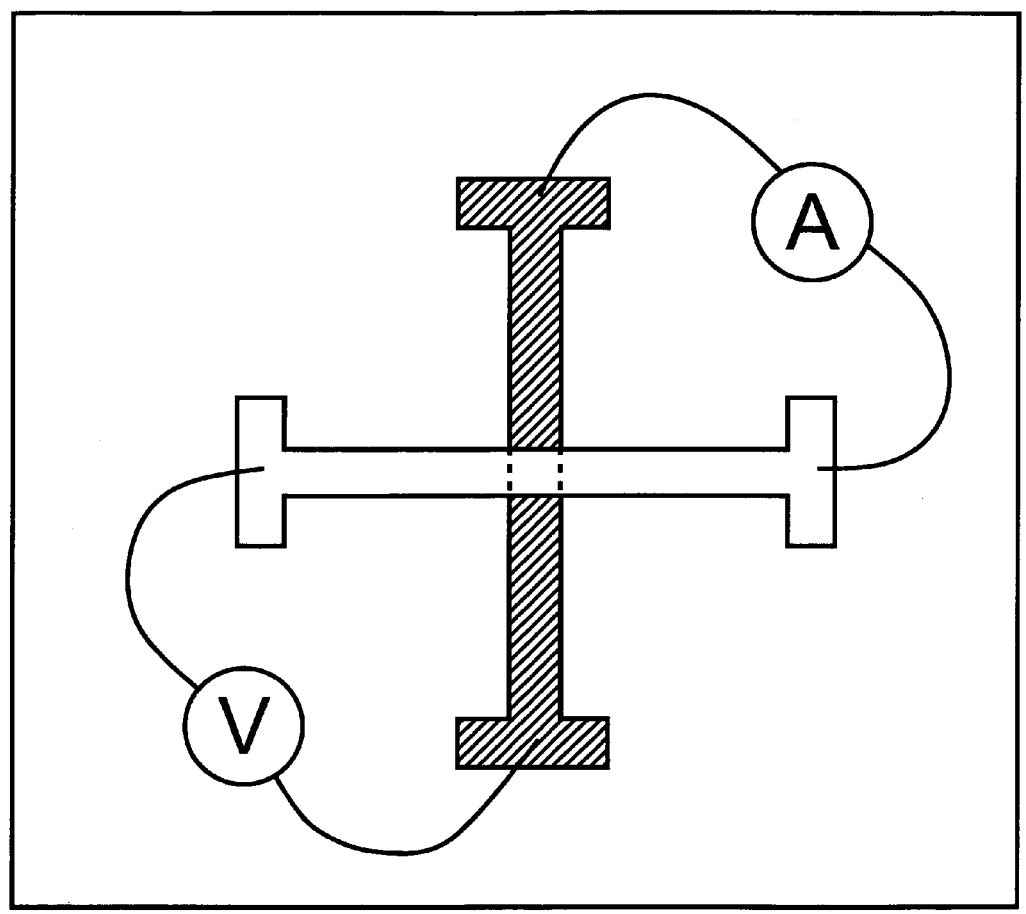
 Al alloy wiring pattern
 Metal oxide wiring pattern

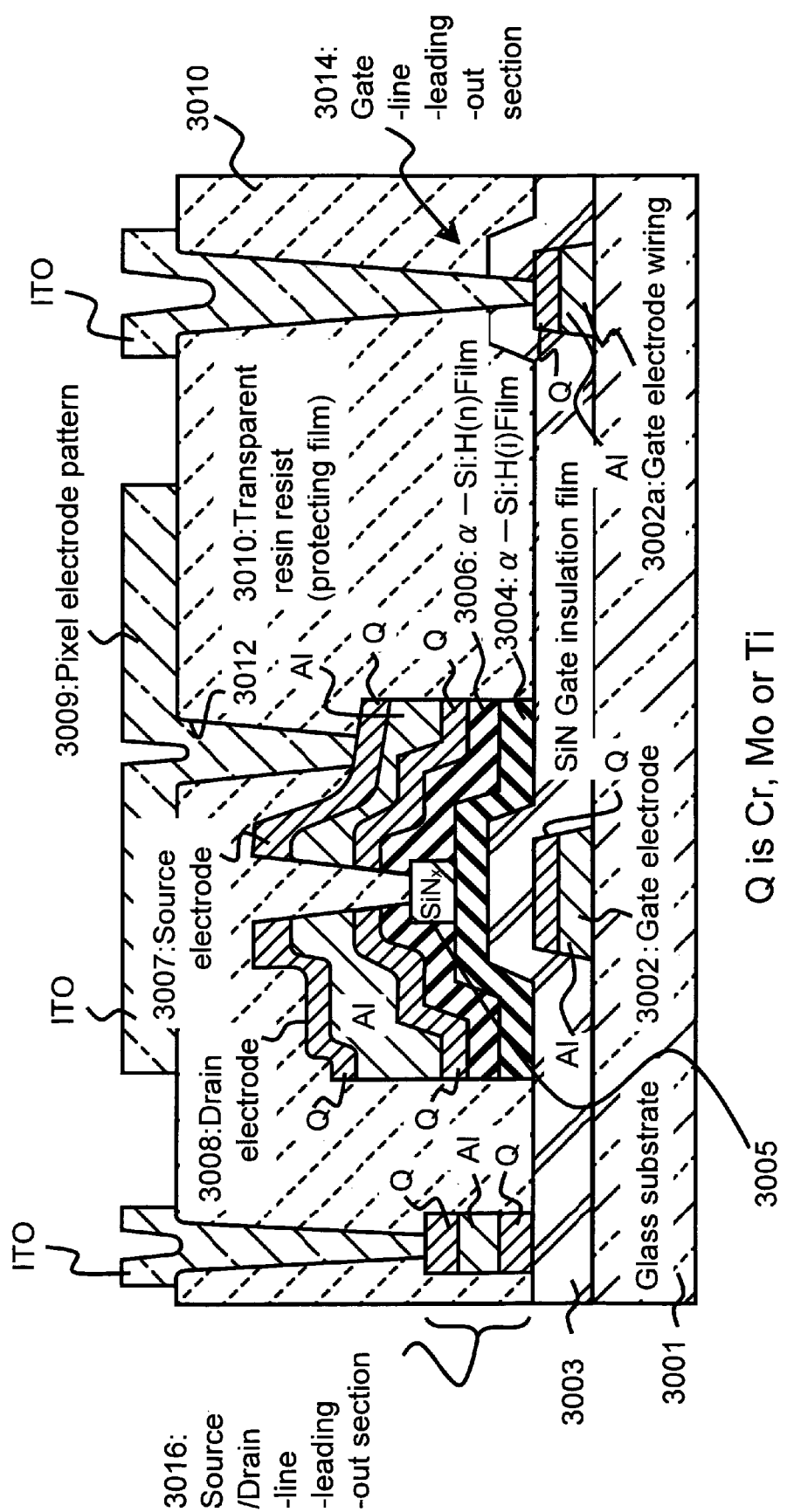

THIN FILM TRANSISTOR, THIN FILM TRANSISTOR SUBSTRATE, PROCESSES FOR PRODUCING THE SAME, LIQUID CRYSTAL DISPLAY USING THE SAME, AND RELATED DEVICES AND PROCESSES; AND SPUTTERING TARGET, TRANSPARENT ELECTROCONDUCTIVE FILM FORMED BY USE OF THIS, TRANSPARENT ELECTRODE, AND RELATED DEVICES AND PROCESSES

TECHNICAL FIELD

First Group: Field

The invention of the first group relates to a thin film transistor substrate for driving the liquid crystal of a liquid crystal display. The invention also relates to a process for producing the thin film transistor substrate, and a liquid crystal display using the thin film transistor substrate.

An abbreviation of a thin film transistor is used to call a thin film transistor substrate a TFT substrate in some cases.

Second Group: Field

The invention of the second group relates to a process for producing a liquid crystal display, using an amorphous silicon thin film transistor ($\alpha$-SiTFT) or a polysilicon thin film transistor (p-SiTFT). More specifically, the invention relates to a liquid crystal display enabling to reduce the contact resistance between a pixel electrode pattern and source/drain wirings, and the contact resistance between the following: wiring metals of a gate wiring leading-out section and source/drain electrode leading-out sections; and a transparent electrode. The invention also relates to a process for producing the same.

In particular, the invention relates to a contrivance about a sputtering target, a transparent electroconductive film obtained by a production process using this sputtering target, and a transparent electroconductive glass substrate having this transparent electroconductive film.

Third Group: Field

The invention of a third group relates to a thin film transistor (hereinafter, denoted as a TFT in some cases) substrate, in particular, a TFT. The invention relates to a process for producing this TFT substrate, and a liquid crystal display using this TFT substrate.

Fourth Group: Field

The present invention of a fourth group relates to a process for producing a liquid crystal display, using an amorphous silicon thin film transistor ($\alpha$-SiTFT) or a polysilicon thin film transistor (p-SiTFT). More specifically, the invention relates to a liquid crystal display enabling to reduce the contact resistance between a pixel electrode pattern and source/drain wirings, and the contact resistance between the following: wiring metals of a gate wiring leading-out section and source/drain electrode leading-out sections; and a transparent electrode. The invention also relates to a process for producing the same.

In particular, the invention of the fourth group relates to a TFT substrate (examples of which including a TFT array substrate wherein TFTs are arranged into an array form), a liquid-crystal-driving electrode substrate, and a sputtering target.

BACKGROUND ART

First Group: Background

Hitherto, liquid crystal displays have eagerly been researched and developed. In particular, after an entrance of liquid crystal displays for large-sized televisions on the stage, the researches and developments have been more actively made.

As the material of pixel electrodes of the liquid crystal displays, ITO (indium tin oxide) is generally used. This is because ITO is excellent in electroconductivity and transparency, and can easily be etched with a strong acid (aqua regia or a hydrochloric acid-based etchant).

However, ITO formed into a film on a large-sized substrate by sputtering is a crystalline film. Thus, the state of the crystal is variously changed depending on the temperature of the substrate, the state of the atmosphere gas or plasma density, or the like so that a crystalline film and an amorphous film may be present to be mixed on the same substrate. This mixture frequently causes problems that etching failures (electric conduction to an adjacent electrode, the narrowing of the pixel electrode by overetching, pixel inferiority based on etching residues, and so on) are generated.

In order to solve the problems caused when ITO is etched, for example, Patent Document 1 discloses a method of making an ITO pixel electrode film amorphous, thereby making large the etching rate of ITO/Al by action of an etching solution of an HCl—HNO$_3$—H$_2$O-based so as to overcome elution of Al at the time of the etching.

About a target of ITO, black nodules are generated on the surface of the target when a film is continuously formed over a long time, so that over discharge is caused or foreign substances are generated to cause pixel inferiority. These also become problems with frequency.

Thus, the following method has been investigated: a method of adding water or hydrogen to sputtering gas when ITO is formed into a film form so as to form a film of ITO in an amorphous state, etching this film of ITO, and then heating the film to crystallize the film. However, the addition of water or hydrogen at the time of the film-formation frequently causes a decline in the adhesiveness to the underlying substrate, or causes the surface of ITO to be reduced, thereby generating a large amount of nodules.

In order to solve these problems, instead of ITO, IZO ((registered trade name) manufactured by Idemitsu Kosan Co., Ltd.: indium zinc oxide) is used. The IZO is rich in usefulness as follows: the IZO can be made into the form of a substantially completely amorphous film. The IZO can be etched with an etchant based on an oxalic acid, which is a weak acid, and can also be etched with a mixed acid of phosphoric acid, acetic acid and nitric acid, an aqueous solution of cerium (IV) ammonium nitrate, or the like. The IZO can be etched with a weaker acid than ITO. A target made of the IZO makes the generation of nodules less when the target is sputtered, and makes it possible to restrain the generation of foreign substances. Thus, it can be mentioned that the IZO is a useful target.

As a target containing the IZO, for example, Patent Document 2, which will be listed up later, discloses a target made of a sintered body of an oxide containing a hexagonal lamellar compound represented by the general formula In$_2$O$_3$(ZnO)$_m$ wherein m=2 to 20. According to this target, a transparent electroconductive film excellent in moisture resistance (endurance) can be formed.

Furthermore, in connection with a target containing the IZO, for example, Patent Document 3, which will be listed up later, discloses a process of: painting, onto a substrate, a coating solution prepared by dissolving an indium compound and a zinc compound in the presence of an alkanolamine; firing the resultant; and then subjecting the fired product to reducing treatment, thereby producing a transparent electroconductive film. According to this transparent electroconductive film producing process, a transparent electroconductive film excellent in moisture resistance (endurance) can be obtained.

For example, Patent Document 4, which will be listed up later, discloses, as a method for etching a transparent electroconductive film containing the IZO, a method for producing a liquid crystal display, wherein a transparent electroconductive film comprising $In_2O_3$—ZnO is etched with a solution of oxalic acid in water, thereby forming a pixel electrode. According to this liquid crystal display producing process, a pixel electrode pattern can easily be formed since the oxalic acid solution is used to perform the etching. Therefore, the yield can be improved.

Second Group: Background

Liquid crystal displays have characteristics that the power consumption thereof is low and the displays can easily attain full-color display, and other characteristics. Thus, out of flat displays, the liquid crystal displays are promising; in recent years, developments for making the size of their display screens large have been actively made. In particular, about an active matrix-based liquid crystal flat display wherein α-SiTFTs (thin film transistors) or p-SiTFTs are arranged, as switching elements for respective pixels, into a matrix form, and the pixels are each driven, the contrast ratio thereof does not deteriorate even if the display is made highly definited so as to have 800×600 pixels or more. Thus, attention has been paid to the liquid crystal flat display as a flat display for high performance color display. In such an active matrix-based liquid crystal flat display, a transparent electrode such as ITO (indium tin oxide) is used as its pixel electrode, and an Al-based alloy thin film is used as its source electrode in many cases. This is because ITO has a low sheet resistance and a high permeability and Al can easily be patterned and further Al has a low resistance and a high adhesiveness.

FIG. 1 is a view illustrating a sectional view of a vicinity of an amorphous-SiTFT at a stage when the formation of a pattern of a pixel electrode is finished in the process of producing a liquid crystal flat display according to the present invention. However, any display in the prior art has the same basic structure except the material of its pixel electrode; thus, the display will be described with reference to this.

In FIG. 1, a pattern of a gate electrode 2 is formed on a light-transmissible glass substrate 1, and next plasma CVD (chemical vapor deposition) is used to form a SiN gate insulation film 3, an amorphous Si:H (i) film 4, a channel protection film 5, and an amorphous Si:H(n) film 6 continuously into desired form and patterns.

Furthermore, a metal film made mainly of Al is deposited by vacuum deposition or sputtering, and then a pattern of a source electrode 7 and a pattern 8 of a drain electrode 8 are each formed by photolithographic technique. In this way, an α-SiTFT element section is completed.

An ITO film is deposited onto this section by sputtering, and photolithographic technique is used to form a pattern of a pixel electrode 9 electrically connected to the source electrode 7. The reason why the ITO film is deposited after the Al film is deposited is that a deterioration in electrical contact property between the amorphous-Si:H 4 (and 6) and the source and drain electrodes 7 and 8 is not caused. Al is inexpensive and is low in specific resistance, and is an essential material for preventing a decline in the display performance of the liquid crystal display, the decline resulting from an increase in the resistance of the wiring of the gate electrode 2 and the wiring of the source/drain electrodes 7 and 8.

In the above-mentioned production process, when the patterns of the source electrode 7 and the drain electrode 8 made mainly of Al are formed and then the ITO pixel electrode 9 is worked into the pattern with an HCl—$HNO_3$—$H_2O$-based etching solution, a situation that the Al patterns elute out at the time of the end of the working may be frequently caused.

This results from the fact that Al also has a nature that Al is dissolved in the HCl—$HNO_3$—$H_2O$-based etching solution, which is an ITO etching solution. $HNO_3$ in the etching solution forms a thin Al oxide film on the surface of Al, and thus $HNO_3$ is added thereto in order to prevent elution of Al. However, it appears that if the time for etching the ITO film is long or defects portions, such as impurities or foreign substances incorporated during the deposition of Al, are present in the Al film, the above-mentioned Al-oxidizing effect does not act sufficiently by local cell reaction.

In order to prevent such Al elution, it is known that an ITO film is made amorphous, thereby increasing the ITO/Al etching rate to any HCl—$HNO_3$—$H_2O$-based etching solution. This matter is described in Patent Document 1, which will be listed up later. The etching rate ratio is a ratio between etching speeds.

However, even if the ITO film is made amorphous, elution of Al is not completely prevented since an HCl—$HNO_3$—$H_2O$-based etching solution is used. Thus, a highly definited liquid crystal display is not easily realized. As an invention made in light of such a problem, Patent Document 2, which will be listed up later, is known. This Patent Document 5 suggests that patterning of a transparent electrode and a pixel electrode 9, on a pattern of each of an Al gate electrode, and source/drain electrodes, is made easy by use of an oxalic acid-based etching solution, and a transparent electrode having a composition made of indium oxide-zinc oxide is used in order to provide a process for producing a highly definited liquid crystal display.

According to such a structure, it is known that contact resistance is generated between the line of the Al gate and the transparent electrode, and between the Al source/drain electrodes and the pixel electrode. In general, the Al lines are usually covered with a barrier metal such as Ti, Cr or Mo. Such a barrier metal is described in Patent Documents 6, 7, 8 and 9, which will be listed up later.

Third Group: Background

The matrix-based liquid crystal display is usually composed of a TFT array substrate, a counter substrate, and a display material, such as liquid crystal, sandwiched between the TFT array substrate and the counter substrate. In the matrix-based liquid crystal display, a voltage is applied to this display material in selected individual pixels, thereby displaying a given image.

On the TFT array substrate are formed a semiconductor thin film (hereinafter, referred to merely as a semiconductor film) and so on while on the counter substrate are formed, a counter electrode, a color filter, a black matrix, and so on. Such a liquid crystal display (hereinafter, simply referred to as a LCD), wherein the TFT array substrate and so on are used, will be called a TFT-LCD hereinafter.

In the above-mentioned TFT array substrate, for each element, a TFT composed of a gate electrode, a source electrode, a drain electrode and a semiconductor film, and at least a pixel electrode are formed into an array form on an insulating substrate made of glass or the like. Besides, an alignment film, a storage capacitor, and so on are formed if necessary. Between the pixels are disposed signal lines such as gate wirings and source wirings. The gate wirings and the source wirings, the numbers of which are each several, are disposed on the insulating substrate so as to cross at right angles. In this way, a display area is formed. Furthermore, an input terminal, a driving circuit for driving each of the TFTS, and so on are formed, correspondingly to each of the signal lines, outside this display area.

In order to produce such a liquid crystal display wherein a TFT array is used, gates and sources/drains included in TFTs and other common wirings are produced into an array form so as to form a display area. Input terminals, prewirings, driving circuits, and others are arranged in the vicinity of this display area.

For reference, in the present patent, a gate electrode and a gate wiring are together denoted as a gate, and a source electrode and a source wiring are together denoted as a source. A drain electrode may be denoted simply as a drain in some cases. A source and a drain are together denoted as a source/drain. In the patent, a first conductor is specifically the gate, source and drain, and a second conductor is the above-mentioned pixel electrode.

It is also preferred to arrange, on the insulating substrate of the TFT array substrate, an electroconductive thin film (hereinafter, referred to merely as an electroconductive film) or an insulating thin film (hereinafter, referred to merely as an insulation film), if necessary, in order to exhibit a given function. On the other hand, on the counter substrate are formed the counter electrode, the color filter and the black matrix, as described above.

After the TFT array substrate and the counter electrode are produced as described above, a given gap is made between the two substrates in order to inject a liquid crystal material therebetween. In this state, the two substrates are stuck to each other at their peripheries, and then a liquid crystal material is injected into the gap between these substrates to produce a TFT-LCD.

Known thin film techniques are used to form various semiconductor elements and others onto the TFT array substrate or the counter substrate used in the TFT-LCD. In order to produce, for example, semiconductor elements of a TFT array substrate, the following are formed on an insulating substrate, as described above: a gate, a source and a drain (these being referred to as the first conductor hereinafter), a semiconductor film, an insulation film, a pixel electrode (hereinafter, referred to as the second conductor), and so on. In general, at this time, the second conductor and the first conductor do not contact each other directly since the second conductor is formed on the insulation film formed on the first conductor. For this reason, a contact hole is made in the insulation film in order to attain electrical connection between the first and second conductors. In other words, the first and second conductors are electrically connected to each other through the contact hole.

It has been considered that the material of the first conductor, in particular, the material of the gate wiring and the source wiring therein is desirably pure Al or Al alloy from the viewpoint of its properties and the process in order to prevent delay of signal transmission as TFT-LCDs have been made large-sized and highly definited. This is because the pure Al or Al alloy has a low electric resistance.

However, it has not been considered that in the case of using, as the material of a transparent pixel electrode (second conductor), ITO (indium tin oxide), IZO ((registered trade name), Idemitsu Kosan Co., Ltd.: indium zinc oxide) or the like, it is not necessarily preferred to use, as the material of the first conductor, the pure Al or Al alloy for the following reason: if connection, which may be referred to as contact hereinafter, between the first and second conductors is attained, the contact resistance thereof becomes a very high value of $1\times E10$ to $1\times E12\Omega$ so that a favorable contact property cannot be obtained.

It has been therefore considered that it is difficult to obtain a favorable contact resistance in any TFT array substrate having a structure wherein a first conductor made of pure Al or Al alloy directly contacts a second conductor made of a transparent electroconductive film of ITO, IZO or the like through a contact hole made in an insulation film.

As the method for solving this problem, various methods have been hitherto investigated in order to obtain a favorable contact between the first and second conductors. For example, Patent Document 10, which will be listed up later, discloses a thin film transistor array substrate having a bi-layered structure composed of an Al layer comprising Al and an electroconductive metal layer which is not easily oxidized, wherein a pixel electrode is connected to a metal layer of a source electrode through a contact hole made in a passivation film. In the case that the pixel electrode is connected to the metal layer in this way, electrical contact between the source electrode and the pixel electrode becomes favorable.

Patent Document 11, which will be listed up later, discloses a process for producing an active matrix substrate, wherein a metal layer is formed into a desired thickness inside a contact hole over a drain electrode so as to reduce effectively a difference in level based on the contact hole, whereby the process for the production is made simple and a pixel electrode is not easily cut.

Patent Document 12, which will be listed up later, a thin film transistor array having a bi-layered structure drain electrode composed of a lower layer made of a metal capable of forming silicide and an upper layer made of copper, wherein a pixel electrode is connected to the upper layer of the drain electrode through a contact hole made in a protective layer. In the case that the pixel electrode is connected to the upper layer, which is made of copper, in this way, the resistance of the drain electrode is low in the thin film transistor array so that favorable electrical contact can be maintained; simultaneously, a voltage can be applied to a liquid crystal with a high efficiency.

Patent Document 13, which will be listed up later, discloses a thin film transistor having a first electrode of a bi-layered structure composed of a lower layer made of pure Al or Al alloy, and an upper layer made of pure Al or Al alloy to which at least one element selected from N, O, Si and C is added, wherein a second electrode is electrically connected to the upper layer of the first electrode.

In the source electrode or the gate electrode in the substrate in each of Patent Documents 10 to 13, which will be listed up later, a portion connected to the pixel electrode has a bi-layered structure (for example, the source electrode in Patent Document 10 has a bi-layered structure wherein Cr, Ti, Mo, Cu, Ni or the like is formed into a film on a pure Al or Al alloy.).

Fourth Group: Background

Liquid crystal displays have characteristics that the power consumption thereof is low and the displays can easily attain full-color display, and other characteristics. Thus, out of flat displays, the liquid crystal displays are promising; in recent years, liquid crystal displays of large sized screen are developed actively. In particular, about an active matrix-based liquid crystal flat display wherein α-SiTFTs or p-SiTFTs are arranged, as switching elements for respective pixels, into a matrix form, and the pixels are each driven, the contrast ratio thereof is not deteriorated even if the display is made highly definited so as to have 800×600 pixels or more. Thus, attention has been paid to the liquid crystal flat display as a flat display for high performance color display. In such an active matrix-based liquid crystal flat display, a transparent electrode such as ITO (indium tin oxide) is used as its pixel electrode, and an Al-based alloy thin film is used as its source electrode in many cases. This is because ITO has a high sheet resistance and Al can easily be patterned and further Al has a low resistance and a high adhesiveness.

FIG. 10 is a view illustrating a sectional view of a vicinity of an α-SiTFT at a stage when the formation of a pattern of a pixel electrode is finished in the process of producing a liquid crystal flat display according to the present invention. FIG. 11 is a view illustrating a sectional view of a vicinity of an α-SiTFT at a stage when the formation of a pattern of a pixel electrode is finished in the process of producing a liquid crystal flat display in the prior art.

In FIG. 11, a pattern of a gate electrode 3002 is formed on a light-transmissible glass substrate 3001, and next plasma CVD is used to form a gate insulation film 3003 made of SiN, an α-Si:H(i) film 3004, and a channel protection film 3005 made of SiN consequtively. Next, the channel protection film 3005 is made into a desired form and pattern by etching. Furthermore, an α-Si:H(n) film 3006 and a metal film made mainly of Al are deposited by CVD, vacuum deposition or sputtering, and then (a pattern of) a source electrode 3007 and (a pattern) of a drain electrode 3008 are formed by photolithographic technique, and further the α-Si:H(n) film 3006 and the α-Si:H(i) film 3004 are finished. In this way, an α-SiTFT element section is completed. If necessary, a transparent resin resist 3010 is deposited and a contact hole 3012 is made.

An ITO film is deposited onto this section by sputtering, and then photolithographic technique is used to form a pattern of a pixel electrode 3009 electrically connected to the source electrode 3007. At this time, the gate electrode 3002 is made into a laminated film of Al/Cr (or Al/Mo or Al/Ti) and the source electrode 3007 and the drain electrode 3008 are each made into a three-layer-laminated film of Cr/Al/Cr (or Mo/Al/Mo or Ti/Al/Ti). A purpose of this is to cause electrical contact property between the ITO film and the gate, source and drain electrodes 3002, 3007 and 3008 not to deteriorate. Al is inexpensive and is low in specific resistance, and is an essential material for preventing a decline in the display performance of the liquid crystal display, the decline resulting from an increase in the wiring resistances of the gate, source electrode and drain electrodes 3002, 3007 and 3008.

The reason why the ITO film is deposited after the Al film is deposited is not to deteriorate electrical contact property between α-Si:H(i) and α-Si:H(n) films 3004 and 3006 and the source and drain electrodes 3007 and 3008. This Al is inexpensive and low in specific resistance, as described above.

In the case of working, in the above-mentioned production process, the pixel electrode pattern 3009, which is made of ITO, with an HCl—HNO$_3$—H$_2$O-based etching solution after the formation of the patterns of the source electrode 3007 and the drain electrode 3008, which are made mainly of Al, an accident that the Al patterns elute out at the time of the end of the manufacturing process may be frequently caused.

This results from the fact that Al originally has a nature that Al is dissolved in the HCl—HNO$_3$—H$_2$-based etching solution, which is an etching solution for etching ITO. HNO$_3$ in the etching solution forms a thin Al oxide film on the surface of Al, and thus HNO$_3$ is added thereto in order to prevent elution of Al. However, it is considered that if the time for etching the ITO film is long or defects portions, such as impurities or foreign substances incorporated during the deposition of Al, are present in the Al film, the above-mentioned Al-oxidizing effect does not act sufficiently by local cell reaction.

In order to prevent such Al elution, it is known that an ITO film is made amorphous, thereby increasing the ITO/Al etching rate by action of any HCl—HNO$_3$—H$_2$O-based etching solution. This matter is described in Patent Document 1, which will be listed up later.

However, even if the ITO film is made amorphous, elution of Al is not completely prevented since an HCl—HNO$_3$—H$_2$O-based etching solution is used. Thus, a highly definited liquid crystal display is not easily realized.

An invention made in light of the above-mentioned problem is described in Patent Document 4, which will be listed up. This Patent Document 4 describes that patterning of a transparent electrode and a pixel electrode on patterns of an Al gate and source/drain electrodes is made easy by use of an oxalic acid-based etching solution. Furthermore, Patent Document 4 suggests that a transparent electrode having a composition composed of indium oxide-zinc oxide is used in order to provide a process for producing a highly definited liquid crystal display.

When such a structure is adopted, it is generally known that contact resistance is generated between the line of the Al gate and the transparent electrode, and between the Al source/drain electrodes and the pixel electrode. The Al lines are usually covered with a barrier metal such as Ti, Cr or Mo. Such a structure is described in Patent Documents 6, 7, 8 and 9, which will be listed up later.

In the case of using Al wirings in this way, it is unavoidable to use a barrier metal; it is therefore necessary to form the barrier metal into a film and etch the film. As a result, it is feared that the production process is made complicated.

The use of alloy wherein various metals are added to Al is reported. However, it is presumed that it is very difficult to make the above-mentioned contact resistance small. This is because an oxide film is formed on the surface of Al itself. This oxide film is an insulator, and it appears that this insulator makes the contact resistance large. Such a description is included in Patent Documents 14, 15 and 16, which will be listed up.

In order to decrease the contact resistance based on this oxide film, suggested is a method of forming a metal thin film made of In, Zn or the like on an Al thin film. According to this method, the contact resistance becomes small but it becomes necessary that this thin film is formed. Moreover, there arise a problem that the transmittance of the pixel electrode declines, and other problems. Such a description is included in Patent Document 17, which will be listed up later.

Patent Document 1: Japanese Patent Application Laid Open (JP-A) No. 63-184726
Patent Document 2: JP-A No. 6-234565
Patent Document 3: JP-A No. 6-187832
Patent Document 4: JP-A No. 11-264995
Patent Document 5: JP-A No. 11-264996
Patent Document 6: JP-A No. 10-65174
Patent Document 7: JP-A No. 11-184195
Patent Document 8: JP-A No. 11-258625
Patent Document 9: JP-A No. 11-253976
Patent Document 10: JP-A No. 4-253342
Patent Document 11: JP-A No. 4-305627
Patent Document 12: JP-A No. 8-18058
Patent Document 13: JP-A No. 11-284195
Patent Document 14: JP-A No. 7-45555
Patent Document 15: JP-A No. 7-301705
Patent Document 16: JP-A No. 1-289140
Patent Document 17: JP-A No. 2003-017706 (Japanese Patent Application No. 2001-200710)

DISCLOSURE OF THE INVENTION

Problems to be Solved by the Invention

First Group: Objects

However, in the case that ITO, which is generally used as a material of a transparent pixel electrode, contacts Al, there arises a problem that a cell reaction is easily caused. Crystalline ITO cannot be etched with any other than a strong acid such as aqua regia or hydrochloric acid. Thus, there also arises a problem that, for example, the wiring material of TFTs or the like is corroded therewith while ITO is etched. In the case of amorphous ITO, the adhesiveness thereof to an underlying substrate is frequently lowered, or the contact resistance between the ITO and the TFT wiring material may be increased. It is also feared that when ITO is etched, residues are generated so that a short circuit between the electrodes or a trouble about the driving of the liquid crystal may be generated.

Against this, IZO is suggested as an amorphous material. However, this material has a problem that an especial hexagonal lamellar compound composed of indium oxide and zinc oxide must be produced so that the production process becomes complicated and further costs increase.

In light of the above-mentioned problems, the invention of the first group has been made. An object thereof is to provide a thin film transistor substrate having a transparent electroconductive film in which residues and so on are hardly generated by etching. Another object of the invention is to provide a liquid crystal display wherein this thin film transistor substrate is used. Still another object of the invention is to provide a process for producing this thin film transistor substrate effectively.

Second Group: Objects

In light of the above-mentioned problems, the invention of the second group has been made. An object thereof is to make simple a process for producing a TFT (thin film transistor) substrate by use of a transparent electroconductive material containing a specific metal for a pixel electrode and a transparent electrode. In other words, an object of the invention is to provide a production process which does not require any step of depositing a barrier metal or the like.

Similarly, an object of the invention is to provide a sputtering target for forming a film of such a pixel electrode or transparent electrode by sputtering.

Another object of the invention is that even if an Al gate and a transparent electrode, or an Al source/drain and a pixel electrode are brought into direct contact with each other (without using any barrier metal), a transparent electroconductive material containing a specific metal is used for the pixel electrode or the transparent electrode, thereby the contact resistance therebetween is made small. Such a contact resistance having a small value is realized, whereby providing a liquid crystal display, capable of attaining half-tone display, wherein a substrate using this transparent electroconductive material for a pixel electrode is utilized. This is an object of the invention.

Third Group: Objects

As described above, according to production processes in the prior art, the contact resistance between a second conductor made of ITO, IZO or the like and a first conductor made of pure Al or Al alloy is a very high value of 1×E10 to 1×E12Ω. Thus, a favorable contact resistance cannot be obtained.

In the case of making the structure of the first conductor into a bi-layered structure composed of different materials to obtain a favorable (low) contact resistance, it is difficult to etch this first conductor at one time with a single reagent (etching solution). Thus, it is necessary to perform etching two times, using two reagents (etching solutions). Consequently, the production process is made complicated.

In light of the above-mentioned problems, the invention of the third group has been made. An object thereof is to provide a thin film transistor and a thin film transistor substrate each having a low contact resistance when a second conductor and a first conductor are electrically connected to each other. Another object of the invention is to provide a thin-film-transistor-substrate-producing process enabling to produce this thin film transistor substrate more simply at lower costs. Still another object of the invention of the third group is to provide a liquid crystal display comprising this thin film transistor substrate.

Fourth Group: Objects

As described as the background art of the fourth group, the production process is not made complicated by using a transparent electroconductive material containing a specific metal for a pixel electrode and a transparent electrode. An object of the invention of the fourth group is to realize a TFT (thin film transistor) substrate, and a simple process for producing the same. Another object of the invention of the fourth group is to provide a pixel electrode of such a TFT substrate, and a sputtering target useful for forming this pixel electrode.

An object of the invention of the fourth group is to provide a liquid crystal display making it possible that: half-tone display is attained; and even if a gate comprising Al and a transparent electrode, or a source/drain (comprising Al) and a pixel electrode are brought into direct contact with each other, the contact resistance therebetween is made small.

Means for Solving the Problems

First Group: Means

The above-mentioned objects of the invention are attained by using, as a transparent pixel electrode, a transparent electroconductive film which is made mainly of indium oxide, and further comprises one or two or more oxides selected from tungsten oxide, molybdenum oxide, nickel oxide and niobium oxide. This transparent electroconductive film is patterned with an acidic etching solution, so as to be made into the shape of a transparent pixel electrode. Specifically, in the invention, the following means are adopted.

(1) First, the invention is a thin film transistor substrate comprising a transparent substrate, a source electrode formed over the transparent substrate, a drain electrode formed over the transparent substrate, and a transparent pixel electrode formed over the transparent substrate, wherein the transparent pixel electrode is a transparent electroconductive film which is made mainly of indium oxide, and further comprises one or two or more oxides selected from tungsten oxide, molybdenum oxide, nickel oxide and niobium oxide, and the transparent pixel electrode is electrically connected to the source electrode or the drain electrode.

In the present patent, the wording "is made mainly of indium oxide" means that indium oxide is contained as a main component, and generally means the case where indium oxide is contained at an atomic composition ratio of 50% or more. When the transparent pixel electrode is formed into a film, a target is used which is made mainly of indium oxide and further comprises one or two or more oxides selected from tungsten oxide, molybdenum oxide, nickel oxide and niobium oxide, whereby nodules are hardly generated in this target.

In the case that tungsten oxide, molybdenum oxide, nickel oxide or niobium oxide is incorporated into a transparent electroconductive film, the amorphous transparent electroconductive film formed into an amorphous film can be etched with an etchant containing oxalic acid. The substrate temperature for the film formation is preferably from room temperature to 200° C., more preferably from 80 to 180° C. The reason why the substrate temperature at the time of the film formation is set into the above-mentioned range is as follows: in order to control the substrate temperature into room temperature or lower, cooling is necessary to prevent the energy loss energy; on the other hand, if the substrate temperature is higher than 200° C., the transparent electroconductive film may not be able to be etched with the etchant containing oxalic acid by the crystallization of this film, or the like. Water or hydrogen may be added to the atmosphere gas when the film is formed. This makes it possible to etch the formed transparent electroconductive film more easily with the etchant containing oxalic acid so as to decrease residues further.

The addition of the metal oxide makes it possible to crystallize the transparent electroconductive film on the substrate easily by heating the temperature of the substrate to a temperature higher than 200° C. after the etching of the formed transparent electroconductive film. The temperature for the crystallization is preferably 220° C., more preferably 230° C. or more.

By the crystallization of the transparent electroconductive film, cell reaction is restrained even if the transparent electroconductive film contacts an electrolyte in the state that the film is electrically connected to Al. Consequently, etching failures, such as breaking of Al lines, are hardly generated.

The specific resistance of the thus formed transparent electroconductive film is reduced to a value similar to that of ITO. Moreover, this transparent electroconductive film is excellent in transparency.

The film thickness of the transparent electroconductive film is preferably from 20 to 500 nm, more preferably from 30 to 300 nm, even more preferably from 30 to 200 nm. If the film thickness of the transparent electroconductive film is less than 20 nm, the surface resistance of the transparent electroconductive film may rise. On the other hand, if the film thickness of the transparent electroconductive film is more than 500 nm, the transmittance may be lowered or a problem about the working precision may be caused.

About the composition of the transparent electroconductive film, the composition ratio (hereinafter, referred to as the atomic ratio in some cases) of In, which is the atomic ratio of In, is preferably as follows: the value of [In]/[all the metals] is from 0.85 to 0.99. If the composition ratio of In is less than 0.85, the resistance value of the transparent electroconductive film may be increased or the transparent electroconductive film may not be crystallized even if the substrate on which this film is formed is heated to 200° C. or higher. If the composition ratio of In is more than 0.99, the transparent electroconductive film is crystallized at the time of the formation of this film so that the film cannot be etched with the etchant containing oxalic acid or a large amount of residues may be generated. The [In] represents the number of the indium atoms per unit volume in the transparent electroconductive film, and the [all the metals] represents the number of all the metal atoms per unit volume in the transparent electroconductive film.

It is also preferred to incorporate Sn or Zn as a third atom into the transparent electroconductive film.

The atomic indium in indium oxide is a first atom, and the atomic tungsten, niobium, nickel and/or molybdenum in the oxide (s) selected from tungsten oxide, molybdenum oxide, nickel oxide and niobium oxide is a second atom or second atoms.

In the case of incorporating Sn, the composition ratio of Sn, which is the atomic ratio of Sn, is preferably as follows: [Sn]/[all the metals]<0.2. The ratio is more preferably as follows: [Sn]/[all the metals]<0.1. If the value of [Sn]/[all the metals] in the transparent electroconductive film is 0.2 or more, residues may be generated when the transparent electroconductive film is etched. The [Sn] represents the number of tin atoms per unit volume in the transparent electroconductive film.

In the case of incorporating Zn, the composition ratio of Zn, which is the atomic ratio of Zn, is preferably as follows: [Zn]/[all the metals]<0.1. The ratio is more preferably as follows: [Zn]/[all the metals]<0.05. The [Zn] represents the number of zinc atoms per unit volume in the transparent electroconductive film.

(2) The invention is also a thin film transistor liquid crystal display comprising a thin film transistor substrate comprising a transparent substrate, a source electrode formed over the transparent substrate, a drain electrode formed over the transparent substrate, and a transparent pixel electrode formed over the transparent substrate, a color filter substrate wherein a colored pattern in plural colors is formed, and a liquid crystal layer sandwiched between the thin film transistor substrate and the color filter substrate, wherein the transparent pixel electrode is a transparent electroconductive film which is made mainly of indium oxide, and further comprises one or two or more oxides selected from tungsten oxide, molybdenum oxide, nickel oxide and niobium oxide, and the transparent pixel electrode is electrically connected to the source electrode or the drain electrode.

In this thin film transistor substrate, etching failures such as Al line breaking are hardly generated in the production process thereof. Accordingly, if such a thin film transistor substrate is used, a thin film transistor liquid crystal display having small defects can be produced.

(3) The invention is a process for producing the thin film transistor substrate according to the item (1), which further comprises the step of depositing the transparent electroconductive film over the transparent substrate, and the step of using an acidic etchant to etch the deposited transparent electroconductive film, thereby forming the transparent pixel electrode.

The acidic etchant is preferably a weak acid. Even when the transparent electroconductive film is etched with the etchant of a weak acid, residues based on the etching are hardly generated.

About the etchant containing oxalic acid, the concentration of oxalic acid is preferably from 1 to 10% by weight, more preferably from 1 to 5% by weight. If the concentration of oxalic acid is less than 1% by weight, the etching rate of the transparent electroconductive film may become small. If the concentration is more than 10% by weight, a crystal of oxalic acid may precipitate in the aqueous solution of the etchant containing oxalic acid.

(4) The invention is also the thin film transistor substrate producing process according to the item 3, wherein the acidic etchant comprises any one or any two or more of oxalic acid, a mixed acid comprising phosphoric acid, acetic acid and nitric acid, or cerium (IV) ammonium nitrate.

Second Group: Means

The following will describe means of the second group of the invention.

A. Sputtering Target (5) In order to solve the above-mentioned problems, the invention is a sputtering target which is made mainly of indium oxide, and comprises one or two or more metal (s) selected from the first metal group M1 consisted of W, Mo, Nb, Ni, Pt and Pd, or an oxide or oxides of the metal (s), and an oxide or oxides of one or two or more metal(s) selected from the second metal group M2 consisted of lanthanoid-based metals.

As described above, the invention is characterized in that an oxide or oxides of one or two or more metal (s) selected from the second metal group M2 consisted of lanthanoid-based metals, and one or two or more metal(s) selected from the first metal group M1 consisted of W, Mo, Nb, Ni, Pt and Pd, or an oxide or oxides of the metal(s) are simultaneously added.

When the sputtering target of the invention is used to form a transparent electroconductive film by sputtering, the contact resistance between the transparent electroconductive film and other Al members can be kept into a small value on the basis of the above-mentioned structure.

Specifically, in the case of using the sputtering target of the invention to form a transparent electrode or pixel electrode by sputtering, values of contact resistances generated:

between the Al gate line and the transparent electrode;
between the Al source/drain electrodes and the pixel electrode; and
between the Al source/drain wirings and the transparent electrode can be made smaller than values of contact resistances generated therebetween in the prior art.

In the present patent, the wording "A is made mainly of X", wherein A represents a member and X represents a component, means that X is a main component in the raw material of A, and generally means that X is a component having a composition ratio of 50% or more.

(6) In order to solve the above-mentioned problems, the invention is the sputtering target according to claim 1, wherein the value of [M1]/([M1]+[In]), which is the composition of one or two or more metal(s) selected from the first metal group M1 consisted of W, Mo, Nb, Ni, Pt and Pd, or the metal oxide(s) to indium oxide, is from 0.005 to 0.2, and the value of [M2]/([M2]+[In]), which is the composition of the oxide(s) of one or two or more metal(s) selected from the second metal group M2 of lanthanoid-based metals to indium oxide, is from 0.005 to 0.2, wherein the [M1] represents the number of the atoms of one or two or more metal (s) selected from the first metal group, the [M2] represents the number of the atoms of one or two or more metal (s) selected from the second metal group, and the [In] represents the number of the atoms of metallic indium.

Composition of the Lanthanoid-Based Metal Oxide(s)

As described above, in the invention, the composition of the lanthanoid-based metal oxide(s) relative to indium oxide is as follows:

$$[M2]/([M2]+[In])=0.005-0.2 \qquad \text{Expression (1)}$$

This value is preferably from 0.01 to 0.15, more preferably from 0.01 to 0.1.

In the present patent, the group of lanthanoid-based metals is called a second metal group, and the metals are together referred to as "M2". This M2 is also used as a symbol representing lanthanoid-based metals.

In the patent, symbol [ ] is used to represent the number of the atoms of the element per unit weight/volume. For example, [cerium] or [Ce] represents the number of the atoms of cerium. [indium] or [In] represents the number of the atoms of indium.

The descriptive manner of [M2], wherein M2, which is a collective term of the above-mentioned metals, is inserted into [ ], is also used. [M2] represents the number of the atoms of a metal selected appropriately from the second metal group.

If the value of this expression is less than 0.005, the effect of the addition thereof is not easily produced. When such a sputtering target is used to produce a transparent electrode or pixel electrode, a large contact resistance may be generated between Al and the transparent electrode or between Al and the pixel electrode.

On the other hand, if the value of the expression is more than 0.2 and such a sputtering target is used to produce a transparent electrode or pixel electrode, the specific resistance of the transparent electrode or pixel electrode itself may become a large value. If the expression is more than 0.2 in same manner, the transparent electrode or pixel electrode itself may not be etched with ease. As a result, it may become difficult to produce a substrate for a liquid crystal display.

Composition of Metallic W, Mo, Nb, Ni, Pt and/or Pd, or the Metal Oxide(s) Thereof In the invention, the composition (ratio) of metallic W, Mo, Nb, Ni, Pt and/or Pd, or the metal oxide(s) thereof relative to indium oxide is as follows:

$$[M1]/([M1]+[In])=0.005-0.2 \qquad \text{Expression (2)}$$

The value of this expression is preferably from 0.01 to 0.15, more preferably from 0.01 to 0.1. W, Mo, Nb, Ni, Pt and/or Pd may be added in a metal state or in a metal oxide state.

In the same manner as the second metal group M2, the metal group of W, Mo, Nb, Ni, Pt and Pd is called a first metal group M1. In the same manner as the above-mentioned [M2], [M1] represents the number of the atoms (per unit volume/per unit weight) of one or two or more metal(s) selected from the first metal group.

If the value of the expression 2 is less than 0.005, the effect of the addition thereof is not produced with ease. In other words, a large contact resistance may be generated between Al and the transparent electrode or between Al and the pixel electrode. On the other hand, if the value of the expression 2 is more than 0.2, the specific resistance of the transparent electrode or pixel electrode may become large and further the transparent electrode or pixel electrode may not be etched with ease.

(7) The invention is also the sputtering target according to the item (5) or (6), wherein the oxide(s) of the metal(s) selected from the second metal group M2 of lanthanoid-based metals is/are an oxide or oxides of one or more metals selected from La, Ce, Ho, and Er.

In the case of adding, in particular, a metal oxide or metal oxides of Ce, Ho and Er out of oxides of lanthanoid-based metals as described above, the above-mentioned effects and advantages become more remarkable. Out of these metals, two kinds may be selected or metal oxides of all three kinds may be added since the number of the selected metal(s) is one or more.

(8) The invention is also a sputtering target which is made of indium oxide, and comprises: one or two or more metal (s) selected from the first metal group M1 consisted of W, Mo, Nb, Ni, Pt and Pd, or an oxide or oxides of the metal(s); an oxide or oxides of one or two or more metal(s) selected from the second metal group M2 consisted of lanthanoid-based metals; and an oxide or oxides of one or two or more metal (s) selected from the third metal group M3 consisted of Zn, Sn, Zr, Ga and Ge.

As described above, in the invention, a structure is adopted wherein the following are simultaneously added: an oxide or oxides of one or two or more metal (s) selected from the second metal group M2 consisted of lanthanoid-based metals; and one or two or more metal (s) selected from the first metal group M1 consisted of W, Mo, Nb, Ni, Pt and Pd, or an oxide or oxides of the metal(s).

In the prior art, large contact resistances are generated between the Al gate line and the transparent electrode, between Al source/drain electrodes and the pixel electrode, and between the Al source/drain wirings and the transparent electrode.

On the other hand, according to the invention, the large contact resistances generated in the prior art can be made small by the above-mentioned structure. In other words, the contact resistances can be made small to such an extent that the resistances can be practically ignored.

Further addition of the oxide (s) of the metal (s) selected from the third metal group M3 consisted of Zn, Sn, Zr, Ga and Ge makes it possible to improve the resistance value of the sputtering target itself and restrain nodules from being generated. The wording "to improve the resistance" herein means that the value of the resistance is made small. Additionally, profitable effects as described in the following are produced onto the transparent electroconductive film formed by sputtering using this sputtering target.

An improvement in the specific resistance of the formed transparent electroconductive film can be attained.

An improvement in the etching characteristic of the formed transparent electroconductive film can be attained.

An improvement in the transparency of the formed transparent electroconductive film can be attained.

The wording "an improvement in the specific resistance" herein means a decrease in the value of the specific resistance. The wording "an improvement in the etching characteristic" herein means that the film is more easily dissolved in an etchant used in etching. The wording "an improvement in the transparency" herein means the degree of clearness is improved, resulting in a matter that the value of the light-transmittance approaches to 100%.

(9) The invention is also the sputtering target according to the item (4), wherein the value of [M1]/([M1]+[In]), which is the composition of one or two or more metal (s) selected from the first metal group M1 consisted of W, Mo, Nb, Ni, Pt and Pd, or the metal oxide(s) to indium oxide, is from 0.005 to 0.2, the value of [M2]/([M2]+[In]), which is the composition of the oxide (s) of one or two or more metal (s) selected from the second metal group M2 consisted of lanthanoid-based metals to indium oxide, is from 0.005 to 2, and the value of [M3]/([M3]+[In]), which is the composition of the oxide(s) of the metal(s) selected from the third metal group M3 consisted of Zn, Sn, Zr, Ga and Ge to indium oxide, is from 0.005 to 2, wherein the [M1] represents the number of the atoms of one or two or more metal(s) selected from the first metal group, the [M2] represents the number of the atoms of one or two or more metal (s) selected from the second metal group, the [M3] represents the number of the atoms of the metal(s) selected from the third metal group, and the [In] represents the number of the atoms of metallic indium.

Lanthanoid-Based Metal Oxide(s)

As described above, in the invention, the composition of the lanthanoid-based metal oxide(s) relative to indium oxide is as follows: the value of [In]/([In]+[M2])=0.005-0.2. The [M2] is described as [lanthanoid-based metal (s)] in some cases. Both of them represent the number of the atoms of the lanthanoid-based metal oxide(s).

The range "0.005-0.2" of the value of the ratio between the atom numbers described in the invention is preferably from 0.01 to 0.15, more preferably from 0.01 to 0.1.

If the value of the expression, which represents the composition of the lanthanoid-based metal oxide(s) relative to indium oxide, is less than 0.005, the effect of the addition thereof may not be produced. In other words, a non-negligible contact resistance may be generated between Al and the transparent electrode or pixel electrode.

On the other hand, if the above-mentioned value is more than 0.2, the specific resistance of the transparent electrode or pixel electrode may become large, or in the production process the transparent electrode or pixel electrode may not be etched with ease.

Metallic W, Mo, Nb, Ni, Pt and/or Pd, or the Metal Oxide(s) Thereof

In the invention, the composition of metallic W, Mo, Nb, Ni, Pt and/or Pd, or the metal oxide (s) thereof relative to indium oxide is as follows: [In]/([In]+[M1])=0.005-0.2. The value of this expression is preferably from 0.01 to 0.15, more preferably from 0.01 to 0.1. The [M1] represents the number of one or two or more metal (s) selected from the first metal group, W, Mo, Nb, Ni, Pt and Pd.

W, Mo, Nb, Ni, Pt and/or Pd in the first metal group M1 may be added in a metal state or in a metal oxide state.

If the value of the expression is less than 0.005, the effect of the addition of W, Mo, Nb, Ni, Pt and/or Pd may not be produced. Specifically, about the transparent electrode or pixel electrode produced by sputtering using the sputtering target of the invention, a non-negligible contact resistance may be generated between Al and the transparent electrode or between Al and the pixel electrode.

On the other hand, if the above-mentioned value is more than 0.2, the specific resistance of the transparent electrode or pixel electrode may become large. Furthermore, in the production process, the transparent electrode or pixel electrode may not be etched with ease.

Zn, Sn, Zr, Ga and/or Ge Oxide(s)

As described above, in the invention, the composition of one or more metal oxides selected from Zn, Sn, Zr, Ga and Ge in the third metal group M3 relative to indium oxide is as follows: [M3]/([M3]+[In])=0.005-0.2, wherein the [M3] represents the number per unit volume or unit mass of the metal(s) selected from the third metal group. This expression represents the atomic composition ratio of the metal (s) in the third metal group to indium. The value of this expression is also substantially a composition ratio of the oxide (s) of the metal(s) in the third metal group M3.

If the value of this expression is less than 0.005, the effect of the addition thereof is not easily produced. Specifically, about the transparent electrode or pixel electrode produced by sputtering using the sputtering target of the invention, anonnegligible contact resistance between Al and the transparent electrode or between Al and the pixel electrode may be generated.

On the other hand, if the above-mentioned value is more than 0.2, the specific resistance of the transparent electrode or pixel electrode may become large, or in the production process the transparent electrode or the like may not be etched with ease.

(10) The invention is also the sputtering target according to the item (8) or (9) wherein the oxide(s) of one or two or more metal(s) selected from the second metal group M2 consisted of lanthanoid-based metals is/are an oxide or oxides of one or more metals of La, Ce, Ho and Er.

Of the lanthanoid-based metal oxides, an oxide of Ce, Ho or Er is particularly preferred. In the invention, therefore, the oxide(s) of Ce, He and/or Er is/are adopted.

(11) The invention is also a transparent electroconductive film, which is made mainly of indium oxide, and comprises: one or two or more metal(s) selected from the first metal group M1 consisted of W, Mo, Nb, Ni, Pt and Pd, or an oxide or oxides of the metal(s), and an oxide or oxides of one or two or more metal (s) selected from the second metal group M2 consisted of lanthanoid-based metals.

As described above, in the invention, the following two or more materials are added to indium oxide.

One or more metal oxides selected from lanthanoid-based metal oxides

One or more metals selected from W, Mo, Nb, Ni, Pt and Pd, or an oxide or oxides of the metal(s)

In the invention, these are simultaneously added to a transparent electroconductive film. Accordingly, in the case of using the transparent electroconductive film of the invention to make a transparent electrode or pixel electrode, contact resistances generated:

between the Al gate line and the transparent electrode;

between the Al source/drain electrodes and the pixel electrode, between the Al source/drain wirings and the transparent electrode, and between others can be reduced to a substantially negligible value.

On the other hand, in the case of using a conventional transparent electroconductive film to make a transparent electrode or pixel electrode, contact resistances having a non-negligible value are generated between the Al gate line and the transparent electrode, between the Al source/drain electrodes and the pixel electrode, and between the Al source/drain wirings and the transparent electrode.

(12) The invention is also the transparent electroconductive film according to the item (11), wherein the value of [M1]/([M1]+[In]), which is the composition of one or two or more metal(s) selected from the first metal group M1 consisted of W, Mo, Nb, Ni, Pt and Pd, or the oxide (s) of the metal (s) to indium oxide, is from 0.005 to 0.2, and the value of [M2] ([M2]+[In]), which is the composition of the oxide (s) of one or two or more metal (s) selected from the second metal group M2 of lanthanoid-based metals to indium oxide, is from 0.005 to 0.2, wherein the [M1] represents the number of the atoms of one or two or more metal (s) selected from the first metal group, the [M2] represents the number of the atoms of one or two or more metal (s) selected from the second metal group, and the [In] represents the number of the atoms of indium.

Lanthanoid-Based Metal Oxide(s)

As described above, in the invention, the composition of the lanthanoid-based metal oxide (s) relative to indium oxide is set as follows: [M2]/([M2]+[In])=0.005-0.2. The [M2] represents the number of the atoms of one or two or more metal(s) in the second metal group M2 consisted of lanthanoid-based metals. This number is the number per unit mass or unit volume. The [In] represents the number per unit volume or unit mass of the indium atoms. Accordingly, this expression is the composition ratio of the metal(s) in the second metal group M2 to indium on the basis of the numbers of the atoms thereof. This composition ratio is also the composition ratio of the oxide (s) of the metal (s) in the second metal group M2 to indium oxide.

This value is preferably from 0.01 to 0.15, more preferably from 0.01 to 0.1.

If the value of the above-mentioned expression, which represents the composition of the lanthanoid-based metal oxide(s) to indium oxide, is less than 0.005, the effect of the addition thereof may not produced. In other words, about the transparent electrode or pixel electrode wherein this transparent electroconductive film is used, a non-negligible contact resistance may be generated between Al of other wirings and this transparent electrode or pixel electrode.

On the other hand, if the above-mentioned value is more than 0.2, the specific resistance of the transparent electrode or pixel electrode comprising the transparent electroconductive film of the invention may become large, or in the production process the transparent electrode or pixel electrode may not be etched with ease.

As described above, in the invention, the composition of the lanthanoid-based metal oxide(s) relative to indium oxide is as follows: [M2]/([M2]+[In])=0.005-0.2. This composition ratio is preferably from 0.01 to 0.15, more preferably from 0.01 to 0.1.

Metallic W, Mo, Nb, Ni, Pt and/or Pd, or the Metal Oxide(s) Thereof

In the invention, the composition of the metal(s) in the first metal group consisted of W, Mo, Nb, Ni, Pt and Pd, or the metal oxide(s) thereof relative to indium oxide is as follows: [In]/([In]+[M1])=0.005-0.2. The value of this expression is more preferably from 0.01 to 0.15, even more preferably from 0.01 to 0.1. W, Mo, Nb, Ni, Pt and/or Pd may be added in a metal state or in a metal oxide state.

M1 is a generic term of the first metal group consisted of W, Mo, Nb, Ni, Pt and Pd, and the [M1] represents the number per unit mass or unit volume one or two or more metal(s) in the first metal group. The [In] represents the number of the atoms of indium per unit mass or unit volume, as described above.

If the value of the above-mentioned expression is less than 0.005, the effect of the addition of W, Mo, Nb, Ni, Pt and/or Pd may not be produced. Specifically, about the transparent electrode or pixel electrode wherein the transparent electroconductive film of the invention is used, a non-negligible contact resistance may be generated between Al and the transparent electrode or between Al and the pixel electrode.

On the other hand, if the value of the expression is more than 0.2, the specific resistance of the transparent electrode or pixel electrode comprising the transparent electroconductive film of the invention may become large. Furthermore, in the production process, this transparent electrode or pixel electrode may not be etched with ease.

(13) The invention is also the transparent electroconductive film according to the item (11) or (12) wherein the oxide (s) of the metal(s) selected from the second metal group M2 consisted of lanthanoid-based metals is/are an oxide or oxides of one or more metals of La, Ce, Ho and Er.

To adopt an oxide or oxides of Ce, Ho and/or Er out of the lanthanoid-based metal oxides in this way is preferable.

(14) The invention is also a transparent electroconductive film which is made mainly of indium oxide, and comprises: one or two or more metal(s) selected from the first metal group M1 consisted of W, Mo, Nb, Ni, Pt and Pd, or an oxide or oxides of the metal(s), an oxide or oxides of one or two or more metal (s) selected from the second metal group M2 consisted of lanthanoid-based metals, and an oxide or oxides of one or two or more metal(s) selected from the third metal group M3 consisted of Zn, Sn, Zr, Ga and Ge.

As described above, in the invention, adopted is a structure wherein an oxide or oxides of one or two or more metal(s) selected from the lanthanoid-based metal group (second metal group) consisted of lanthanoid-based metals, and one or two or more metal(s) selected from the first metal group M1 consisted of W, Mo, Nb, Ni, Pt and Pd, or an oxide or oxides of the metal (s) are simultaneously added.

In the case of using a conventional transparent electroconductive film as a transparent electrode or pixel electrode, large contact resistances are generated:

between the Al gate line and the transparent electrode;

between the Al source/drain electrodes and the pixel electrode;

between the Al source/drain wirings and the transparent electrode; and between others.

On the other hand, in the case of using the transparent electroconductive film of the invention to make a transparent electrode or pixel electrode, the large values of the contact resistances generated in the prior art can be made small. In other words, the contact resistances can be made small into a non-negligible extent.

Furthermore, when an oxide or oxides of one or two or more metals selected from Zn, Sn, Zr, Ga and Ge (the third metal group M3) are added thereto, useful effects as described below can be produced.

An improvement in the specific resistance of the formed transparent electroconductive film can be attained.

An improvement in the etching characteristic of the formed transparent electroconductive film can be attained.

An improvement in the transparency of the formed transparent electroconductive film can be attained.

The wording "an improvement in the specific resistance" herein means a decrease in the value of the specific resistance. The wording "an improvement in the etching characteristic" herein means that the film is more easily dissolved in an etchant used in etching. The wording "an improvement in the transparency" herein means that the value of the light transmittance approaches to 100%.

(15) The invention is also the transparent electroconductive film according to the item 14 wherein the value of [M1])/([M1]+[In]), which is the composition of one or two or more metal(s) selected from the first metal group M1 consisted of W, Mo, Nb, Ni, Pt and Pd, or the metal oxide(s) to indium oxide, is from 0.005 to 0.2, the value of [M2]/([M2]+[In]), which is the composition of the oxide(s) of one or two or more metal(s) selected from the second metal group M2 consisted of lanthanoid-based metals to indium oxide, is from 0.005 to 0.2, and the value of [M3]/([M3]+[In]), which is the composition of the oxide(s) of the metal(s) selected from the third metal group M3 consisted of Zn, Sn, Zr, Ga and Ge to indium oxide, is from 0.005 to 0.2, wherein the [M1] represents the number of the atoms of one or two or more metal (s) selected from the first metal group, the [M2] represents the number of the atoms of one or two or more metal (s) selected from the second metal group, the [M3] represents the number of the atoms of the metal(s) selected from the third metal group, and the [In] represents the number of the indium atoms.

Lanthanoid-Based Metal Oxide(s)

As described above, in the invention, the composition of the oxide(s) of the lanthanoid-based metal group (second metal group) relative to indium oxide is set as follows: [M2]/([In]+[M2])=0.005-0.2. M2 is a generic term of the second metal group consisted of lanthanoid-based metals, and the [M2] represents the number of the atoms of one or two or more metal(s) selected from the second metal group. This [M2] is the number per unit mass or unit weight. As described above, the [In] represents the number per unit mass or unit weight of the indium atoms. Accordingly, the above-mentioned expression represents the ratio of the atom number of the metal (s) contained in the second metal group to that of indium. The value of this expression is simultaneously the composition ratio of the oxide (s) of the metal (s) contained in the second metal group to indium oxide.

This value is preferably from 0.01 to 0.15, more preferably from 0.01 to 0.1.

If the value of the expression, which represents the composition of the lanthanoid-based metal oxide(s) relative to indium oxide, is less than 0.005, the effect of the addition thereof may not be produced. In other words, a non-negligible contact resistance may be generated between Al and the transparent electrode or pixel electrode comprising the transparent electroconductive film of the invention.

On the other hand, if the above-mentioned value is more than 0.2, the specific resistance of the transparent electrode or pixel electrode comprising the transparent electroconductive film of the invention may become large. Furthermore, in the production process, this transparent electrode or pixel electrode may not be etched with ease.

Metallic W, Mo, Nb, Ni, Pt and/or Pd, or the Metal Oxide(s) Thereof

In the invention, the composition of the metal(s) in the first metal group M1 consisted of W, Mo, Nb, Ni, Pt and Pd, or the metal oxide (s) thereof relative to indium oxide is as follows: [M1]/([In]+[M1])=0.005-0.2. As described above, the [M1] represents the number of the atoms of one or two or more metal (s) in the first metal group. This number is the number per unit mass or unit volume.

The value of this expression is more preferably from 0.01 to 0.15, even more preferably from 0.01 to 0.1. W, Mo, Nb, Ni, Pt and/or Pd may be added in a metal state or in a metal oxide state.

If the value of the expression is less than 0.005, the effect of the addition of W, Mo, Nb, Ni, Pt and/or Pd may not be produced. Specifically, about the transparent electrode or pixel electrode comprising the transparent electroconductive film of the invention, a non-negligible contact resistance may be generated between Al and the transparent electrode or between Al and the pixel electrode.

On the other hand, if the value of the expression is more than 0.2, the specific resistance of the transparent electrode or pixel electrode comprising the transparent electroconductive film of the invention may become large. Furthermore, in the production process, this transparent electrode or pixel electrode may not be etched with ease.

Zn, Sn, Zr, Ga and/or Ge Oxide(s)

As described above, in the invention, the composition of one or more metal oxides selected from the third metal group M3 consisted of Zn, Sn, Zr, Ga and Ge relative to indium oxide is as follows: [M3]/([M3]+[In])=0.005-0.2, wherein the [M3] represents the number of the atoms of the metal(s) selected from the third metal group. Thus, this expression represents the composition ratio (the atom number) of the metal (s) in the third metal group M3 to indium. This value simultaneously represents the composition ratio of the oxide (s) of the metal (s) selected in the third metal group to indium oxide.

If the value (composition ratio) of this expression is less than 0.005, the effect of the addition thereof is not easily produced. Specifically, about the transparent electrode or pixel electrode comprising the transparent electroconductive film of the invention, a non-negligible contact resistance may be generated between Al and the transparent electrode or between Al and the pixel electrode.

On the other hand, if the above-mentioned value is more than 0.2, the specific resistance of the transparent electrode or pixel electrode wherein the transparent electroconductive film of the invention is used may become large, or in the production process the transparent electrode or pixel electrode may not be etched with ease.

(16) The invention is also the sputtering target according to the item (14) or (15) wherein the oxide(s) of one or more metal(s) selected from the second metal group M2 consisted of lanthanoid-based metals is/are an oxide or oxides of one or more metals of La, Ce, Ho and Er.

To adopt an oxide or oxides of Ce, Ho and/or Er out of the lanthanoid-based metal oxides in this way is preferable.

(17) The invention is also a transparent electroconductive glass substrate, comprising: a glass substrate; a transparent electroconductive film which is formed over the glass substrate, is made mainly of indium oxide, and comprises one or two or more metal (s) selected from the first metal group M1 consisted of W, Mo, Nb, Ni, Pt and Pd, or an oxide or oxides of the metal(s), and an oxide or oxides of one or two or more metal(s) selected from the second metal group M2 consisted of lanthanoid-based metals; and a metal thin film which is formed over the glass substrate and is made mainly of Al or Ag.

As described above, in the invention, adopted is a structure wherein an oxide or oxides of one or two or more metal(s) selected from the second metal group M2 consisted of lanthanoid-based metals, and one or two or more metal (s) selected from the first metal group M1 consisted of W, Mo, Nb, Ni, Pt and Pd, or an oxide or oxides of the metal (s) are simultaneously added (called a simultaneously-added structure).

The transparent electroconductive glass of the invention can be used as a substrate having a transparent electrode or pixel electrode by using a transparent electroconductive film as the transparent electrode or pixel electrode. When Al is adopted, the metal thin film of the invention can constitute an Al gate line or Al source/drain electrodes. Accordingly, the transparent electroconductive glass substrate of the invention can be used as a substrate with wirings.

In such a case, a conventional transparent electroconductive glass causes large contact resistances:

between the Al gate line and the transparent electrode;

between the Al source/drain electrodes and the pixel electrode;

between the Al source/drain wirings and the transparent electrode; and between others. On the other hand, the transparent electroconductive glass of the invention does not cause any large contact resistance.

In the case of using Ag for the metal thin film, a Ag gate line, and Ag source/drain electrodes can be made. In this case also, the same effects and advantageous as in the case of Al are produced.

As described above, according to the invention, large contact resistance values generated in the prior art can be made small by the above-mentioned structure (the simultaneously-added structure). In other words, the contact resistances can be made small to a practically negligible extent.

Furthermore, a transparent electroconductive glass having a lower resistance can be obtained by adopting a structure wherein Al or Ag is laminated thereto. Such a transparent electroconductive glass is also called a laminated transparent electroconductive glass.

Use of Al or Ag

In this item (17) and the item (20) which will be described later, Al or an Al alloy is preferably used for a gate line, source/drain electrodes or wirings. In this case, they are called an Al gate line and Al source/drain electrodes. An alloy made mainly of Al is frequently used. Al or the Al alloy used for these is made mainly of Al, and may contain a heavy metal in groups from IIIa to VIIIa in the periodic table, or a lanthanoid-based metal. It is desired to contain, for example, Nd, Ni, Co or Zr. The content thereof, which depends on the performance of a desired Al gate line or Al source/drain electrodes, is preferably from about 0.1 to 5% by weight, more preferably from about 0.5 to 2.0% by weight.

If the content is less than 0.1% by weight, the effect of the addition may not be produced. If the content is 0.1% by weight, projections such as hillocks may be generated on the Al thin film.

On the other hand, if the content is more than 0.5% by weight, the resistance of Al itself (the Al alloy itself) may become large.

In the invention, Ag or an Ag alloy also is preferably used for its gate line, source/drain electrodes or wiring. A reflecting electrode, on which light is reflected, may be formed therein; for this reflecting electrode also, Ag or an Ag alloy is preferably used in some cases.

In the case of using Ag, they are called an Ag gate line, Ag source/drain electrodes, and the like. Ag or the Ag alloy used for these is made mainly of Ag, and may contain a heavy metal in groups from IIIa to VIIIa in the periodic table, or a lanthanoid-based metal. It is desired to contain, for example, Nd, Ni, Co or Zr. The content thereof, which depends on the performance of a desired Al gate line, Al source/drain electrodes, wirings or reflecting electrode, is preferably from about 0.1 to 5% by weight, more preferably from about 0.5 to 2.0% by weight.

If the content is less than 0.1% by weight, the effect of the addition may not be produced. If the content is 0.1% by weight, projections such as hillocks may be generated on the Ag thin film or the adhesiveness of the Ag thin film may fall.

On the other hand, if the content is more than 0.5% by weight, the resistance of Ag itself (the Ag alloy itself) may become large.

(18) The invention is also the transparent electroconductive glass substrate according to the item 17, wherein the value of [M1] ([M1]+[In]), which is the composition of one or two or more metal (s) selected from the first metal group M1 consisted of W, Mo, Nb, Ni, Pt and Pd, or the metal oxide(s) to indium oxide, is from 0.005 to 0.2, and the value of [M2]/([M2]+[In]), which is the composition of the oxide (s) of one or two or more metal (s) selected from the second metal group M2 of lanthanoid-based metals to indium oxide, is from 0.005 to 0.2, wherein the [M1] represents the number of the atoms of one or two or more metal (s) selected from the first metal group, and the [M2] represents the number of the atoms of one or two or more metal(s) selected from the second metal group.

Lanthanoid-Based Metal Oxide(s)

As described above, in the invention, the composition of the lanthanoid-based metal oxide(s) relative to indium oxide is as follows:

$$\text{In}/(\text{In}+\text{lanthanoid-based metal(s)})=0.005\text{-}0.2$$

This value is preferably from 0.01 to 0.15, more preferably from 0.01 to 0.1.

If the value of the expression, which represents the composition of the lanthanoid-based metal oxide(s) relative to indium oxide, is less than 0.005, the effect of the addition thereof may not be produced. In other words, a non-negligible contact resistance may be generated between the metal thin film made mainly of Al or Ag and the transparent electroconductive film (constituting, for example, the transparent electrode or pixel electrode).

On the other hand, if the above-mentioned value is more than 0.2, the specific resistance of the transparent electroconductive film of the invention (constituting, for example, the transparent electrode or pixel electrode) may become large. Furthermore, in the production process, this transparent electroconductive film may not be etched with ease.

Metallic W, Mo, Nb, Ni, Pt and/or Pd, or the Metal Oxide(s) Thereof

In the invention, adopted is a structure wherein the composition of metallic W, Mo, Nb, Ni, Pt and/or Pd, or the metal oxide(s) thereof relative to indium oxide is as follows: In/(In+(W, Mo, Nb, Ni, Pt and/or Pd))=0.005-0.2. The value of this expression is more preferably from 0.01 to 0.15, even more preferably from 0.01 to 0.1. W, Mo, Nb, Ni, Pt and/or Pd may be added in a metal state or in a metal oxide state.

If the value of the expression is less than 0.005, the effect of the addition of W, Mo, Nb, Ni, Pt and/or Pd may not be produced. Specifically, a non-negligible contact resistance may be generated between the transparent electroconductive film of the invention (constituting, for example, the transparent electrode or pixel electrode) and the metal thin film made mainly of Al or Ag.

On the other hand, if the value of the expression is more than 0.2, the specific resistance of the transparent electroconductive film of the invention (for example, the transparent electrode or pixel electrode) may become large. Furthermore, in the production process, this transparent electroconductive film may not be etched with ease.

Lamination

When the transparent electroconductive film having a composition as described above and the metal thin film are laminated on each other in this way, a lower-resistance transparent electroconductive glass can be provided.

(19) The invention is also the transparent electroconductive glass substrate according to the item (17) or (18), wherein the oxide (s) of one or more metal(s) selected from the second metal group M2 consisted of lanthanoid-based metals is/are an oxide or oxides of one or more metals of La, Ce, Ho and Er.

It is more effective to use, in particular, an oxide or oxides comprising one or more metal(s) of Ce, Ho and Er in this way out of the lanthanoid-based metal oxides. The oxide(s) can be preferably used.

(20) The invention is also a transparent electroconductive glass substrate, comprising: a glass substrate; a transparent electroconductive film which is formed over the glass substrate, is made mainly of indium oxide, and comprises one or two or more metal (s) selected from the first metal group M1 consisted of W, Mo, Nb, Ni, Pt and Pd, or an oxide or oxides of the metal (s), an oxide or oxides of one or two or more metal(s) selected from the second metal group M2 consisted of lanthanoid-based metals, and an oxide or oxides of one or two or more metal(s) selected from the third metal group M3 consisted of Zn, Sn, Zr, Ga and Ge; and a metal thin film which is formed over the glass substrate and is made mainly of Al or Ag.

As described above, in the invention, adopted is a structure wherein an oxide or oxides of one or two or more metal(s) selected from the second metal group M2 consisted of lanthanoid-based metals, and one or two or more metal (s) selected from the first metal group M1 consisted of W, Mo, Nb, Ni, Pt and Pd, or an oxide or oxides of the metal (s) are simultaneously added (called a simultaneously-added structure).

The transparent electroconductive glass of the invention can be used as a substrate having a transparent electrode or pixel electrode by using a transparent electroconductive film as the transparent electrode or pixel electrode. When Al is adopted, the metal thin film of the invention can constitute an Al gate line or Al source/drain electrodes. Accordingly, the transparent electroconductive glass substrate of the invention can be used as a substrate with wirings.

In such a case, a conventional transparent electroconductive glass causes large contact resistances:
between the Al gate line and the transparent electrode,
between the Al source/drain electrodes and the pixel electrode,
between the Al source/drain wirings and the transparent electrode, and between others. On the other hand, the transparent electroconductive glass of the invention does not cause any large contact resistance.

In the case of using Ag for the metal thin film, a Ag gate line, and Ag source/drain electrodes can be made. In this case also, the same effects and advantageous as in the case of Al are produced.

As described above, according to the invention, large contact resistance values generated in the prior art can be made small by the above-mentioned structure (the simultaneously-added structure). In other words, the contact resistances can be made small to a practically negligible extent.

Furthermore, when an oxide or oxides of one or more metals selected from Zn, Sn, Zr, Ga and Ge are added, useful effects described below are produced on the transparent electroconductive film on the transparent electroconductive glass.

An improvement in the specific resistance of the formed transparent electroconductive film can be attained.

An improvement in the etching characteristic of the formed transparent electroconductive film can be attained.

An improvement in the transparency of the formed transparent electroconductive film can be attained.

The wording "an improvement in the specific resistance" herein means a decrease in the value of the specific resistance. The wording "an improvement in the etching characteristic" herein means that the film is more easily dissolved in an etchant used in etching. The wording "an improvement in the transparency" herein means that the value of the light transmittance is improved. The adoption of the structure wherein Al or Ag is laminated makes it possible to give a transparent electroconductive glass having a lower resistance.

Such a transparent electroconductive glass may be called a laminated transparent electroconductive glass.

In the item (20) also, Al or an Al alloy is preferably used for a gate line, source/drain electrodes or wirings, as described in the item (17). The content thereof is the same as in the item (13).

(21) The invention is also the transparent electroconductive glass substrate according to the item 20, wherein the value of [M1]/([M1]+[In]), which is the composition of one or two or more metal (s) selected from the first metal group M1 consisted of W, Mo, Nb, Ni, Pt and Pd, or the metal oxide(s) to indium oxide, is from 0.005 to 0.2, the value of [M2] ([M2]+[In]), which is the composition of the oxide(s) of one or two or more metal(s) selected from the second metal group M2 consisted of lanthanoid-based metals to indium oxide, is from 0.005 to 0.2, and the value of [M3]/([M3]+[In]), which is the composition of the oxide(s) of the metal(s) selected from the third metal group M3 consisted of Zn, Sn, Zr, Ga and Ge to indium oxide, is from 0.005 to 0.2, wherein the [M1] represents the number of the atoms of one or two or more metal(s) selected from the first metal group, the [M2] represents the number of the atoms of one or two or more metal (s) selected from the second metal group, the [M3] represents the number of the atoms of the metal (s) selected from the third metal group, and the [In] represents the number of the indium atoms.

Lanthanoid-Based Metal Oxide(s)

As described above, in the invention, the composition of the lanthanoid-based metal oxide(s) relative to indium oxide is as follows:

$$In/(In+lanthanoid\text{-}based\ metal(s))=0.005\text{-}0.2$$

This value is preferably from 0.01 to 0.15, more preferably from 0.01 to 0.1.

If the value of the expression, which represents the composition of the lanthanoid-based metal oxide(s) relative to indium oxide, is less than 0.005, the effect of the addition thereof may not be produced. In other words, a non-negligible contact resistance may be generated between the metal thin film made mainly of Al or Ag and the transparent electroconductive film (constituting, for example, the transparent electrode or pixel electrode).

On the other hand, if the above-mentioned value is more than 0.2, the specific resistance of the transparent electroconductive film of the invention (constituting, for example, the transparent electrode or pixel electrode) may become large. In the production process, this transparent electroconductive film may not be etched with ease.

Metallic W, Mo, Nb, Ni, Pt and/or Pd, or the Metal Oxide(s) Thereof

In the invention, adopted is a structure wherein the composition of metallic W, Mo, Nb, Ni, Pt and/or Pd, or the metal oxide (s) thereof relative to indium oxide is as follows: In/(In+(W, Mo, Nb, Ni, Pt and/or Pd))=0.005-0.2. The value of this expression is more preferably from 0.01 to 0.15, even more preferably from 0.01 to 0.1. W, Mo, Nb, Ni, Pt and/or Pd may be added in a metal state or in a metal oxide state.

If the value of the expression is less than 0.005, the effect of the addition of W, Mo, Nb, Ni, Pt and/or Pd may not be produced. Specifically, a non-negligible contact resistance may be generated between the transparent electroconductive film of the invention (constituting, for example, the transparent electrode or pixel electrode) and the metal thin film made mainly of Al or Ag.

On the other hand, if the value of the expression is more than 0.2, the specific resistance of the transparent electroconductive film of the invention (for example, the transparent electrode or pixel electrode) may become large. Furthermore, in the production process, this transparent electroconductive film may not be etched with ease.

Zn, Sn, Zr, Ga and/or Ge Oxide(s)

As described above, in the invention, the composition of an oxide or oxides of one or more metals selected from Zn, Sn, Zr, Ga and Ge to indium oxide is as follows: In/(In+(Zn, Sn, Zr, Ga and/or Ge))=0.005-0.2.

If the value of this expression is less than 0.005, the effect of the addition thereof is not easily produced. Specifically, a non-negligible contact resistance may be generated between the transparent electroconductive film of the invention (constituting, for example, the transparent electrode or pixel electrode) and the metal thin film made mainly of Al or Ag.

On the other hand, if the value of the expression is more than 0.2, the specific resistance of the transparent electroconductive film of the invention (or the transparent electrode or pixel electrode wherein the transparent electroconductive film is used) may become large. Furthermore, if the value of the expression is more than 0.2, in the case of intending to etch the transparent electroconductive film to form the transparent electrode or pixel electrode in the production process, this transparent electroconductive film may not be etched with ease.

Lamination

When the transparent electroconductive film having a composition as described above and the metal thin film are laminated on each other in this way, a lower-resistance transparent electroconductive glass can be provided.

(22) The invention is also the transparent electroconductive glass substrate according to the item (20) or (21), wherein the oxide(s) of one or more metal(s) selected from the second metal group M2 consisted of lanthanoid-based metals is/are an oxide or oxides of one or more metals of La, Ce, Ho and Er.

It is more effective to use, in particular, an oxide or oxides comprising one or more metals of Ce, Ho and Er in this way out of the lanthanoid-based metal oxides. The oxide (s) can be preferably used.

Specific Manner of the Lamination

As described in the items (5) to (22), a structure wherein a metal oxide electroconductive film and a metal thin film are laminated on each other may be adopted in the invention. The following will describe this case.

The manner of laminating this metal oxide transparent electroconductive film and the metal thin film, which is made mainly of Al or Ag, on each other is classified into various forms.

a. Metal oxide/metal thin film made mainly of Al or Ag/metal oxide b. Metal oxide/metal thin film made mainly of Al or Ag/metal oxide/metal thin film made mainly of Al or Ag/metal oxide The laminate a has three layers, and the laminate b has five layers. Of course, it is preferred to adopt a seven-layered structure or the like.

In this case, the film thickness of the metal thin film made mainly of Al or Ag is from 1 to 20 nm. The film thickness is preferably from 5 to 15 nm, more preferably from 5 to 10 nm. If the film thickness is 1 nm or less, the laminated metal film does not become a "thin film" but may become a sea-island structure. Thus, the advantageous effects of the invention may not be obtained. On the other hand, if the film thickness of the metal thin film is 20 nm or more, the light transmittance of the laminated metal thin film may be lowered. As a result, an effect may be actually produced on the "transparency" of the transparent electroconductive film formed to be overlapped thereon.

In the invention, the transparent electroconductive film made of a metal oxide and the metal thin film made mainly of Al or Ag are frequently laminated on each other; the meaning of the wording "being laminated" includes a case where (not the whole of the transparent electroconductive film, which is made of the metal oxide, but) a part of the transparent electroconductive film contacts the metal thin film. Examples of the electrode structure in this case include a case where the transparent electroconductive film contacts a part of the metal thin film having a width of, e.g., 20 μm and covers the whole of the metal thin film. In other words, the two overlap with each other as viewed in a plan view thereof, but only parts thereof contact each other as viewed in a sectional view thereof.

In such a case, the thickness of the metal thin film is from 20 to 500 nm, more preferably from 30 to 300 nm, even more preferably from 50 to 200 nm. If the film thickness is 20 nm or less, the effect of decreasing the resistance may be small. On the other hand, if the film thickness is 500 nm or more, a level difference in the thin film is large so that the contact thereof with the transparent electroconductive film may become poor.

The width of the metal thin film can be appropriately selected, and is, for example, from 1 to 100 μm. This value is preferably from 5 to 50 μm, more preferably from 10 to 30 μm.

If the width of the metal thin film is 1 μm or less, the resistance-decreasing effect may be too small. On the other hand, if the width of the metal thin film is 100 μm or more, the light transmittance (numerical aperture) may decline. However, the width is not limited to this range in the case of using the lamination of the metal thin film and the transparent electroconductive film as a reflecting electrode.

Third Group: Means

A. Invention of a Process for Producing a Thin Film Transistor Substrate

(23) Thus, in order to solve the above-mentioned problems, the invention is a process for producing a thin film transistor substrate, comprising: a first conductor forming step of using an Al alloy comprising one or more metals selected from a metal group M1 consisted of W, Mo, La, Nb, Fe, Pd, Pt, Ce, Ho and Er to form, over a transparent insulating substrate, a first conductor which is any conductor contained in a conductor group E1 consisted of a gate, a source and a drain; an insulation film forming step of forming an insulation film to cover the formed first conductor and the transparent insulating substrate; a contact hole making step of making a contact hole in the formed insulation film; and an electrically connecting step which is a step of forming a second conductor comprising a transparent film electrode onto the insulation film, and which is a step of connecting the second conductor and the first conductor electrically to each other through the contact hole.

In the present patent, a gate electrode and a gate wiring are together called a gate, and a source electrode and a source wiring are together called a source. A drain electrode may be called merely a drain. A source and a drain are together denoted as a source/drain. A first conductor is specifically the gate, source and drain, and a second conductor is the pixel electrode.

Since the first conductor has a mono-layered structure, the conductor can be etched with one etching solution at a time.

The first conductor is a layer which is made mainly of Al and further comprises one or more metals selected from the metal group M1 consisted of W, Mo, La, Nb, Fe, Pd, Pt, Ce, Ho and Er. Therefore, the first conductor is low in contact resistance with the second conductor.

Furthermore, in order to restrain the generation of hillocks or improve the corrosion resistance of the first conductor, it is also preferred to add, to the first conductor, Cu, Si, a rare earth element or the like as a third metal besides Al and the one or two or more metal (s) selected from the metal group M1. In order to make use of a low electric resistance of Al at this time, it is preferred that the addition amount of the third metal is controlled to such an extent that the specific resistance of the first conductor does not exceed 10 $\mu\Omega$cm. Herein, the first metal is Al and the second metal is one or more metal(s) selected from the metal group M1. Cu, Si, the rare earth element or the like, which is added as described above, is called the third metal since the added element is a third component for these metals.

In the case of incorporating one or more metals selected from the metal group M1 consisted of W, Mo, La, Nb, Fe, Pd, Pt, Ce, Ho and Er into the first conductor, effects of restraining the generation of hillocks and improving the corrosion resistance can be obtained in the same manner as in the case of incorporating the third metal. For this reason, the generation of hillocks and corrosion can be restrained even in the case of not incorporating the third metal.

The second conductor is connected to the first conductor through the contact hole made in the insulation film. Accordingly, the pixel electrode neither contacts wirings of the gate nor the source directly, so that inconveniences such as a short circuit are not easily caused.

The first conductor is formed into a film by sputtering using an Al alloy target containing one or more metals selected from the metal group M1 consisted of W, Mo, La, Nb, Fe, Pd, Pt, Ce, Ho and Er. This Al alloy target is produced by a vacuum melting process, a spray forming process or the like. An Al alloy thin film formed by use of this Al alloy target is patterned by etching with a mixed acid of phosphoric acid, acetic acid and nitric acid, thereby forming the first conductor.

B. Invention of a Thin Film Transistor

(24) The invention is also a thin film transistor, comprising a transparent insulating substrate, and a first conductor which is formed over the transparent insulating substrate and is any conductor contained in a conductor group E1 consisted of a gate, a source and a drain, wherein the first conductor comprises an Al layer made of an Al alloy comprising one or more metals selected from a metal group M1 consisted of W, Mo, La, Nb, Fe, Pd, Pt, Ce, Ho and Er to form, and is connected to a second conductor made of a transparent film electrode through a contact hole made in the insulation film over the first conductor.

The first conductor is made of a layer comprising not only pure Al or an Al alloy but also one or more metals selected from the metal group M1 consisted of W, Mo, La, Nb, Fe, Pd, Pt, Ce, Ho and Er, thereby having a low contact resistance with the second conductor.

About the first conductor, it is also preferred to add thereto Cu, Si, a rare earth element or the like besides Al and the one or two or more metal(s) selected from the metal group M1 in order to restrain the generation of hillocks or improve the corrosion resistance. At this time, it is preferred to control the addition amount of the third metal into such an extent that the specific resistance of the first conductor is not more than 10 $\mu\Omega$cm in order not to make the specific resistance of Al too high. Herein, the first metal is Al, and the second metal is the one or two or more metal (s) selected from the metal group M1.

The first conductor is formed into a film by sputtering using an Al alloy target containing one or more metals selected from the metal group M1 consisted of W, Mo, La, Nb, Fe, Pd, Pt, Ce, Ho and Er. This Al alloy target is produced by a vacuum melting process, a spray forming process or the like. An Al alloy thin film formed by use of this Al alloy target is patterned by etching with a mixed acid of phosphoric acid, acetic acid and nitric acid, thereby forming the first conductor.

(25) The invention is also the thin film transistor according to the item (24), wherein the first conductor comprises the Al layer comprising 0.5 to 5% by weight of the one or two or more metal(s) selected from the metal group M1.

In the Al layer of the first conductor, the content of the one or two or more metal (s) selected from the metal group M1 is from 0.5 to 5% by weight, preferably from 1 to 3% by weight. If the content is less than 0.5% by weight, it may be difficult to restrain the contact resistance between the first and second conductors. On the other hand, if the content is more than 5% by weight, the specific resistance of the whole of the first conductor may become high.

C. Invention of a Thin Film Transistor Substrate

(26) The invention is also a thin film transistor substrate, comprising: a transparent insulating substrate; an insulation film which is formed over the transparent insulating substrate, comprises a first conductor which is any conductor contained in a conductor group E1 consisted of a gate, a source and a drain, and is further formed to cover at least the transparent insulating substrate; and a second conductor formed over the insulation film, wherein the first conductor comprises an Al layer made of an Al alloy comprising one or more metals selected from a metal group M1 consisted of W, Mo, La, Nb, Fe, Pd, Pt, Ce, Ho and Er, the insulation film has a given contact hole which penetrates through this film in the direction of the first conductor and second conductor, the second conductor is made of a transparent film electrode, and the second conductor is electrically connected to the Al layer of the first conductor through the contact hole.

The first conductor can be etched with a single etching solution at a time since the conductor is made of a single layer. Therefore, the thin film transistor substrate of the invention can be more easily produced.

The second conductor is connected to the first conductor through the contact hole made in the insulation film; therefore, the pixel electrode neither contacts wirings of the gate nor the source directly, so that inconveniences such as a short circuit are not easily caused.

(27) The invention is also the thin film transistor substrate according to the item (26), wherein the transparent film electrode comprises any one of indium oxide, tin oxide, indium tin oxide, and indium zinc oxide, and zinc oxide.

In the case that the second conductor comprises any one of indium oxide, tin oxide, indium tin oxide, and indium zinc oxide, and zinc oxide, the contact resistance thereof with the first conductor is lowered.

(28) The invention is also the thin film transistor substrate according to the item (26) or (27), wherein the first conductor comprises the Al layer comprising 0.5 to 5% by weight of the one or two or more metal(s) selected from the metal group M1.

In the Al layer of the first conductor, the content of the one or two or more metal (s) selected from the metal group M1 is from 0.5 to 5% by weight, preferably from 1 to 3% by weight. If the content is less than 0.5% by weight, it may be difficult to restrain the contact resistance between the first and second conductors. On the other hand, if the content is more than 5% by weight, the specific resistance of the whole of the first conductor may become high.

D. Invention of a Liquid Crystal Display (2) The invention is also a liquid crystal display, comprising the thin film transistor substrate according to any one of the items (26) to (28), and a liquid crystal layer which is driven by the thin film transistor substrate.

The second conductor is connected directly to the first conductor through the contact hole made in the insulation film without interposing any layer having a low light transmittance. Thus, the liquid crystal display has a high numerical aperture.

The liquid crystal display of the invention produces the same effects and advantages as in the items (26) to (28) since the liquid crystal display has the thin film transistor substrate described in the items (26) to (28).

Fourth Group: Means

The above-mentioned objects of the invention of the fourth group are attained by using, as a transparent electrode, a transparent electroconductive film made of an amorphous electroconductive oxide comprising indium oxide and zinc oxide as components and further patterning the transparent electroconductive film with an etching solution such as a solution of oxalic acid in water. Specifically, means as described below are adopted in the invention.

A. Invention of a TFT Substrate

(30) First, the invention is a TFT substrate for a liquid crystal display, comprising: a transparent substrate; a gate electrode which is formed over the transparent substrate, and is made mainly of Al; a source electrode formed over the transparent substrate; a drain electrode formed over the transparent substrate; a silicon layer formed over the transparent substrate; and a pixel electrode formed over the transparent substrate, wherein the pixel electrode is an electroconductive oxide containing indium oxide, and an oxide or oxides of one or two or more metal (s) selected from the first group M1 consisted of W, Mo, Ni, Nb, Fe, Pt, Pd, and lanthanoids, and this pixel electrode is jointed directly to at least one electrode selected from the group consisted of the gate electrode made mainly of Al, the source electrode and the drain electrode.

Hitherto, a contact resistance has been generated between the gate line containing Al and the transparent electrode or between the source/drain electrodes containing Al and the pixel electrode. However, the addition of W, Mo, Ni, Nb, Fe, Pt, Pd, and/or lanthanoids makes it possible to reduce the contact resistance. Al or the Al alloy used in the gate line containing Al or the source/drain electrodes containing Al may contain a heavy metal in groups from IIIa to VIIIa in the periodic table or a lanthanoid-based metal if the Al or Al alloy is made mainly of Al. Nd, Ni, Co, Zr or the like is preferably used as the element contained in the Al. The content thereof, which depends on a desired performance of the Al gate line or the Al source/drain electrodes, is preferably from 0.1 to 0.5% by weight. The content is more preferably from 0.5 to 2.0% by weight.

If the content is less than 0.1% by weight, no effect of addition is observed, and projections such as a hillock may be generated on the Al thin film. If the content is more than 5% by weight, the resistance of Al itself may become large.

It is sufficient that at least the gate comprises Al. Of course, it is preferred that the source/drain comprises Al. The same effects and advantages as in the case of the gate are obtained, as described above.

In the present patent, the wording "is made mainly of Al" means that Al is contained as a main component, and generally means the case that Al is contained at an atomic composition ratio of 50% or more.

(31) The invention is also the TFT substrate according to the item (30), wherein [M1]/([In]+[M1]), which is the atomic composition ratio of the oxide(s) of one or two or more metal(s) selected from the first group M1 to indium in the electroconductive oxide, is from 0.005 to 0.2 wherein the [M1] represents the number (per unit weight or unit volume) of the atoms of one or two or more metal (s) selected from the first group M1 and the [In] represents the number (per unit weight or unit volume) of the atoms of indium.

If the addition amount is less than 0.005, the effect of the addition is small so that the gate electrode made mainly of Al and the transparent electrode may become large. In the case that the source/drain contains Al, the contact resistance between the Al source/drain electrodes and the pixel electrode may become large. On the other hand, if the addition amount is more than 0.2, the resistance of the electrodes themselves may become large or defectives may be generated when the electrodes are etched and worked.

(32) The invention is also the TFT substrate according to the item (30) or (31), wherein the electroconductive oxide comprises an oxide or oxides of one or two or more metal (s) selected from the second group M2 consisted of tin, zinc, germanium, and gallium beside indium oxide.

When tin oxide, zinc oxide, germanium oxide, and/or gallium oxide is/are added, the electroconductivity of the electroconductive oxide may be able to be improved in accordance with a purpose. Moreover, the addition may make it possible to improve the etching workability and the transmittance.

(33) The invention is also the TFT substrate according to the item (32), wherein [M2] ([In]+[M2]), which is the atomic composition ratio of the oxide(s) of one or two or more metal(s) selected from the second group M2 to indium in the electroconductive oxide, is from 0.01 to 0.3 wherein the [M2] represents the number (per unit volume or unit weight) of the atoms of one or two or more metal(s) selected from the second group M2, that is, the number (per unit volume or unit weight) of the atoms of any one or any two or more of tin, zinc, germanium, and gallium, and the [In] represents the number of the atoms of indium.

If the addition amount is less than 0.01, the effect of the addition thereof is small. Thus, the resistance may conversely become large. On the other hand, if the addition amount is more than 0.3, the resistance may become large or the aimed improvement (of making the contact resistance with the Al electrodes small) may not be easily attained. When the average diameter of crystal particles in the sputtering target is set to less than 10 µm, the sputtering target can be rendered a sputtering target wherein nodules are less generated. Preferably, when the diameter is set to 5 µm or less, a sputtering target wherein nodules are hardly generated and over discharge is not easily generated can be obtained.

As described above, the TFT substrate of the invention is useful for constructing a liquid crystal display capable of making the contact resistance between its electrodes containing Al and its pixel electrode small and attaining half-tone display satisfactorily. A TFT array substrate in an embodiment, which will be described later, is a preferred example of the TFT substrate. A product wherein TFTs (thin film transistors) are arranged into an array form on a substrate is a TFT array substrate.

B. Invention of a Sputtering Target

(34) The invention is a sputtering target used at the time of producing a pixel electrode which is used in a TFT substrate for a liquid crystal display and which is for driving the liquid crystal by sputtering, the pixel electrode being capable of being jointed electrically to an electrode or wiring made mainly of Al, and the sputtering target being made of an electroconductive oxide comprising: indium oxide; and an oxide or oxides of one or two or more metal(s) selected from the first group M1 consisted of W, Mo, Ni, Nb, Fe, Pt, Pd, and lanthanoids.

The use of such a sputtering target makes it possible to produce a TFT substrate having the above-mentioned structure effectively. When the average diameter of crystal particles in the sputtering target is set to less than 10 µm, it can be realized that the sputtering target is rendered a sputtering target wherein nodules are hardly generated. A pixel electrode wherein the etching property is improved and the transmittance is improved can be produced. Preferably, when the average diameter of the crystal particles is set to 5 µm or less, a sputtering target wherein nodules are hardly generated and over discharge is not easily generated can be obtained.

(35) The invention is also the sputtering target according to the item (34), wherein [M1]/([In]+[M1]), which is the atomic composition ratio of the oxide(s) of one or two or more metal(s) selected from the first group M1 to indium in the electroconductive oxide, is from 0.005 to 0.2 wherein the [M1] represents the number (per unit weight or unit volume) of the atoms of one or two or more metal(s) selected from the first group M1 and the [In] represents the number (per unit weight or unit volume) of the atoms of indium.

If the addition amount is less than 0.005, the effect of the addition is small. The contact resistance between the gate electrode made mainly of Al and the transparent electrode or between the Al source/drain electrodes and the pixel electrode may become large. If the addition amount is more than 0.2, over discharge may be caused at the time of sputtering or the resistance of the electrodes themselves may become large. This is because that defectives may also be generated when the electrodes are etched and worked.

(36) The invention is also the sputtering target according to the item (34) or (35), wherein the electroconductive oxide comprises an oxide or oxides of one or two or more metal (s) selected from the second group M2 consisted of tin, zinc, germanium, and gallium beside indium oxide.

When tin oxide, zinc oxide, germanium oxide, and/or gallium oxide is/are added, the electroconductivity of the electroconductive oxide may be able to be improved in accordance with a purpose. Moreover, the addition may make it possible to improve the etching workability and the transmittance in some cases.

When the average diameter of crystal particles in the sputtering target is set to less than 10 µm, it can be realized that the sputtering target is rendered a sputtering target wherein nodules are hardly generated. Preferably, when the average diameter of the crystal particles is set to 5 µm or less, a sputtering target wherein nodules are hardly generated and overdischarge is not easily generated can be obtained.

(37) The invention is also the sputtering target according to the item (36), wherein [M2]/([In]+[M2]), which is the atomic composition ratio of the oxide(s) of one or two or more metal(s) selected from the second group M2 to indium in the electroconductive oxide, is from 0.01 to 0.3 wherein the [M2] represents the number (per unit weight or unit volume) of the atoms of one or two or more metal(s) selected from the second group M2, that is, the number (per unit weight or unit volume) of the atoms of any one or any two or more of tin, zinc, germanium, and gallium, and the [In] represents the number of the atoms of indium.

If the addition amount is less than 0.01, the effect of the addition thereof is small. Thus, the resistance may conversely become large. On the other hand, if the addition amount is more than 0.3, the resistance may become large or the aimed improvement (of making the contact resistance with the Al electrodes small) may not be easily attained.

C. Invention of a Liquid Crystal Display

(38) The invention is a liquid crystal display provided with a TFT substrate and a liquid crystal, wherein the TFT substrate comprises: a transparent substrate; a gate electrode which is formed over the transparent substrate, and is made mainly of Al; a source electrode formed over the transparent substrate; a drain electrode formed over the transparent substrate; a silicon layer formed over the transparent substrate; a pixel electrode, for driving the liquid crystal, which is formed over the transparent substrate; and a transparent electrode for protecting the gate electrode and the source/drain electrodes, wherein the pixel electrode or transparent electrode is an electroconductive oxide containing: indium oxide, and an oxide or oxides of one or two or more metal (s) selected from the first group M1 consisted of W, Mo, Ni, Nb, Fe, Pt, Pd, and lanthanoids, and this pixel electrode or transparent electrode is jointed directly to at least one electrode selected from the group consisted of the gate electrode made mainly of Al, the source electrode and the drain electrode.

Hitherto, a relatively large contact resistance has been generated between the gate line containing Al and the transparent electrode or the Al source/drain electrodes. However, the addition of W, Mo, Ni, Nb, Fe, Pt, Pd, and/or lanthanoids makes it possible to reduce the value of the contact resistance. In the case where the source/drain contains Al, the addition of W, Mo, Ni, Nb, Fe, Pt, Pd, and/or lanthanoids makes it possible to make small the value of the contact resistance with the source/drain electrodes containing Al. In this way, in a liquid crystal display using this TFT substrate, the contact resistance between the gate line containing Al and the transparent electrode or between the source/drain electrodes containing Al and the pixel electrode is reduced and the quality of half-tone display is improved.

(39) the invention is also the liquid crystal display of the item (38), wherein [M1]/([In]+[M1]), which is the atomic composition ratio of the oxide(s) of the metal (s) selected from the first group M1 to indium in the electroconductive oxide, is from 0.005 to 0.2 wherein the [M1] represents the number (per unit weight or unit volume) of the atoms of one or two or more metal (s) selected from the first group M1 and the [In] represents the number (per unit weight or unit volume) of the atoms of indium.

If the addition amount is less than 0.005, the effect of the addition is small so that the contact resistance between the gate electrode made mainly of Al and the transparent electrode or between the Al source/drain electrodes and the pixel electrode may become large. On the other hand, if the addition amount is more than 0.2, overdischarge may be caused at the time of sputtering or the resistance of the electrodes themselves may become large. Defectives may also be generated when the electrodes are etched and worked. If the addition amount is more than 0.2, the quality of half-tone display may deteriorate when the liquid crystal display is driven.

(40) The invention is also the liquid crystal display according to the item (38) or (39), wherein the electroconductive oxide comprises an oxide or oxides of one or two or more metal (s) selected from the second group M2 consisted of tin, zinc, germanium, and gallium beside indium oxide.

When tin oxide, zinc oxide, germanium oxide, and/or gallium oxide are added, the electroconductivity of the electroconductive oxide may be able to be improved in accordance with a purpose. Moreover, the addition may make it possible to improve the etching workability and the transmittance in some cases.

When the average diameter of crystal particles in the sputtering target is set to less than 10 μm, it can be realized that the sputtering target is rendered a sputtering target wherein nodules are hardly generated. When it is used to produce a liquid crystal display, the obtained liquid crystal display is a liquid crystal display wherein display defects are less generated. Preferably, when the average diameter of the crystal particles is set to 5 μm or less, a sputtering target wherein nodules are hardly generated and overdischarge is not easily generated can be obtained. When this sputtering target is used, a liquid crystal display wherein display defects are even less generated can be produced.

(41) The invention is also the liquid crystal display according to the item (40), wherein [M2]/([In]+[M2]), which is the atomic composition ratio of the oxide (s) of the metal (s) selected from the second group M2 to indium in the electroconductive oxide, is from 0.01 to 0.3 wherein the [M2] represents the number (per unit weight or unit volume) of the atoms of one or two or more metal (s) selected from the second group M2, that is, the atoms of any one or any two or more of tin, zinc, germanium, and gallium, and the [In] represents the number (per unit weight or unit volume) of the atoms of indium.

If the addition amount is less than 0.01, the effect of the addition thereof is small. Thus, the resistance may conversely become large. On the other hand, if the addition amount is more than 0.3, the resistance may become large or the aimed improvement (of making the contact resistance with the Al electrodes small) may not be easily attained.

D-1. Invention of a Pixel Electrode

The following will describe the structure of an invention of a pixel electrode. The invention which will be described below is a pixel electrode used in the above-mentioned TFT substrate and so on, and effects and advantages thereof are equivalent to those of the above-mentioned TFT substrate and so on.

(42) The invention is a pixel electrode for driving a liquid crystal, which is used in a TFT substrate, for a liquid crystal display, comprising: a transparent substrate; a gate electrode which is formed over the transparent substrate, and is made mainly of Al; a source electrode formed over the transparent substrate; a drain electrode formed over the transparent substrate; a silicon layer formed over the transparent substrate; the pixel electrode formed over the transparent substrate; and a transparent electrode for protecting the gate electrode, the source electrode and the drain electrode; the pixel electrode being an electroconductive oxide containing indium oxide, and an oxide or oxides of one or two or more metal (s) selected from the first group M1 consisted of W, Mo, Ni, Nb, Fe, Pt, Pd, and lanthanoids; and the pixel electrode being jointed directly to the gate electrode made mainly of Al, the source electrode or the drain electrode.

(43) The invention is also the pixel electrode according to the item (42), wherein [M1]/([In]+[M1]), which is the atomic composition ratio of the oxide(s) of one or two or more metal(s) selected from the first group M1 to indium in the electroconductive oxide, is from 0.005 to 0.2 wherein the [M1] and the [In] are as described above.

(44) The invention is also the pixel electrode according to the item (42) or (43), wherein the electroconductive oxide comprises an oxide or oxides of one or two or more metal (s) selected from the second group M2 consisted of tin, zinc, germanium, and gallium beside indium oxide.

(45) The invention is also the pixel electrode according to the item (44), wherein [M2]/([In]+[M2]), which is the atomic composition ratio of the oxide(s) of one or two or more metal(s) selected from the second group M2 to indium in the electroconductive oxide, is from 0.01 to 0.3 wherein the [M2] and the [In] are as described above.

D-2. Invention of a Transparent Electrode

The following will describe the structure of an invention of a transparent electrode.

(46) The invention is a transparent electrode, which is used in a TFT substrate, for a liquid crystal display, comprising: a transparent substrate; a gate electrode which is formed over the transparent substrate, and is made mainly of Al; a source electrode formed over the transparent substrate; a drain electrode formed over the transparent substrate; a silicon layer formed over the transparent substrate; a pixel electrode formed over the transparent substrate; and the transparent electrode for protecting the gate electrode, the source electrode and the drain electrode; the transparent electrode being an electroconductive oxide containing indium oxide, and an oxide or oxides of one or two or more metal (s) selected from the first group M1 consisted of W, Mo, Ni, Nb, Fe, Pt, Pd, and lanthanoids; and the transparent electrode being jointed directly to the gate electrode made mainly of Al, the source electrode or the drain electrode.

(47) The invention is also the transparent electrode according to the item (46), wherein [M1]/([In]+[M1]), which is the atomic composition ratio of the oxide (s) of the metal (s) selected from the first group M1 to indium in the electroconductive oxide, is from 0.005 to 0.2 wherein the [M1] and the [In] are as described above.

(48) The invention is also the transparent electrode according to the item (46) or (47), wherein the electroconductive oxide comprises an oxide or oxides of one or two or more metal (s) selected from the second group M2 consisted of tin, zinc, germanium, and gallium beside indium oxide.

(49) The invention is also the transparent electrode according to the item 48, wherein [M2]/([In]+[M2]), which is the atomic composition ratio of the oxide (s) of the metal (s) selected from the second group M2 to indium in the electroconductive oxide, is from 0.01 to 0.3 wherein the [M2] and the [In] are as described above.

E. Invention of a Process for Producing a TFT Substrate (5) The invention is a process for producing a TFT substrate, comprising: the step of depositing the electroconductive oxide onto the transparent substrate, thereby forming a thin film of the electroconductive oxide; and the step of etching the formed thin film of the electroconductive oxide with an aqueous solution containing oxalic acid, thereby forming the transparent electrode.

Even if the source electrode or the like is made of Al, such a structure makes it possible to prevent the source electrode or the like which contains Al from eluting out when the transparent electrode is formed (when the transparent electrode is etched). Such an effect/advantage is produced in the same manner by the following invention using a different etching solution.

(51) The invention is also a process for producing a TFT substrate, comprising: the step of depositing the electroconductive oxide onto the transparent substrate, thereby forming a thin film of the electroconductive oxide; and the step of etching the formed thin film of the electroconductive oxide with an aqueous solution containing phosphoric acid, acetic acid and nitric acid, thereby forming the transparent electrode.

(52) The invention is also a process for producing a TFT substrate, comprising: the step of depositing the electroconductive oxide onto the transparent substrate, thereby forming a thin film of the electroconductive oxide; and the step of etching the formed thin film of the electroconductive oxide with an aqueous solution containing a cerium aluminum salt of nitric acid, thereby forming the transparent electrode.

As the method for forming the film of the transparent electrode (electroconductive oxide), vapor deposition, sputtering, CVD, spraying, dipping or the like can be used. It is particularly preferred to adopt sputtering.

F. Kind of Lanthanoids

(53) The invention is also the process for producing the TFT substrate, the sputtering target for producing a transparent electrode, the liquid crystal display, the pixel electrode, the transparent electrode, or the TFT substrate according to any one of the items (30) to (52), wherein the lanthanoid (s) are one or more lanthanoids selected from Ce, Nd, Er and Ho.

Advantageous Effects of the Invention

First Group: Advantageous Effects

As described above, in the transparent electroconductive film in the thin film transistor substrate of the invention, residues resulting from etching by use of a weak acid (such as an organic acid) are hardly generated when the film is produced. Therefore, the thin film transistor substrate of the invention is excellent in workability, and the yield thereof is improved. Moreover, the thin film transistor liquid crystal display of the invention exhibits an improved production efficiency since the display has the above-mentioned thin film transistor substrate.

According to the process of the invention for producing a thin film transistor substrate, residues or the like resulting from etching of the transparent electroconductive film by use of a given acidic etchant are hardly generated. Accordingly, the thin film transistor substrate can be effectively produced.

Second Group: Advantageous Effects

The invention of the second group has been made in light of the above-mentioned problems which the prior art has. A transparent electroconductive material containing the specific metal (s) is used for a pixel electrode and a transparent electrode, thereby enabling to control the contact resistances between the Al gate and the transparent electrode and between the Al source/drain and the pixel electrode into small values even if a barrier metal or the like is not used.

As a result, the number of steps for the production can be reduced. Consequently, the process for producing a TFT (thin film transistor) substrate can be made simple.

Even if the transparent electroconductive (film) material is brought into direct contact with an Al gate or Al source/drain electrodes in the invention of the second group, the contact resistance generated therein can be made into a small value. Thus, a liquid crystal display wherein half-tone display can be satisfactorily attained can be provided.

In the above-mentioned description about the invention of the second group, there is a description section depending on relationship with Al. Instead of Al in this description section, Ag may be used, thereby producing substantially the same effects and advantages. This matter will be described in detail in working examples.

Third Group: Advantageous Effects

As described above, according to the process of the invention of the third group for producing a thin film transistor substrate, the first conductor can easily be etched since the first conductor comprises the Al alloy containing the specific metal (s). For this reason, a thin film transistor substrate can be more easily produced at lower costs.

In the thin film transistor and the thin film transistor substrate of the invention of the third group, the first conductor comprises the Al alloy containing the specific metal (s); therefore, the contact resistance is low when the second conductor is connected to the first conductor through the contact hole made in the insulation film. Furthermore, the first conductor can easily be etched.

In the liquid crystal display of the invention of the third group, the second conductor is connected directly to the first conductor through the contact hole formed in the insulation film without interposing any layer having a low light transmittance. Thus, the display has a high numerical aperture.

Fourth Group: Advantageous Effects

As described above, the invention of the fourth group has been made in light of the problems which the prior art has. A transparent electroconductive material containing the specific metal (s) is used for a pixel electrode or transparent electrode, thereby enabling to make the process for producing a TFT (thin film transistor) substrate simple.

According to the invention of the fourth group, even if a gate containing Al and a transparent electrode, or a source/drain containing Al and a pixel electrode are caused to contact each other directly or are jointed directly to each other, the contact resistance therebetween can be controlled into a lower value than in the prior art. Thus, a liquid crystal display capable of attaining half-tone display can be provided.

BRIEF DESCRIPTION OF THE DRAWINGS

[FIG. 3] These (FIG. 3 (1) and FIG. 3 (2)) are each an explanatory view illustrating a situation of a first film-formation in present Example 2-9.

[FIG. 4] These (FIG. 4 (1) and FIG. 4 (2)) are each an explanatory view illustrating a situation of a second film-formation in present Example 2-9.

[FIG. 8] This is a sectional process chart illustrating the step of producing the TFT array substrate in present Examples.

[FIG. 9] This is a wiring diagram illustrating the external appearance of wiring of a Kelvin pattern in present Examples, and a situation of a measurement thereof.

[FIG. 11] This is a sectional view of a vicinity of an α-SiTFT at a stage when the formation of a pattern of a pixel electrode is ended in the process of producing a liquid crystal flat display in the prior art.

Figure 1:
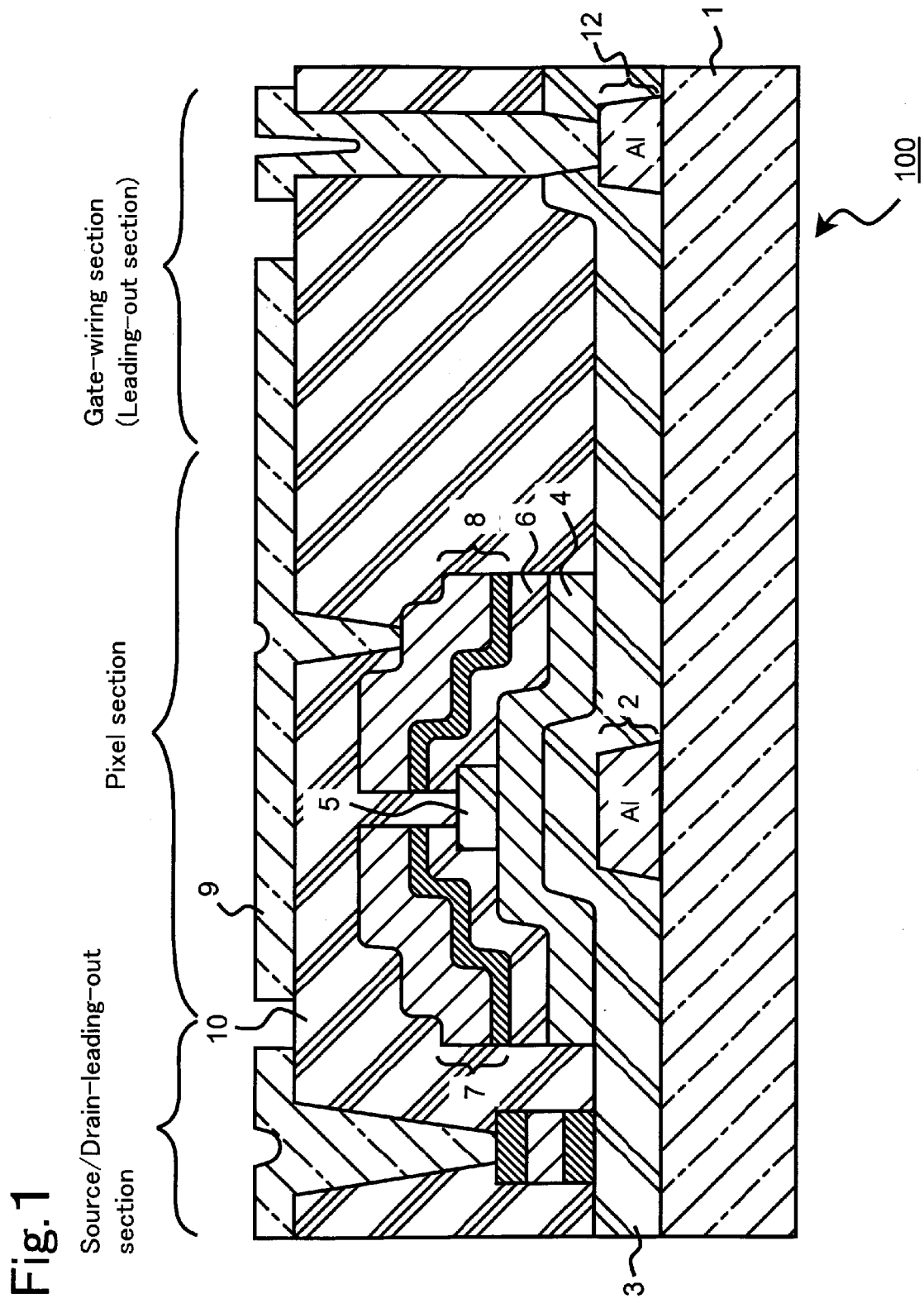
[FIG. 1] This is a sectional view of a vicinity of an α-SiTFT active matrix substrate in each of present Examples 1-1 to 1-3.

EXPLANATION OF REFERENCE NUMBERS 1 glass substrate
2 gate electrode
3 gate insulation film
4 α-Si:H(i) film
5 channel protection film
6 α-Si:H(n) film
7 drain electrode
8 source electrode
9 transparent electroconductive film
10 transparent resin resist
11 reflecting electrode
12 gate electrode wiring
100 α-SiTFT active matrix substrate
102 gate electrode
107 drain electrode
108 source electrode
200 α-SiTFT active matrix substrate
1100 slide glass
1102 mask for a first film-formation
1104 Al pattern
1106 mask for a second film-formation
1108 metal oxide
1110 first contact resistance measuring substrate
1120 second contact resistance measuring substrate
2001 transparent insulating substrate
2002 gate electrode
2004 gate insulation film
2005 semiconductor layer a-Si film
2006 semiconductor layer n$^+$ a-Si film
2007a drain electrode
2007b source electrode
2009 interlayer insulation film
2010 contact hole
2011 pixel electrode
2021 TFT section
2022 terminal section
2100 TFT array substrate
3001 glass substrate
3002 gate electrode
3002a gate electrode wiring
3003 gate insulation film
3004 α-Si:H(i) film
3005 gate insulation film
3006 α-Si:H(n) film
3007 source electrode
3008 drain electrode
3009 pixel electrode pattern
3010 transparent resin resist
3012 contact hole
3014 gate line leading-out section
3016 source/drain line leading-out section

BEST MODE FOR CARRYING OUT THE INVENTION

FIRST GROUP: EXAMPLES

Preferred examples of the present embodiment of the first group will be described hereinafter, using the drawings.

Example 1-1

FIG. 1 illustrates a sectional view of a vicinity of an α-SiTFT (amorphous silicon thin film transistor) active matrix substrate 100 in the Example 1-1. Metallic Al was deposited onto a light-transmissible glass substrate 1 by high-frequency sputtering so as to have a film thickness of 1500 Å. This glass substrate 1 corresponds to one example of the transparent substrate described in the claims.

Next, the deposited Al was etched into a shape illustrated in FIG. 1 by photo-etching using a phosphoric acid/acetic acid/nitric acid/water (the ratio by volume=12/6/1/1)-based aqueous solution as an etchant to form a gate electrode 2 and a gate electrode wiring 12.

Next, a silicon nitride film (hereinafter, denoted as a SiN film in some cases), which would be a gate insulation film 3, was deposited on the glass substrate 1, the gate electrode 2 and the gate electrode wiring 12 by glow discharge CVD, so as to have a film thickness of 3000 Å. Subsequently, an α-Si:H (i) film 4 was deposited on this gate insulation film 3 to have a film thickness of 3500 Å, and further a silicon nitride film (SiN film), which would be a channel protective layer 5, was deposited on the α-Si:H (i) film 4 to have a film thickness of 3000 Å.

At the discharge gas at this time, a $SiH_4$—$NH_3$—$N_2$-based mixed gas was used about the gate insulation film 3 and the channel protective layer 5, which were each made of the SiN film, while a $SiH_4$—$N_2$-based mixed gas was used about the α-Si:H (i) film 4. The channel protective layer 5, which was made of the SiN film, was etched by dry etching using a CHF-based gas to form a shape illustrated in FIG. 1.

Subsequently, a $SiH_4$—$H_2$—$PH_3$-based mixed gas was used to deposit an α-Si:H (n) film 6 on the α-Si:H (i) film 4 and the channel protective layer 5 to have a film thickness of 3000 Å.

Next, a metallic Mo/metallic Al bi-layered film was successively deposited on the deposited α-Si:H (n) film 6 by sputtering so as to make the film thickness of metallic Mo for the lower layer to 0.05 μm and set that of metallic Al to 0.2 μm.

This metallic Mo/metallic Al bi-layered film was etched into a shape illustrated in FIG. 1 by photo-etching using a phosphoric acid/acetic acid/nitric acid/water (the ratio by volume=9/8/1/2)-based aqueous solution, so as to form a pattern of a drain electrode 7 and a pattern of a source electrode 8.

Furthermore, the α-Si:H (i) film 4 and the α-Si:H (n) film 6, which were each made of an α-Si:H film, were etched by using a combination of dry etching using a CHF-based gas and wet etching using an aqueous hydrazine ($NH_2NH_2 \cdot H_2O$) solution, so as to form a pattern of the α-Si:H (i) film 4 and a pattern of the α-Si:H (n) film 6, each of which had a shape illustrated in FIG. 1. As illustrated in FIG. 1, a transparent resin resist 10 was used to form a protection film and further a pattern of through holes and so on was formed.

Next, an amorphous transparent electroconductive film 9 made mainly of indium oxide and tungsten oxide was deposited on the substrate subjected to the above-mentioned processing. The target used in the sputtering was an $In_2O_3$—$WO_3$ sintered body prepared to set the value of [In]/([In]+[W]), which is an atomic ratio between In and W in the target, to 0.97. The [In] represents the number per unit volume of the indium atoms in the transparent electroconductive film 9 and the [W] represents the number per unit volume of the tungsten atoms in the transparent electroconductive film 9.

In the sputtering, this $In_2O_3$—$WO_3$ sintered body was used to be arranged onto a planar magnetron-based cathode, and the transparent electroconductive film 9 was deposited to make the film thickness thereof to 1000 Å. At this time, pure argon gas or argon gas into which $O_2$ gas was incorporated in a trace amount of about 1% by volume was used as the discharge gas at the time of the sputtering.

The form that tungsten is contained in the target may be a form that tungsten is dispersed as a tungsten oxide such as $WO_3$ or $WO_2$ in the indium oxide sintered body, or may be a form that tungsten is dispersed as a complex oxide between indium oxide and tungsten oxide such as $In_2W_3O_{12}$ in the indium oxide sintered body. Preferred is a form that tungsten atoms undergo substitution/solid-solution into indium sites of indium oxide, whereby tungsten is dispersed into the indium oxide sintered body at an atomic level. Such a case, in which tungsten is dispersed into the indium oxide sintered body at an atomic level, is more effective for stabilizing discharge in the sputtering or obtaining the transparent electroconductive film 9 having a low resistance.

The relative density of the target made of this $In_2O_3$—$WO_3$ sintered body was 96%. A different test demonstrated that if the relative density of the target made of this $In_2O_3$—$WO_3$ sintered body was 95% or more, nodules or overdischarge was not generated.

The transparent electroconductive film 9, which was the $In_2O_3$—$WO_3$ film formed by the sputtering, was analyzed by x-ray analysis. As a result, no peak was observed so that it was proved that the film was an amorphous film. The specific resistance of the transparent electroconductive film 9, which was this $In_2O_3$—$WO_3$ film, was about $3.8 \times 10^{-4}$ Ωcm. Thus, it was proved that the film was a film which was able to be satisfactorily used as an electrode. It was also proved that when tin oxide was incorporated into the above-mentioned target, which was made of the $In_2O_3$—$WO_3$ sintered body, in an amount of 1 to 10% by weight, the specific resistance of the formed transparent electroconductive film 9 was $1.8 \times 10^{-4}$ Ωcm or less.

This transparent electroconductive film 9, which was the $In_2O_3$—$WO_3$ film, was etched by photo-etching using a 3.2% by weight solution of oxalic acid in water as an etchant in order to give a pattern of a transparent pixel electrode. In this way, the pattern of the transparent pixel electrode, which was made of an amorphous electrode of the transparent electroconductive film 9 illustrated in FIG. 1, was formed.

At this time, the pattern of the source electrode 8 and the pattern of the transparent pixel electrode, which was made of the transparent electroconductive film 9, were formed into desired patterns so as to be electrically connected to each other. At this time, the drain electrode 7 and the source electrode 8 containing Al did not elute out with the etching solution. Next, this glass substrate 1 was thermally heated at 250° C. for 30 minutes. This 3.2% by weight solution of oxalic acid in water corresponds to one example of the acidic etchant containing oxalic acid described in the claims.

Thereafter, a SiN passivation film (not illustrated) and a light-shielding pattern (not illustrated) were formed to produce an α-SiTFT active matrix substrate 100 illustrated in FIG. 1. On the glass substrate 1 in this α-SiTFT active matrix substrate 100, the pattern of the pixel section and so on illustrated in FIG. 1 and the same patterns were regularly formed. In other words, the α-SiTFT active matrix substrate 100 of Example 1-1 was an array substrate. This α-SiTFT active matrix substrate 100 corresponds to one preferred example of the thin film transistor substrate described in the claims.

A liquid crystal layer and a color filter substrate were formed on this α-SiTFT active matrix substrate 100, thereby producing a TFT-LCD system flat display. This TFT-LCD system flat display corresponds to one example of the thin film transistor liquid crystal display described in the claims. About this TFT-LCD system flat display, a lighting test was performed. As a result, there was no defective pixel electrode so that favorable display was able to be attained.

Example 1-2

An α-SiTFT active matrix substrate 100 in Example 1-2 is different from the α-SiTFT active matrix substrate 100 in Example 1-1 only in the composition of the transparent electroconductive film 9, and the structure thereof is substantially the same as in FIG. 1. Accordingly, the α-SiTFT active matrix substrate 100 of Example 1-2 will also be described using FIG. 1.

As illustrated in FIG. 1, metallic Al was deposited onto a light-transmissible glass substrate 1 by high-frequency sputtering so as to have a film thickness of 1500 Å. Next, the deposited Al was etched into a shape illustrated in FIG. 1 by photo-etching using a phosphoric acid/acetic acid/nitric acid/water (the ratio by volume=12/6/1/1)-based aqueous solution as an etchant to form a gate electrode 2 and a gate electrode wiring 12. This glass substrate 1 corresponds to one example of the transparent substrate described in the claims.

Next, a silicon nitride film (hereinafter, denoted as a SiN film in some cases), which would be a gate insulation film 3, was deposited on the glass substrate 1, the gate electrode 2 and the gate electrode wiring 12 by glow discharge CVD to have a film thickness of 3000 Å. Subsequently, an α-Si:H (i) film 4 was deposited on this gate insulation film 3 to have a film thickness of 3500 Å, and further a silicon nitride film (SiN film), which would be a channel protective layer 5, was deposited on the α-Si: H (i) film 4 to have a film thickness of 3000 Å.

At the discharge gas at this time, a $SiH_4$—$NH_3$—$N_2$-based mixed gas was used about the gate insulation film 3 and the channel protective layer 5, which were each made of the SiN film, while a $SiH_4$—$N_2$-based mixed gas was used about the α-Si:H (i) film 4. The channel protective layer 5, which was made of the SiN film, was etched by dry etching using a CHF-based gas to form a shape illustrated in FIG. 1.

Subsequently, a $SiH_4$—$H_2$—$PH_3$-based mixed gas was used to deposit an α-Si:H (n) film 6 on the α-Si:H (i) film 4 and the channel protective layer 5 to have a film thickness of 3000 Å.

Next, a metallic Mo/metallic Al bi-layered film was successively deposited on the deposited α-Si:H (n) film 6 by sputtering so as to make the film thickness of metallic Mo for the lower layer to 0.05 μm and set that of metallic Al to 0.2 μm.

This metallic Mo/metallic Al bi-layered film was etched into a shape illustrated in FIG. 1 by photo-etching using a phosphoric acid/acetic acid/nitric acid/water (the ratio by volume=9/8/1/2)-based aqueous solution, so as to form a pattern of a drain electrode 7 and a pattern of a source electrode 8.

Furthermore, the α-Si:H (i) film 4 and the α-Si:H (n) film 6, which were each made of an α-Si:H film, were etched by using a combination of dry etching using a CHF-based gas and wet etching using an aqueous hydrazine ($NH_2NH_2 \cdot H_2O$) solution, so as to form a pattern of the α-Si:H (i) film 4 and a pattern of the α-Si:H (n) film 6, each of which had a shape illustrated in FIG. 1. As illustrated in FIG. 1, a transparent resin resist 10 was used to form a protection film and further a pattern of through holes and so on was formed.

Next, an amorphous transparent electroconductive film 9 made mainly of indium oxide and molybdenum oxide was deposited on the substrate subjected to the above-mentioned processing by sputtering. The target used in the sputtering was an $In_2O_3$—$MoO_3$ sintered body prepared to set the value of [In]/([In]+[Mo]), which is an atomic ratio between In and Mo in the target, to 0.90. The [In] represents the number per unit volume of the indium atoms in the transparent electroconductive film 9 and the [Mo] represents the number per unit volume of the molybdenum atoms in the transparent electroconductive film 9.

In the sputtering, this $In_2O_3$—$MoO_3$ sintered body was used to be arranged onto a planar magnetron-based cathode, and the transparent electroconductive film 9 was deposited to make the film thickness to 1000 Å. At this time, pure argon gas or argon gas into which $O_2$ gas was incorporated in a trace amount of about 1% by volume was used as the discharge gas at the time of the sputtering.

The form that molybdenum is contained in the target may be a form that molybdenum is dispersed as a molybdenum oxide such as $MoO_3$ or $MoO_2$ in the indium oxide sintered body, or may be a form that molybdenum is dispersed as a complex oxide of indium and molybdenum, such as $In_2Mo_4O_6$, $In_2Mo_3O_{12}$ or $In_{11}Mo_4O_{62}$, in the indium oxide sintered body. Preferred is a form that molybdenum atoms undergo substitution/solid-solution into indium sites of indium oxide, whereby molybdenum is dispersed into indium oxide crystal. Such a case, in which molybdenum is dispersed into the indium oxide sintered body at an atomic level, is more effective for stabilizing electric discharge in the sputtering or obtaining the transparent electroconductive film 9 having a low resistance.

The relative density of the target made of this $In_2O_3$—$MoO_3$ sintered body was 96%. A different test demonstrated that if the relative density of the target made of this $In_2O_3$—$MoO_3$ sintered body was 95% or more, nodules or overdischarge was not generated.

The transparent electroconductive film 9, which was the $In_2O_3$—$MoO_3$ film formed by the sputtering, was analyzed by x-ray analysis. As a result, no peak was observed so that it was proved that the film was an amorphous film. The specific resistance of the transparent electroconductive film 9, which was this $In_2O_3$—$MoO_3$ film, was about $3.4 \times 10^{-4}$ Ωcm. Thus, it was proved that the film was a film which was able to be satisfactorily used as an electrode. It was also proved that when tin oxide was incorporated into the above-mentioned target, which was the made of $In_2O_3$—$MoO_3$ sintered body, in an amount of 1 to 10% by weight, the specific resistance of the formed transparent electroconductive film 9 was $1.9 \times 10^{-4}$ Ωcm or less.

This transparent electroconductive film 9, which was the $In_2O_3$—$MoO_3$ film, was etched by photo-etching using a 3.2% by weight solution of oxalic acid in water as an etchant in order to give a pattern of a transparent pixel electrode. In this way, the pattern of the transparent pixel electrode, which was made of the amorphous electrode of the transparent electroconductive film 9 illustrated in FIG. 1, was formed.

At this time, the pattern of the source electrode 8 and the pattern of the transparent pixel electrode, which was made of the transparent electroconductive film 9, were formed into desired patterns so as to be electrically connected to each other. At this time, the drain electrode 7 and the source electrode 8 containing Al did not elute out with the etching solution. Next, this glass substrate 1 was thermally heated at 250° C. for 30 minutes. This 3.2% by weight solution of oxalic acid in water corresponds to one example of the acidic etchant containing oxalic acid described in the claims.

Thereafter, a SiN passivation film (not illustrated) and a light-shielding pattern (not illustrated) were formed to produce an α-SiTFT active matrix substrate 100 illustrated in FIG. 1. On the glass substrate 1 in this α-SiTFT active matrix substrate 100, the pattern of the pixel section and so on illustrated in FIG. 1 and the same patterns were regularly formed. In other words, this α-SiTFT active matrix substrate 100 was an array substrate. This α-SiTFT active matrix substrate 100 of Example 1-2 corresponds to one preferred example of the thin film transistor substrate described in the claims in the same manner as in Example 1-1.

A liquid crystal layer and a color filter substrate were formed on this α-SiTFT active matrix substrate 100, thereby producing a TFT-LCD system flat display. This TFT-LCD system flat display corresponds to one example of the thin film transistor liquid crystal display described in the claims. About this TFT-LCD system flat display, a lighting test was made. As a result, there was no defective pixel electrode so that favorable display was able to be attained.

Example 1-3

An α-SiTFT active matrix substrate 100 in Example 1-3 is different from the α-SiTFT active matrix substrate 100 in Examples 1-1 to 1-2 only in the composition of the transparent electroconductive film 9, and the structure thereof is substantially the same as in FIG. 1. Accordingly, the α-SiTFT active matrix substrate 100 of Example 1-3 will also be described using FIG. 1.

A metallic Al (alloy) (the composition weight %: Al/Ni=99/1) was deposited onto a light-transmissible glass substrate 1 by high-frequency sputtering so as to have a film thickness of 2500 Å. Next, the deposited Al was etched into the same shapes as the gate electrode 2 and the gate electrode wiring 12 in FIG. 1 by photo-etching using a phosphoric acid/acetic acid/nitric acid/water (the ratio by volume=9/6/1/2)-based aqueous solution as an etchant to form a gate electrode 2 and a gate electrode wiring 12. This glass substrate 1 corresponds to one example of the transparent substrate described in the claims.

Next, a silicon nitride film (hereinafter, denoted as a SiN film in some cases), which would be a gate insulation film 3, was deposited on the glass substrate 1, the gate electrode 2 and the gate electrode wiring 12 by glow discharge CVD to have a film thickness of 3000 Å. Subsequently, an α-Si:H (i) film 4 was deposited on this gate insulation film 3 to have a film thickness of 3500 Å, and further a silicon nitride film (SiN film), which would be a channel protective layer 5, was deposited on the α-Si:H (i) film 4 to have a film thickness of 3000 Å.

At the discharge gas at this time, a $SiH_4$—$NH_3$—$N_2$-based mixed gas was used about the gate insulation film 3 and the channel protective layer 5, which were each made of the SiN film, while a $SiH_4$—$N_2$-based mixed gas was used about the α-Si:H (i) film 4. The channel protective layer 5, which was made of the SiN film, was etched by dry etching using a CHF-based gas to form a shape illustrated in FIG. 1.

Subsequently, a $SiH_4$—$H_2$—$PH_3$-based mixed gas was used to deposit an α-Si:H (n) film 6 on the α-Si:H (i) film 4 and the channel protective layer 5 to have a film thickness of 3000 Å.

Next, a metallic Mo/metallic Al bi-layered film was successively deposited on the deposited α-Si:H (n) film 6 by sputtering so as to make the film thickness of metallic Mo for the lower layer to 0.05 μm and set that of metallic Al to 0.2 μm.

This metallic Mo/metallic Al bi-layered film was etched into a shape illustrated in FIG. 1 by photo-etching using a phosphoric acid/acetic acid/nitric acid/water (the ratio by volume=9/6/1/2)-based aqueous solution as an etchant, so as to form a pattern of a drain electrode 7 and a pattern of a source electrode 8.

Furthermore, the α-Si:H (i) film 4 and the α-Si:H (n) film 6, which were each made of an α-Si:H film, were etched by using a combination of dry etching using a CHF-based gas and wet etching using an aqueous hydrazine ($NH_2NH_2 \cdot H_2O$) solution, so as to form a pattern of the α-Si:H (i) film 4 and a pattern of the α-Si:H (n) film 6, each of which had a shape illustrated in FIG. 1. As illustrated in FIG. 1, a transparent resin resist 10 was used to form a protection film and further a pattern of through holes and so on was formed.

Next, an amorphous transparent electroconductive film 9 made mainly of indium oxide and niobium oxide was deposited on the substrate subjected to the above-mentioned processing, as illustrated in FIG. 1. The target used in the sputtering was an $In_2O_3$—$Nb_2O_5$ sintered body prepared to set the value of [In] ([In]+[Nb]), which is an atomic ratio between In and Nb in the target, to 0.95. The [In] represents the number per unit volume of the indium atoms in the transparent electroconductive film 9 and the [Nb] represents the number per unit volume of the niobium atoms in the transparent electroconductive film 9.

In the sputtering, this $In_2O_3$—$Nb_2O_5$ sintered body was used to be arranged onto a planar magnetron-based cathode, and the transparent electroconductive film 9 was deposited to make the film thickness thereof to 1000 Å. At this time, pure argon gas or argon gas into which $O_2$ gas was incorporated in a trace amount of about 1% by volume was used as the discharge gas at the time of the sputtering.

The form that niobium is contained in the target may be a form that niobium is dispersed as a niobium oxide such as $Nb_2O_5$ or $Nb_2O_3$ in the indium oxide sintered body, or may be a form that niobium is dispersed as a complex oxide of indium and niobium, such as $InNbO_4$, in the indium oxide sintered body at an atomic level. Preferred is a form that niobium atoms undergo substitution/solid-solution into indium sites of indium oxide, whereby niobium is dispersed into the indium oxide sintered body. Such a case, in which niobium is dispersed into the indium oxide sintered body at an atomic level, is more effective for stabilizing discharge in the sputtering or obtaining the transparent electroconductive film 9 having a low resistance.

The relative density of the target made of this $In_2O_3$—$Nb_2O_5$ sintered body was 97%. A different test demonstrated that if the relative density of the target made of this $In_2O_3$—$Nb_2O_5$ sintered body was 95% or more, nodules or overdischarge was not generated.

The transparent electroconductive film 9, which was the $In_2O_3$—$Nb_2O_5$ film formed by the sputtering, was analyzed by X-ray analysis. As a result, no peak was observed so that it was proved that the film was an amorphous film. The specific resistance of the transparent electroconductive film 9, which was this $In_2O_3$—$Nb_2O_5$ film, was about $3.6 \times 10^{-4}$ Ωcm. Thus, it was proved that the film was a film which was able to be satisfactorily used as an electrode. It was also proved that when tin oxide was incorporated into the above-mentioned target, which was the made of $In_2O_3$—$Nb_2O_5$ sintered body, in an amount of 1 to 10% by weight, the specific resistance of the formed transparent electroconductive film 9 was $1.7 \times 10^{-4}$ Ωcm or less.

This transparent electroconductive film 9, which was the $In_2O_3$—$Nb_2O_5$ film, was etched by photo-etching using a 3.2% by weight solution of oxalic acid in water as an etchant in order to give a pattern of a transparent pixel electrode. In this way, the pattern of the transparent pixel electrode, which was made of the amorphous electrode of the transparent electroconductive film 9 illustrated in FIG. 1, was formed. This 3.2% by weight solution of oxalic acid in water corresponds to the acidic etchant containing oxalic acid described in the claims.

At this time, the pattern of the source electrode 8 and the pattern of the transparent pixel electrode were formed into desired patterns so as to be electrically connected to each other. At this time, the source electrode 8 and the drain electrode 7 neither underwent line-breaking nor line-narrowing. Next, this glass substrate 1 was thermally heated at 250° C. for 30 minutes.

Thereafter, a SiN passivation film (not illustrated) and a light-shielding pattern (not illustrated) were formed to produce an α-SiTFT active matrix substrate 100 illustrated in FIG. 1. On the glass substrate 1 in this α-SiTFT active matrix substrate 100, the pattern of the pixel section and so on illustrated in FIG. 1 and the same patterns were regularly formed. In other words, the α-SiTFT active matrix substrate 100 of Example 1-3 was an array substrate. This α-SiTFT active matrix substrate 100 corresponds to one preferred example of the thin film transistor substrate described in the claims in the same manner as in Examples 1-1 and 1-2.

A liquid crystal layer and a color filter substrate were formed on this α-SiTFT active matrix substrate 100, thereby producing a TFT-LCD system flat display. This TFT-LCD system flat display corresponds to one example of the crystal display described in the claims. About this TFT-LCD system flat display, a lighting test was made. As a result, there was no defective pixel electrode so that favorable display was able to be attained.

Example 1-4

An α-SiTFT active matrix substrate 100 in Example 1-4 is different from the α-SiTFT active matrix substrate 100 in Examples 1-1 to 1-3 only in the composition of the transparent electroconductive film 9, and the structure thereof is substantially the same as in FIG. 1. Accordingly, the α-SiTFT active matrix substrate 100 of Example 1-4 will also be described using FIG. 1.

As illustrated in FIG. 1, a metallic Al (alloy) (the composition weight %: Al/Ni=99/1) was deposited onto a light-transmissible glass substrate 1 by high-frequency sputtering so as to have a film thickness of 2000 Å. Next, the deposited Al made of the metallic Al was etched into a shape illustrated in FIG. 1 by photo-etching using a phosphoric acid/acetic acid/nitric acid/water (the ratio by volume=9/6/1/2)-based aqueous solution as an etchant to form a gate electrode 2 and a gate electrode wiring 12. This glass substrate 1 corresponds to one example of the transparent substrate described in the claims.

Next, a silicon nitride film (hereinafter, denoted as a SiN film in some cases), which would be a gate insulation film 3, was deposited by glow discharge CVD, as illustrated in FIG. 1, to have a film thickness of 3000 Å. Subsequently, as illustrated in FIG. 1, an α-Si:H (i) film 4 was deposited thereon to have a film thickness of 3500 Å, and further a silicon nitride film (SiN film), which would be a channel protective layer 5, was deposited thereon to have a film thickness of 3000 Å.

At the discharge gas at this time, a $SiH_4$—$NH_3$—$N_2$-based mixed gas was used about the gate insulation film 3 and the channel protective layer 5, which were each made of the SiN film, while a $SiH_4$—$N_2$-based mixed gas was used about the α-Si:H (i) film 4. The channel protective layer 5, which was made of the SiN film, was etched by dry etching using a CHF-based gas to form a shape illustrated in FIG. 1.

Subsequently, a $SiH_4$—$H_2$—$PH_3$-based mixed gas was used to deposit an α-Si:H (n) film 6, as illustrated in FIG. 1, to have a film thickness of 3000 Å.

Next, a metallic Mo/metallic Al (alloy) (the composition weight %: Al/Ni=99/1) bi-layered film was successively deposited on the deposited α-Si:H (n) film 6 by sputtering so as to make the film thickness of metallic Mo for the lower layer to 0.05 μm and set that of metallic Al for the upper layer to 0.2 μm.

This metallic Mo/metallic Al bi-layered film was etched into a shape illustrated in FIG. 1 by photo-etching using a phosphoric acid/acetic acid/nitric acid/water (the ratio by volume=9/6/1/2)-based aqueous solution, so as to form a pattern of a drain electrode 7 and a pattern of a source electrode 8.

Next, a combination of dry etching using a CHF-based gas and wet etching using an aqueous hydrazine ($NH_2NH_2.H_2O$) solution was used to form a pattern of the α-Si:H (i) film 4 and a pattern of the α-Si:H (n) film 6, each of which was made of the α-Si:H film. As illustrated in FIG. 1, a transparent resin resist 10 was used to form a protection film and further a pattern of through holes and so on was formed.

Next, an amorphous transparent electroconductive film 9 made mainly of indium oxide and nickel oxide was deposited on the substrate subjected to the above-mentioned processing. The target used in the sputtering was an $In_2O_3$—NiO sintered body prepared to set the value of [In]/([In]+[Ni]), which is an atomic ratio between In and Ni in the target, to 0.95. The [In] represents the number per unit volume of the indium atoms in the transparent electroconductive film 9 and the [Ni] represents the number per unit volume of the nickel atoms in the transparent electroconductive film 9.

In the sputtering, this $In_2O_3$—NiO sintered body was used to be arranged onto a planar magnetron-based cathode, and the transparent electroconductive film 9 was deposited to make the film thickness to 1000 Å. At this time, pure argon gas or argon gas into which $O_2$ gas was incorporated in a small amount of about 1% by volume was used as the discharge gas at the time of the sputtering.

The form that nickel is contained in the target may be a form that nickel is dispersed as a nickel oxide such as NiO in the indium oxide sintered body, or may be a form that nickel is dispersed as a complex oxide of indium and nickel, such as $In_2NiO_4$, in the indium oxide sintered body. Preferred is a form that nickel atoms undergo substitution/solid-solution into indium sites of indium oxide, whereby nickel is dispersed into the indium oxide sintered body at an atomic level. Such a case, in which nickel is dispersed into the indium oxide sintered body at an atomic level, is more effective for stabilizing discharge in the sputtering or obtaining the transparent electroconductive film 9 having a low resistance. The relative density of the target made of this $In_2O_3$—NiO sintered body was 97%. A different test demonstrated that if the relative density of the target made of this $In_2O_3$—NiO sintered body was 95% or more, nodules or overdischarge was not generated.

The transparent electroconductive film 9, which was the $In_2O_3$—NiO film formed by the sputtering, was analyzed by x-ray analysis. As a result, no peak was observed so that it was proved that the film was an amorphous film. The specific resistance of the transparent electroconductive film 9, which was this $In_2O_3$—NiO film, was about $4.6 \times 10^{-4}$ Ωcm. Thus, it was proved that the film was a film which was able to be satisfactorily used as an electrode. It was also proved that when tin oxide was incorporated into the above-mentioned target in an amount of 1 to 10% by weight, the specific resistance of the formed transparent electroconductive film 9 was $2.2 \times 10^{-4}$ Ωcm or less.

This transparent electroconductive film 9, which was the $In_2O_3$—NiO film, was etched by photo-etching using a 3.2% by weight solution of oxalic acid in water as an etchant in order to give a pattern of a transparent pixel electrode. In this way, the pattern of the transparent pixel electrode, which was made of the amorphous electrode of the transparent electroconductive film 9 illustrated in FIG. 1, was formed.

At this time, the pattern of the source electrode 8 and the pattern of the transparent pixel electrode, which was made of the transparent electroconductive film 9, were formed into desired patterns so as to be electrically connected to each other. At this time, the source electrode 8 and the drain electrode 7, made of the metallic Al, neither underwent line-breaking nor line-narrowing. Next, this glass substrate 1 was thermally heated at 250° C. for 30 minutes. This 3.2% by weight solution of oxalic acid in water corresponds to the acidic etchant containing oxalic acid described in the claims.

Thereafter, a SiN passivation film (not illustrated) and a light-shielding pattern (not illustrated) were formed to produce an α-SiTFT active matrix substrate 100 illustrated in FIG. 1. On the glass substrate 1 in this α-SiTFT active matrix substrate 100, the pattern of the pixel section and so on illustrated in FIG. 1 and the same patterns were regularly formed. In other words, the α-SiTFT active matrix substrate 100 of Example 1-4 was an array substrate. This α-SiTFT active matrix substrate 100 corresponds to one preferred example of the thin film transistor substrate described in the claims in the same manner as in Example 1-1.

A liquid crystal layer and a color filter substrate were formed on this α-SiTFT active matrix substrate 100, thereby producing a TFT-LCD system flat display. This TFT-LCD system flat display corresponds to one example of the thin film transistor liquid crystal display described in the claims. About this TFT-LCD system flat display, a lighting test was made. As a result, there was no defective pixel electrode so that favorable display was able to be attained.

Example 1-5

In Examples 1-1 to 1-4, there have been described examples wherein the etchant used when the transparent electroconductive film 9 was etched was a 3.2% by weight solution of oxalic acid in water; however, the etchant used when the transparent electroconductive film 9 is etched is also preferably a mixed acid composed of phosphoric acid, acetic acid and nitric acid or a solution of cerium (IV) ammonium nitrate in water besides the above-mentioned aqueous oxalic acid solution.

Example 1-6

As described in Examples 1-1 to 1-4, various oxides were used for the respective transparent electroconductive films 9 in the present embodiment. In the Example 1-6, the electrode potentials of these oxides to a Ag/AgCl standard electrode were measured. The measurement was carried out by measuring the electrode potentials thereof in various electrolytes (electrolytic solutions).

In Table 1 are shown measurement examples wherein a 2.8% by weight solution of TMAH (tetramethylammonium hydroxide) in water was used as one of the electrolytes. On the other hand, in Table 2 are shown measurement examples wherein a peeling or releasing solution was used as one of the electrolytes.

TABLE 1

|  | Electrolyte | Standart electrode potential(V)(relative to Ag/AgCl electrode) | Potentoal difference (V) from Al (absolute value) |
|---|---|---|---|
| Transparent electroconductive film of Example 1-1 ($In_2O_3$—$WO_3$) | 2.8 wt % TMAH solution in water | −0.352 | 0.543 |
| Transparent electroconductive film of Example 1-2 ($In_2O_3$—$MoO_3$) | 2.8 wt % TMAH solution in water | −0.386 | 0.509 |
| Transparent electroconductive film of Example 1-3 ($In_2O_3$—$Nb_2O_5$) | 2.8 wt % TMAH solution in water | −0.365 | 0.530 |
| Transparent electroconductive film of Example 1-4 ($In_2O_3$—NiO) | 2.8 wt % TMAH solution in water | −0.378 | 0.517 |
| ITO | 2.8 wt % TMAH solution in water | −0.238 | 0.657 |
| IZO | 2.8 wt % TMAH solution in water | −0.247 | 0.648 |
| Al | 2.8 wt % TMAH solution in water | −0.895 | — |
| Al—Nd(1 wt %) | 2.8 wt % TMAH solution in water | −0.848 | |

TMAH: tetramethylammonium hydroxide

As illustrated in Table 1, the potential (relative to the Ag/AgCl electrode) of the transparent electroconductive film made of $In_2O_3$—$WO_3$ used in Example 1-1 was −0.352 V. The absolute value of the potential difference from Al was 0.543 V (see Table 1).

The potential (relative to the Ag/AgCl electrode) of the transparent electroconductive film made of $In_2O_3$—$MoO_3$ used in Example 1-2 was −0.386 V (see Table 1). The absolute value of the potential difference from Al was 0.509 V (see Table 1).

The potential (relative to the Ag/AgCl electrode) of the transparent electroconductive film made of $In_2O_3$—$Nb_2O_5$ used in Example 1-3 was −0.365 V (see Table 1). The absolute value of the potential difference from Al was 0.530 V (see Table 1).

The potential (relative to the Ag/AgCl electrode) of the transparent electroconductive film made of $In_2O_3$—NiO used in Example 1-4 was −0.378 V (see Table 1). The absolute value of the potential difference from Al was 0.517 V (see Table 1).

On the other hand, the potential (relative to the Ag/AgCl electrode) of the transparent electroconductive film made of ITO was −0.238 V (see Table 1). The absolute value of the potential difference from Al was 0.657 V (see Table 1).

The potential (relative to the Ag/AgCl electrode) of the transparent electroconductive film made of IZO was −0.247 V (see Table 1). The absolute value of the potential difference from Al was 0.648 V (see Table 1).

The potential (relative to the Ag/AgCl electrode) of Al, which is a comparative object in the above, was −0.895 V (see Table 1). The potential (relative to the Ag/AgCl electrode) of an Al—Nd (composition ratio of Nd: 1% by weight) alloy was −0.848 V (see Table 1).

In the case where Al electrically contacts a transparent electrode and further Al contacts an electrolyte as described above, a potential difference (electromotive force) as shown in Table 1 is generated. It appears that this potential difference (electromotive force) causes acceleration of corrosion of the Al electrode. As shown in Table 1, the transparent electrode of the invention makes it possible that the potential difference (electromotive force) thereof from Al is made smaller than that of ITO or IZO by about 0.1 V or more. According to the invention, the potential difference (electromotive force) becomes small in this way; it is therefore evident that corrosion reaction of the electrode is restrained.

Next, the measurement results in the case of using a peeling solution as the electrolyte are shown in Table 2. This peeling solution was a solution wherein diethanolamine and N-methylpyrrolidone were mixed at a ratio of 30% by volume to 70% by volume.

TABLE 2

|  | Electrolyte | Standart electrode potential(V)(relative to Ag/AgCl electrode) | Potentoal difference (V) from Al(absolute value) |
|---|---|---|---|
| Transparentelectroconductive film of Example 1-1 ($In_2O_3$—$WO_3$) | Peeling solution | −0.248 | 0.472 |
| Transparentelectroconductive film of Example 1-2 ($In_2O_3$—$MoO_3$) | Peeling solution | −0.268 | 0.452 |
| Transparentelectroconductive film of Example 1-3 ($In_2O_3$—$Nb_2O_5$) | Peeling solution | −0.256 | 0.464 |
| Transparentelectroconductive film of Example 1-4 ($In_2O_3$—NiO) | Peeling solution | −0.287 | 0.433 |
| ITO | Peeling solution | −0.120 | 0.600 |
| IZO | Peeling solution | | |
| Al | Peeling solution | −0.720 | — |
| Al—Nd(1 wt %) | Peeling solution | | |

Peeling solution: diethanolamine/N-methylpyrrolidone = 30:70% by volume

As shown in Table 2, the potential (relative to the Ag/AgCl electrode) of the transparent electroconductive film made of $In_2O_3$—$WO_3$ used in Example 1-1 was −0.248V. The absolute value of the potential difference from Al was 0.472 V (see Table 2).

The potential (relative to the Ag/AgCl electrode) of the transparent electroconductive film made of $In_2O_3$—$MoO_3$ used in Example 1-2 was −0.286 V (see Table 2). The absolute value of the potential difference from Al was 0.452 V (see Table 2).

The potential (relative to the Ag/AgCl electrode) of the transparent electroconductive filmmade of $In_2O_3$—$Nb_2O_5$ used in Example 1-3 was −0.256 V (see Table 2). The absolute value of the potential difference from Al was 0.464 V (see Table 2).

The potential (relative to the Ag/AgCl electrode) of the transparent electroconductive film made of $In_2O_3$—NiO used in Example 1-4 was −0.287 V (see Table 2). The absolute value of the potential difference from Al was 0.433 V (see Table 2).

On the other hand, the potential (relative to the Ag/AgCl electrode) of the transparent electroconductive film made of ITO was −0.120 V (see Table 2). The absolute value of the potential difference from Al was 0.600 V (see Table 2).

The potential (relative to the Ag/AgCl electrode) of Al, which is a comparative object in the above, was −0.720 V (see Table 1).

In the case that Al electrically contacts a transparent electrode and further Al contacts an electrolyte as described above, a potential difference (electromotive force) as shown in Table 2 is generated. It appears that this potential difference (electromotive force) causes acceleration of corrosion of the Al electrode. As shown in Table 2, the transparent electrode of the invention makes it possible that the potential difference (electromotive force) thereof from Al is made smaller than that of ITO or IZO by about 0.1 V or more. According to the invention, the potential difference (electromotive force) becomes small in this way; it is therefore evident that corrosion reaction of the electrode is restrained.

Modified Example 1-1

Figure 2:
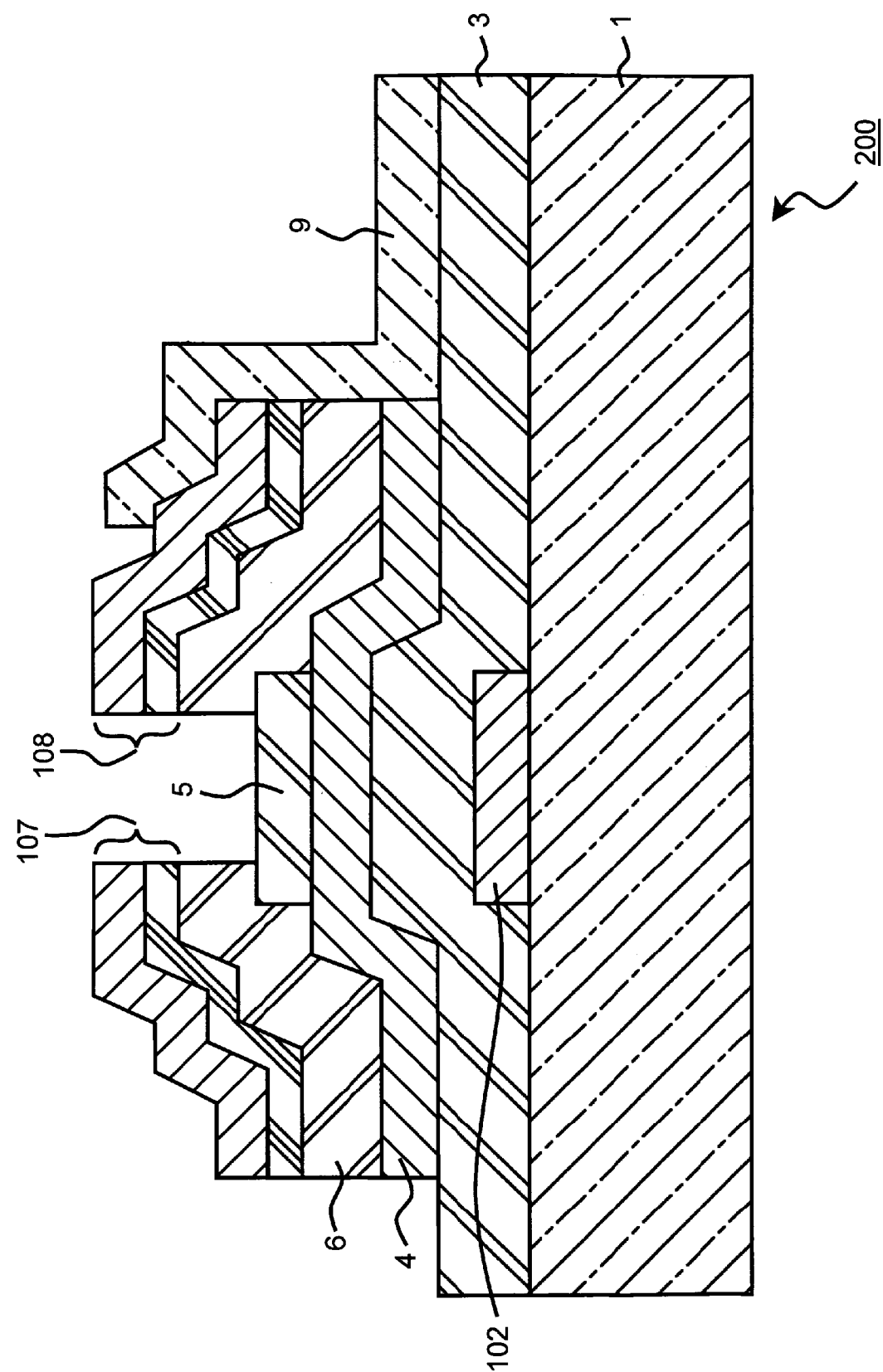
[FIG. 2] This is a sectional view of a vicinity of an α-SiTFT active matrix substrate in present modified Example 1-1.

FIG. 2 illustrates a sectional view of a vicinity of a different α-SiTFT active matrix substrate 200 of the example. A characteristic of the α-SiTFT active matrix substrate 200 of the Modified Example 1-1 is that a transparent electroconductive film 9 is formed directly on a source electrode 108 without forming any transparent resin resist.

As illustrated in FIG. 2, a drain electrode 7 and the source electrode 8 in the Modified Example 1 are each made of a metallic Cr/metallic Al bi-layered film. In the same manner as in above Examples 1-1 to 1-4, it is also preferred that the drain electrode 7 and the source electrode 8 are each made of a metallic Mo/metallic Al bi-layered film. In the drain electrode 7 and the source electrode 8 in FIG. 2, their lower layer was a layer made of metallic Cr, and their upper layer was a layer made of metallic Al.

As illustrated in FIG. 2, as a gate electrode 102 in the Modified Example 1-1, there is described an example having a mono-layered structure made of a metallic Al layer. In the same manner as the gate electrode 2 in above Examples 1-1 and 1-2, this gate electrode 102 preferably has a bi-layered structure composed of an Al layer and a Mo layer. In the same manner as in above Example 1-3, it is also preferred that the metallic Al layer is made of a metallic Al (alloy) (the composition weight %: A/Ni=99/1).

The α-SiTFT active matrix substrate 200 of the Modified Example 1-1, illustrated in FIG. 2, produces the same effects and advantages as the α-SiTFT active matrix substrate 100 of above Examples 1-1 to 1-4.

Second Group

The following will describe the best embodiment for carrying out the invention of the second group.

Example 2-1

$In_2O_3$ powder having an average particle diameter of 1 μm or less, $WO_3$ powder having an average particle diameter of 1 μm or less, and $CeO_2$ powder having an average particle diameter of 1 μm or less were formulated to set the atom number ratio represented by [tungsten]/([tungsten]+[indium]) and the atom number ratio represented by [cerium]/([cerium]+[indium]) to 0.02 and 0.03, respectively.

Such atom number ratios are shown in Table 3. In the present patent, W, Mo, Nb, Ni, Pt and Pd are called the first metal group, and are together denoted as "M1". This M1 is also used as a symbol representing any one of W, Mo, Nb, Ni, Pt and Pd. In Table 3 also, M1 is used as a symbol representing any metal of W, Mo, Nb, Ni, Pt and Pd.

TABLE 3

| | M1 | [M1]/([In]+[M1]) | M2 | [M2]/([In]+[M2]) | M3 | [M3]/([In]+[M3]) | Relative density % | Indium oxide average particle diameter μm | Transparent electrode specific resistance μΩcm | Contact resistance with Al Ω | |
|---|---|---|---|---|---|---|---|---|---|---|---|
| | | | | | | | | | | Glass/Al/ transparent electrode | Glass/ transparent electrode/Al |
| Example 2-1 | W | 0.02 | Ce | 0.03 | — | — | 96 | 3.4 | 680 | 32.5 | 36.2 |
| Example 2-2 | Mo | 0.02 | He | 0.04 | — | — | 96 | 3.6 | 520 | 34.6 | 38.7 |
| Example 2-3 | Nb | 0.03 | Er | 0.05 | Sn | 0.05 | 97 | 3.7 | 545 | 26.7 | 27.7 |
| Example 2-4 | Ni | 0.05 | Ce | 0.03 | Zn | 0.10 | 95 | 3.4 | 625 | 26.8 | 28.6 |
| Example 2-5 | Pt | 0.02 | Ce | 0.03 | Zn | 0.10 | 95 | 3.7 | 685 | 30.4 | 35.4 |
| Example 2-6 | Pd | 0.05 | Ce | 0.03 | Zn | 0.01 | 95 | 3.6 | 685 | 31. | 32.7 |
| Example 2-7 | W | 0.01 | Ce | 0.03 | Ge | 0.03 | 97 | 3.8 | 720 | 32.2 | 34.9 |
| Example 2-8 | W | 0.02 | Le | 0.03 | Ge | 0.03 | 97 | 3.7 | 820 | 32.5 | 35.9 |
| Comparative Example 2-1 | — | — | — | — | Sn | 0.10 | 99 | 12.8 | 185 | 84.7 | 29.4 |
| Comparative Example 2-2 | — | — | — | — | Zn | 0.16 | 98 | 3.8 | 295 | 88.5 | 35.4 |
| Comparative Example 2-3 | W | 0.25 | Ce | 0.25 | — | — | 84 | 15 | 1M or more | 1M or more | 1M or more |
| Comparative Example 2-4 | W | 0.25 | Ce | 0.25 | Sn | 0.4 | 60 | — | 1M or more | 1M or more | 1M or more |

In the present patent, lanthanoid-based metals are called the second metal group, and are together denoted as "M2". This M2 is also used as a symbol representing any one of lanthanoid-based metals. In Table 3 also, M2 is used as a symbol representing a lanthanoid-based metal. As specific examples of lanthanoid-based metals, Ce, Ho, Er and Ce are shown.

In the present patent, Zn, Sn, Zr, Ga and Ge are called the third metal group, and are together denoted as "M3". This M3 is also used as a symbol representing any one of Zn, Sn, Zr, Ga and Ge. In Table 3 also, M3 is used as a symbol representing any metal of Zn, Sn, Zr, Ga and Ge.

In the patent, the symbol of [ ] is used as a symbol representing the number of atoms per unit weight or unit volume. For example, For example, [tungsten] or [W] represents the number of tungsten atoms, and [indium] or [In] represents the number of indium atoms. Accordingly, the above-mentioned [tungsten]/([tungsten]+[indium]) represents the atom number ratio of tungsten to indium. In the case that this is described as [W]/([W]+[In]), the content thereof is the same.

Similarly, the above-mentioned [cerium]/([cerium]+[indium]) represents the atom number ratio of cerium to indium. In the case that this is described as [Ce]/([Ce]+[In]), the content thereof is the same.

Furthermore, the following descriptive form is also used: [M1], [M2], or [M3], wherein M1, M2 or M3, which is one of the generic names of the above-mentioned metal groups, is inserted into [ ]. [M1] represents the number of the atoms of one or more metals selected appropriately from the first metal group, [M2] represents the number of the atoms of one or more metals selected appropriately from the second metal group, and [M3] represents the number of the atoms of one or more metals selected appropriately from the third metal group.

After the formulation at the above-mentioned ratio, the resultant was put into a pot made of resin, and further pure water was poured into the pot. The components therein were mixed with a wet ball mill using a hard $ZrO_2$ ball mill. The time for the mixing was set to 20 hours. The resultant mixed slurry was taken out, filtrated, dried and granulated. The resultant granulated product was molded by cold isostatic press under a pressure of 294 MPa (3 t/cm$^2$).

Next, this molded product was sintered as follows. In a sintering furnace, the product was sintered at 1500° C. in an atmosphere wherein oxygen was introduced at a rate of 5 L/min. per 0.1 m$^3$ of the volume inside the furnace for 5 hours. At this time, the temperature was raised at 1° C./min. up to 1000° C., and at 3° C./min. from 1000 to 1500° C. Thereafter, the introduction of oxygen was stopped, and the temperature was lowered at 10° C./min. from 1500 to 1300° C. The temperature of 1300° C. was then kept in an atmosphere wherein argon gas was introduced at a rate of 10 L/min. per 0.1 m$^3$ of the volume inside the furnace for 3 hours. The product was naturally cooled, thereby obtaining an $In_2O_3$ sintered body containing tungsten and cerium and having a relative density of 95% or more.

A specific calculated value of the relative density was 96%, as shown in Table 3. The theoretical density in this case was calculated out from fractions by weight of $In_2O_3$ crystal (bixbite-based structure) having no oxygen defects, W oxide, and Ce oxide.

A sputtering surface of the sintered body was polished with a cup grindstone and worked into a diameter of 100 mm and a thickness of 5 mm. This was stuck to a backing plate by use of an indium-based alloy to obtain a sintered body target 1001.

In present Example 2-1, it is preferred that tungsten is dispersed, in particular, tungsten undergoes substitution/solid-solution into indium sites of indium oxide. In other words, the form that tungsten is contained in the target may be a form that tungsten is dispersed as a tungsten oxide such as $WO_3$ or $WO_2$ in the indium oxide sintered body, or may be a form that tungsten is dispersed as a complex oxide between indium oxide and tungsten oxide, such as $In_2W_3O_{12}$, in the indium oxide sintered body.

About cerium, only cerium oxide may condense, or a part thereof may undergo substitution/solid-solution into indium sites of indium oxide. By such dispersion, the average diameter of the cerium oxide crystal grains, which was obtained by image processing, was made into 2.1 μm. The condensation of the cerium oxide is attained so as to set the size of preferably to 5 μm or less, more preferably to 4 μm or less, more preferably to 3 μm or less. If the dispersion is insufficient so that the cerium oxide having a size of 10 μm or more is present, overdischarge may be induced during sputtering discharge or the cerium oxide may cause the generation of nodules.

By dispersing as described above, the average diameter of the indium oxide crystal grains was made into 3.4 μm as shown in Table 3. This diameter was obtained by image processing.

It is also preferred that tungsten atoms undergo substitution/solid-solution in indium sites of indium oxide, whereby tungsten is dispersed into the indium oxide sintered body at an atomic level. By such dispersion, the following advantages are produced: electric discharge is stabilized at the time of sputtering and the resistance of the resultant transparent electroconductive thin film is made low.

Example 2-2

$In_2O_3$ powder having an average particle diameter of 1 μm or less, $MoO_3$ powder having an average particle diameter of 1 μm or less, and $Ho_2O_3$ powder having an average particle diameter of 1 μm or less were used as starting powders. The $In_2O_3$ powder, the $MoO_3$ powder and the $Ho_2O_3$ powder were formulated at a given ratio, put into a pot made of resin, and mixed with a wet ball mill. At this time, hard $ZrO_2$ balls were used, and the time for the mixing was set to 20 hours. The resultant mixed slurry was taken out, filtrated, dried and granulated. The resultant granulated product was filled into a circular mold, and was molded into a disk shape by cold isostatic press under a pressure of 3 ton/cm$^2$.

At this time, the composition ratio of Mo, which is one in the first metal group M1, to indium ([Mo]/([Mo]+[In])) was 0.02, and the composition ratio of Ho, which is one in the second metal group M2, to indium ([Ho]/([Ho]+[In])) was 0.04. The same content is shown in Table 3.

Next, the molded product was put into an atmosphere-adjusting furnace, and then sintered. At the time of the sintering, oxygen was introduced into the furnace at a rate of 5 L/min. per 0.1 m$^3$ of the volume inside the furnace. At the same time, the molded body was sintered at 1500° C. for 5 hours. At this time, the temperature was raised at 1° C./min. up to 1000° C., and at 3° C./min. from 1000 to 1500° C. After the end of the sintering, the introduction of oxygen was stopped, and the temperature was lowered at 10° C./min. from 1500 to 1300° C. The temperature of 1300° C. was then kept for 3 hours while Ar was introduced into the furnace at a rate of 10 L/min. per 0.1 m$^3$ of the volume inside the furnace. Thereafter, the product was naturally cooled, thereby obtaining a sintered body 2 containing Mo and having a density of 90% or more. A specific calculated value of the relative density was 96%, as shown in Table 3. The theoretical density in this case was calculated out from fractions by weight of $In_2O_3$ crystal (bixbite-based structure) having no oxygen defects, Mo oxide, and Ho oxide.

Next, a sputtering surface of the sintered body was polished with a cup grindstone and worked into a diameter of 152 mm and a thickness of 5 mm. In this way, a target 1002 was obtained.

The form that the molybdenum element is contained in the target may be a form that molybdenum is dispersed as a molybdenum oxide such as $MoO_3$ or $MoO_2$ in the indium oxide sintered body, or may be a form that molybdenum is dispersed as a complex oxide of indium and molybdenum, such as $InMo_4O_6$, $In_2Mo_3O_{12}$ or $In_{11}Mo_4O_{62}$, in the indium oxide sintered body. Preferred is a form that molybdenum atoms undergo substitution/solid-solution into indium sites of indium oxide, whereby molybdenum is dispersed into the indium oxide sintered body at an atomic level. Such a case has advantageous effects of making discharge in sputtering stable and making the resistance of the (transparent electroconductive) film produced by the sputtering low.

About holmium, only holmium oxide may condense, or a part thereof may undergo substitution/solid-solution into indium sites of indium oxide. By such dispersion, the average diameter of the holmium oxide crystal grains obtained by image processing was made into 1.8 μm. The condensation of the holmium oxide is attained so as to set the size preferably to 5 μm or less, more preferably to 4 μm or less, more preferably to 3 μm or less. If the dispersion is insufficient so that the cerium oxide having a size of 10 μm or more is present, overdischarge may be induced during sputtering discharge or the holmium oxide may cause the generation of nodules.

By dispersing in this way, the average diameter of the indium oxide crystal grains was made into 3.6 μm as shown in Table 3. This diameter was obtained by image processing.

Example 2-3

$In_2O_3$ powder, $SnO_2$ powder, $Nb_2O_5$ powder, and $Er_2O_3$ powder each having an average particle diameter of 1 μm or less were used as starting powders. First, the $In_2O_3$ powder, $SnO_2$ powder, $Nb_2O_5$ powder, and $Er_2O_3$ powder were weighed into given amounts, and the weighed powders were mixed, put into a pot made of resin, and mixed with a wet ball mill using water as a medium. At this time, hard $ZrO_2$ balls were used, and the time for the mixing was set to 20 hours. Thereafter, the mixed slurry was taken out, filtrated, dried and granulated. The resultant granulated product was filled into a mold, and was molded into a given form by cold isostatic press under a pressure of 3 ton/cm².

At this time, the composition ratio of Nb, which is one in the first metal group M1, to indium ([Nb]/([Nb]+[In])) was 0.03, the composition ratio of Er, which is one in the second metal group M2, to indium ([Er]/([Er]+[In])) was 0.05, and the composition ratio of Sn, which is one in the third metal group M3, to indium ([Sn]/([Sn]+[In])) was 0.05. The same content is shown in Table 3.

In the present patent, Zn, Sn, Zr, Ga and Ge are called the third metal group, and are together denoted as "M3". This M3 is also used as a symbol representing any one of Zn, Sn, Zr, Ga and Ge. In Table 3 also, M3 is used as a symbol representing any metal of Zn, Sn, Zr, Ga and Ge.

In the patent, the symbol of [ ] is used as a symbol representing the number of atoms per unit weight or unit volume. For example, [niobium] or [Nb] represents the number of niobium atoms, and [indium] or [In] represents the number of indium atoms. Accordingly, the above-mentioned [Nb]/([Nb]+[In]) represents the atom number ratio of tungsten to indium. In the case that this is described as [niobium]/([niobium]+[indium]), the content thereof is the same.

Similarly, the above-mentioned [Sn]/([Sn]+[In]) represents the atom number ratio of tin to indium. In the case that this is described as [tin]/([tin]+[indium]), the content thereof is the same.

In the present patent, [M3] is used as a symbol representing the number of one or two or more metal(s) selected from the third metal group M3.

Next, the resultant molded products were each sintered through the following steps.

First, oxygen was caused to flow into a sintering furnace at a rate of 5 L/min. per 0.1 m³ of the volume inside the furnace, and the temperature of 1500° C. was kept for 5 hours. At this time, the temperature was raised at 1° C./min. up to 1000° C., and at 3° C./min. from 1000 to 1500° C. Thereafter, the inflow of oxygen was stopped, and the temperature was lowered at 10° C./min. from 1500 to 1300° C. Thereafter, Ar was caused to flow into the furnace at a rate of 10 L/min. per 0.1 m³ of the volume inside the furnace, and the temperature of 1300° C. was then kept for 3 hours. Thereafter, the product was naturally cooled. The density of the resultant sintered body was measured in accordance with Archimedes' method using water. The relative density thereof was calculated from the theoretical density thereof. The theoretical density in this case was calculated out from fractions by weight of $In_2O_3$ crystal (bixbite-based structure) having no oxygen defects, Sb oxide, Nb oxide, and Er oxide. The calculated value of the relative density was specifically 97% as shown in Table 3.

The contents of Sn, Nb and Er in the sintered body were quantitatively analyzed by ICP emission analysis. As a result, it was proved that the charge composition at the time of mixing the starting powders was maintained.

Next, a sputtering surface of the resultant sintered body was polished with a cup grindstone and worked into a diameter of 152 mm and a thickness of 5 mm, thereby obtaining a sintered body target for a transparent electroconductive thin film. An In-based alloy was used to stick this target to a backing plate to make a target 1003 for sputtering.

The form that tin, niobium and erbium are incorporated into the target for sputtering may be a form that they are dispersed as a tin oxide (SnO, $SnO_2$ or $Sn_3O_4$), a niobium oxide ($Nb_2O_5$, $Nb_2O_3$ or NbO) and an erbium oxide (ErO or $ErO_3$), or may be a form that they are dispersed as complex oxides between indium oxide and tin oxide, indium oxide and niobium oxide, and indium oxide and erbium oxide.

Very preferred is a form that tin, niobium and erbium atoms undergo substitution/solid-solution into indium sites of indium oxide, whereby they are dispersed into the indium oxide sintered body at an atomic level. According to this dispersion form, electric discharge is stable in sputtering and a homogeneous film low in resistance is obtained. By such dispersion, the average diameter of crystal grains of the indium oxide was made into 3.7 μm, as shown in Table 3. This diameter was obtained by image processing.

Example 2-4

$In_2O_3$ powder, ZnO powder, NiO powder, and $CeO_2$ powder each having an average particle diameter of 1 μm or less were used as starting powders. First, the $In_2O_3$ powder, ZnO powder, and NiO powder were weighed into given amounts, and the weighed powders were mixed, put into a pot made of resin, and mixed with a wet ball mill using water as a medium. At this time, hard $ZrO_2$ balls were used, and the time for the mixing was set to 20 hours. Thereafter, the mixed slurry was taken out, filtrated, dried and granulated. The resultant granulated product was filled into a mold, and was molded into a given form by cold isostatic press under a pressure of 3 ton/cm², so as to obtain molded products. Next, the resultant molded products were each sintered through the following steps.

First, oxygen was caused to flow into a sintering furnace at a rate of 5 L/min. per 0.1 m³ of the volume inside the furnace, and the temperature of 1500° C. was kept for 5 hours. At this time, the temperature was raised at 1° C./min. up to 1000° C., and at 3° C./min. from 1000 to 1500° C. Thereafter, the inflow of oxygen was stopped, and the temperature was lowered at 10° C./min. from 1500 to 1300° C. Thereafter, Ar was caused to flow into the furnace at a rate of 10 L/min. per 0.1 m³ of the volume inside the furnace, and the temperature of 1300° C. was then kept for 3 hours. Thereafter, the product was naturally cooled.

The composition ratio of Ni, which is one in the first metal group M1, to indium ([Ni]/([Ni]+[In])) was 0.05, the composition ratio of Ce, which is one in the second metal group M2, to indium ([Ce]/([Ce]+[In])) was 0.03, and the composition ratio of Zn, which is one in the third metal group M3, to indium ([Zn]/([Zn]+[In])) was 0.10. The same content is shown in Table 3.

The density of the sintered body obtained as described above was measured in accordance with Archimedes' method using water. The relative density thereof was calculated from the theoretical density thereof. The theoretical density in this case was calculated out from fractions by weight of $In_2O_3$ crystal (bixbite-based structure) having no oxygen defects, Zn oxide, Ni oxide, and Ce oxide. The calculated value of the relative density was specifically 95% as shown in Table 3.

The contents of Zn, Ni and Ce in the sintered body were quantitatively analyzed by ICP emission analysis. As a result, it was proved that the charge composition at the time of mixing the starting powders was maintained.

Next, a sputtering surface of the resultant sintered body was polished with a cup grindstone and worked into a diameter of 152 mm and a thickness of 5 mm, thereby obtaining a sintered body target for a transparent electroconductive thin film. An In-based alloy was used to stick the target to a backing plate to make a sputtering target 1004.

The form that zinc, nickel and cerium are incorporated into the target 4 for sputtering may be a form that they are dispersed as a zinc oxide (ZnO), a nickel oxide (CeO or $Ce_2O_3$) and a cerium oxide ($CeO_4$ or $Ce_2O_3$), or may be a form that they are dispersed as a complex oxide of indium oxide and zinc oxide ($In_2Zn_2O_5$, $In_2Zn_5O_8$, $In_2Zn_7O_{10}$, $In_2Zn_3O_6$ and $In_2Zn_4O_7$).

Very preferred is a form that nickel and cerium atoms undergo substitution/solid-solution into indium sites of indium oxide, whereby they are dispersed into the indium oxide sintered body at an atomic level. According to this dispersion form, electric discharge is stable in sputtering and the sputtering gives a homogeneous film low in resistance.

By such dispersion, the average diameter of crystal grains of the indium oxide was made into 3.4 μm, as shown in Table 3. This diameter was obtained by image processing.

On the other hand, the process for producing the sintered body target (sputtering target) of the invention is not particularly limited except that a mixture wherein indium oxide, zinc oxide, nickel oxide and cerium oxide are mixed in given amounts is used. A known method is used to mix the four components, mold the mixture and sinter the molded product. Thereafter, the sintered body is shaped, whereby the sintered body target (sputtering target) can be produced. Components other than the four components may be added to the sintered body target as long as the objects of the invention are not damaged.

Example 2-5

$In_2O_3$ powder, ZnO powder, $PtO_2$ powder, and $CeO_2$ powder each having an average particle diameter of 1 μm or less were used as starting powders. First, the $In_2O_3$ powder, ZnO powder, and $PtO_2$ powder were weighed into given amounts, and the weighed powders were mixed, put into a pot made of resin, and mixed with a wet ball mill using water as a medium. At this time, hard $ZrO_2$ balls were used, and the time for the mixing was set to 20 hours. Thereafter, the mixed slurry was taken out, filtrated, dried and granulated. The resultant granulated product was filled into a mold, and was molded into a given form by cold isostatic press under a pressure of 3 ton/cm², so as to obtain molded products. Next, the resultant molded products were (each) sintered through the following steps.

Oxygen was caused to flow into a sintering furnace at a rate of 5 L/min. per 0.1 m³ of the volume inside the furnace, and the temperature of 1450° C. was kept for 5 hours. At this time, the temperature was raised at 1° C./min. up to 1000° C., and at 3° C./min. from 1000 to 1450° C. Thereafter, the inflow of oxygen was stopped, and the humidity was lowered at 10° C./min. from 1450 to 1300° C. Thereafter, Ar was caused to flow into the furnace at a rate of 10 L/min. per 0.1 m³ of the volume inside the furnace, and the temperature of 1300° C. was then kept for 3 hours. Thereafter, the product was naturally cooled.

The composition ratio of Pt, which is one in the first metal group M1, to indium ([Pt]/([Pt]+[In])) was 0.02, the composition ratio of Ce, which is one in the second metal group M2, to indium ([Ce]/([Ce]+[In])) was 0.03, and the composition ratio of Zn, which is one in the third metal group M3, to indium ([Zn]/([Zn]+[In])) was 0.10. The same content is shown in Table 3.

The density of the sintered body obtained as described above was measured in accordance with Archimedes' method using water. The relative density thereof was calculated from the theoretical density thereof. The theoretical density in this case was calculated out from fractions by weight of $In_2O_3$ crystal (bixbite-based structure) having no oxygen defects, Zn oxide, Pt oxide, and Ce oxide. The calculated value of the relative density was specifically 95% as shown in Table 3.

The contents of Zn, Pt and Ce in the sintered body were quantitatively analyzed by ICP emission analysis. As a result, it was proved that the charge composition at the time of mixing the starting powders was maintained.

Next, a sputtering surface of the resultant sintered body was polished with a cup grindstone and worked into a diameter of 152 mm and a thickness of 5 mm, thereby obtaining a sintered body sputtering target for a transparent electroconductive thin film. An In-based alloy was used to stick the sputtering target to a backing plate to make a sputtering target 1005.

The form that zinc, nickel and cerium are incorporated into the sputtering target 4 may be a form that they are dispersed as a zinc oxide (ZnO), a platinum oxide ($PtO_2$) and a cerium oxide ($CeO_4$ or $Ce_2O_3$), or may be a form that they are dispersed as a complex oxide of indium oxide and zinc oxide ($In_2Zn_2O_5$, $In_2Zn_5O_8$, $In_2Zn_7O_{10}$, $In_2Zn_3O_6$ and $In_2Zn_4O_7$).

Particularly preferred is a form that platinum and cerium atoms undergo substitution/solid-solution into indium sites of indium oxide, whereby they are dispersed into the indium oxide sintered body at an atomic level since electric discharge is stable in sputtering and the sputtering gives a homogeneous film low in resistance.

This is because: when cerium oxide undergoes solid-solution into indium oxide, cerium of quadrivalence occupies sites of indium of trivalence in the film of the indium oxide, thereby discharging carrier electrons to increase the electroconductivity.

A part of the cerium oxide may be present in the form of the cerium oxide alone. When the cerium oxide is present in the form of only the cerium oxide in this way, abnormal growth of the crystal of the indium oxide is restrained. Thus, the generation of nodule or the generation of overdischarge is restrained.

By such dispersion, the average diameter of the crystal grains of the indium oxide was made into 3.7 µm, as shown in Table 3. This diameter was obtained by image processing.

On the other hand, the process for producing the sintered body (sputtering) target of the invention is not particularly limited except that a mixture wherein indium oxide, zinc oxide, platinum oxide and cerium oxide are mixed in given amounts is used. A known method is used to mix the four components, mold the mixture and sinter the molded product. Thereafter, the sintered body is shaped, whereby the sintered body (sputtering) target can be produced.

Components other than the four components may be added to the sintered body (sputtering) target as long as the objects of the invention are not damaged.

Example 2-6

$In_2O_3$ powder, ZnO powder, PdO powder, and $CeO_2$ powder each having an average particle diameter of 1 µm or less were used as starting powders. First, the $In_2O_3$ powder, ZnO powder, and PdO powder were weighed into given amounts, and the weighed powders were mixed, put into a pot made of resin, and mixed with a wet ball mill using water as a medium. At this time, hard $ZrO_2$ balls were used, and the time for the mixing was set to 20 hours. Thereafter, the mixed slurry was taken out, filtrated, dried and granulated. The resultant granulated product was filled into a mold, and was molded into a given form by cold isostatic press under a pressure of 3 ton/cm$^2$, so as to obtain molded products.

Next, the resultant molded products were each sintered through the following steps.

Oxygen was caused to flow into a sintering furnace at a rate of 5 L/min. per 0.1 m$^3$ of the volume inside the furnace, and the temperature of 1450° C. was kept for 5 hours. At this time, the temperature was raised at 1° C./min. up to 1000° C., and at 3° C./min. from 1000 to 1450° C. Thereafter, the inflow of oxygen was stopped, and the temperature was lowered at 10° C./min. from 1450 to 1300° C. Thereafter, Ar was caused to flow into the furnace at a rate of 10 L/min. per 0.1 m$^3$ of the volume inside the furnace, and the temperature of 1300° C. was then kept for 3 hours. Thereafter, the product was naturally cooled.

The composition ratio of Pd, which is one in the first metal group M1, to indium ([Pd]/([Pd]+[In])) was 0.05, the composition ratio of Ce, which is one in the second metal group M2, to indium ([Ce]/([Ce]+[In])) was 0.03, and the composition ratio of Zn, which is one in the third metal group M3, to indium ([Zn]/([Zn]+[In])) was 0.10. The same content is shown in Table 3.

The density of the sintered body obtained as described above was measured in accordance with Archimedes' method using water. The relative density thereof was calculated from the theoretical density thereof. The theoretical density in this case was calculated out from fractions by weight of $In_2O_3$ crystal (bixbite-based structure) having no oxygen defects, Zn oxide, Pd oxide, and Ce oxide. The calculated value of the relative density was specifically 95% as shown in Table 3.

The contents of Zn, Pd and Ce in the sintered body were quantitatively analyzed by ICP emission analysis. As a result, it was proved that the charge composition at the time of mixing the starting powders was maintained. Next, a sputtering surface of the resultant sintered body was polished with a cup grindstone and worked into a diameter of 152 mm and a thickness of 5 mm, thereby obtaining a sintered body (sputtering) target. An In-based alloy was used to stick the target to a backing plate to make a sputtering target 1006.

The form that zinc, palladium and cerium are incorporated into the sputtering target may be a form that they are dispersed as a zinc oxide (ZnO), a palladium (PdO) and a cerium oxide ($CeO_4$ or $Ce_2O_3$), or may be a form that they are dispersed as a complex oxide of indium oxide and zinc oxide ($In_2Zn_2O_5$, $In_2Zn_5O_8$, $In_2Zn_7O_{10}$, $In_2Zn_3O_6$ and $In_2Zn_4O_7$). Preferred is a form that palladium and cerium atoms undergo substitution/solid-solution into indium sites of indium oxide, whereby they are dispersed into the indium oxide sintered body at an atomic level since electric discharge is stable in sputtering and the sputtering gives a homogeneous film low in resistance.

This is because: when cerium oxide undergoes solid-solution into indium oxide in this way, cerium of quadrivalence occupies sites of indium of trivalence in the film of the indium oxide, thereby discharging carrier electrons (from cerium) to increase the electroconductivity.

A part of the cerium oxide may be present in the form of only the cerium oxide. When the cerium oxide is present in the form of only the cerium oxide in this way, abnormal growth of the crystal of the indium oxide is restrained. Thus, the generation of nodule or the generation of overdischarge is restrained.

By such dispersion, the average diameter of the crystal grains of the indium oxide was made into 3.6 µm, as shown in Table 3. This diameter was obtained by image processing.

On the other hand, the process for producing the sintered body (sputtering) target of the invention is not particularly limited except that a mixture wherein indium oxide, zinc oxide, palladium oxide and cerium oxide are mixed in given amounts is used. A known method is used to mix the four components, mold the mixture and sinter the molded product. Thereafter, the sintered body is shaped, whereby the sintered body (sputtering) target can be produced.

Components other than the four components may be added to the sintered body (sputtering) target as long as the objects of the invention are not damaged.

Example 2-7

$In_2O_3$ powder having an average particle diameter of 1.0 µm or less, $GeO_2$ powder having an average particle diameter of 1 µm or less, $WO_3$ powder, and $CeO_2$ powder were used as starting powders. The $In_2O_3$ powder, the $GeO_2$ powder, the WO powder, and the $CeO_2$ powder were first formulated at a given ratio to obtain a sintered body having a composition of a [Ge]/[In] atomic ratio, [W]/[In], and [Ce]/[In] shown in Table 3, put into a pot made of resin, and mixed with a wet ball mill. At this time, hard $ZrO_2$ balls were used, and the time for the mixing was set to 24 hours. After the mixing, the slurry was taken out, filtrated, dried and granulated. This granulated product was molded by cold isostatic press under a pressure of 3 ton/cm$^2$.

Next, this molded product was sintered at 1300° C., in an atmosphere wherein oxygen was introduced into the air in a sintering furnace at a rate of 5 liters/minute per 0.1 m³ of the volume inside the furnace, for 3 hours. At this time, the temperature was raised at a rate of 1° C./minute. When the molded product was cooled after the sintering, the introduction of oxygen was stopped and the temperature was lowered up to 1000° C. at 10° C./minute.

The composition ratio of W, which is one in the first metal group M1, to indium ([W]/([W]+[In])) was 0.01, the composition ratio of Ce, which is one in the second metal group M2, to indium ([Ce]/([Ce]+[In])) was 0.03, and the composition ratio of Ge, which is one in the third metal group M3, to indium ([Ge]/([Ge]+[In])) was 0.03. The same content is shown in Table 3.

A cracked part of the sintered body obtained as described above was crushed into pieces, and then powder X-ray diffraction measurement was carried out. As a result, only diffraction peaks resulting from an indium oxide phase having a bixbite-based structure and cerium oxide were observed. Accordingly, the resultant sintered body was a sintered oxide having the characteristics of the invention.

The calculated value of the relative density of the resultant sintered body was 97%, as shown in Table 3.

EPMA analysis of the fine structure of this sintered body demonstrated that germanium and tungsten oxide underwent solid solution into the indium oxide phase, and further about the cerium oxide there were both of a portion where only cerium oxide was present and a portion where cerium oxide underwent solid-solution into the indium oxide. By dispersing in this way, the average diameter of the indium oxide crystal grains was made into 3.8 μm as shown in Table 3. This diameter was obtained by image processing.

This sintered body was worked into a diameter of 101 mm and a thickness of 5 mm, and a sputtering surface thereof was polished with a cup grindstone, thereby obtaining a (sputtering) target. Metallic indium was used to bond the target to a backing plate made of oxygen-free copper to make a sputtering target.

Germanium

When germanium oxide particles are present in a sputtering target, the target is electrified with argon ions radiated from plasma since the specific resistance of the germanium oxide particles is high. As a result, arcing is caused. This tendency becomes more remarkable as the electric power applied to the target is made higher to make the amount of the radiated argon ions larger.

On the other hand, in the sputtering target (of the example) according to the invention, the specific resistance of each of the indium oxide wherein germanium undergoes substitution/solid-solution into indium sites and the indium germanate compound is low. In other words, high-resistance particles are not present in the sputtering target; thus, the target has a characteristic that arcing is not easily generated even if the applied power is increased. For this reason, according to the example, a film can be formed at a high speed by the application of a high electric power.

The reason why the element of germanium (Ge) is incorporated into the sintered oxide (of the example) according to the invention is that: in the case of forming a thin film from the sputtering target into which the germanium (Ge) element is incorporated by sputtering, in the thin film germanium of quadrivalence occupies sites of indium of trivalence in the indium oxide film, thereby discharging carrier electrons to increase the electroconductivity of the thin film.

As described above, in the invention, the germanium element in the sputtering target is specified to set the atomic ratio of Ge/In into the range of 0.005 to 0.2 (inclusive). The reason why the ratio is controlled into such a numerical range is that if the ratio is out of the range, the resistance value of the resultant thin film increases.

Tungsten

In the sputtering target of the example, it is preferred that tungsten is dispersed therein. It is particularly preferred that tungsten undergoes substitution/solid-solution into indium sites of indium oxide.

That is to say, the form that tungsten is contained in the target may be a form that tungsten is dispersed as a tungsten oxide such as $WO_3$ or $WO_2$ in an indium oxide sintered body, or may be a form that tungsten is dispersed as a complex oxide between indium oxide and tungsten oxide such as $In_2W_3O_{12}$ in an indium oxide sintered body. Particularly preferred is a form that tungsten atoms undergo substitution/solid-solution into indium sites of indium oxide, whereby tungsten is dispersed into an indium oxide sintered body at an atomic level. Such dispersion at an atomic level makes electric discharge in sputtering stable. Furthermore, the atomic-level dispersion is effective since the dispersion makes the resistance of the resultant transparent electroconductive thin film low.

Cerium

When cerium oxide undergoes solid-solution into indium oxide, cerium of quadrivalence occupies sites of indium of trivalence in the film of the indium oxide. As a result, in the example, carrier electrons are discharged from cerium of quadrivalence so that the electroconductivity of the thin film increases.

A part of the cerium oxide may be present in the form of only the cerium oxide. When the cerium oxide is present in the form of only the cerium oxide in this way, abnormal growth of the crystal of the indium oxide is restrained. Thus, the generation of nodule or the generation of overdischarge is restrained.

Example 2-8

$In_2O_3$ powder having an average particle diameter of 1 μm or less, $Ga_2O_3$ powder having an average particle diameter of 1 μm or less, $WO_3$ powder, and $La_2O_3$ powder were used as starting powders. First, the $In_2O_3$ powder, the $GaO_2$ powder, the WO powder, and the $La_2O_3$ powder were formulated at a given ratio to obtain a sintered body having a composition ratio of a Ga/In atomic ratio, W/In, and La/In shown in Table 3, put into a pot made of resin, and mixed with a wet ball mill. At this time, hard $ZrO_2$ balls were used, and the time for the mixing was set to 24 hours. After the mixing, the slurry was taken out, filtrated, dried and granulated. This granulated product was molded by cold isostatic press under a pressure of 3 ton/cm².

Next, this molded product was sintered at 1450° C., in an atmosphere wherein oxygen was introduced into the air in a sintering furnace at a rate of 5 liters/minute per 0.1 m³ of the volume inside the furnace, for 3 hours. At this time, the temperature was raised at a rate of 1° C./minute. When the molded product was cooled after the sintering, the introduction of oxygen was stopped and the temperature was lowered up to 1000° C. at 10° C./minute.

The composition ratio of W, which is one in the first metal group M1, to indium ([W]/([W]+[In])) was 0.02, the composition ratio of La, which is one in the second metal group M2, to indium ([La]/([La]+[In])) was 0.03, and the composition ratio of Ga, which is one in the third metal group M3, to indium ([Ga]/([Ga]+[In])) was 0.03. The same content is shown in Table 3.

A cracked part of the sintered body obtained as described above was crushed into pieces, and then powder x-ray diffraction measurement was carried out. As a result, only diffraction peaks resulting from an indium oxide phase having a bixbite-based structure and cerium oxide was observed.

Accordingly, the sintered oxide of the example was a sintered oxide having the characteristics of the invention. EPMA analysis of the fine structure of the sintered body demonstrated that gallium underwent solid solution into the indium oxide phase. By dispersing in this way, the average diameter of the indium oxide crystal grains was made into 3.7 µm as shown in Table 3. This average diameter was obtained by image processing.

The calculated value of the relative density of the sintered oxide of the example was specifically 97%, as shown in Table 3.

This sintered body was worked into a diameter of 101 mm and a thickness of 5 mm, and a sputtering surface thereof was polished with a cup grindstone, thereby obtaining a (sputtering) target. Metallic indium was used to bond this target to a backing plate made of oxygen-free copper to make a sputtering target.

Gallium

When gallium oxide particles are present in a sputtering target, the target is electrified with argon ions radiated from plasma since the specific resistance of the gallium oxide particles is high. As a result, arcing is caused. This tendency becomes more remarkable as the electric power applied to the target is made higher to make the amount of the radiated argon ions larger.

On the other hand, in the sputtering target (of the example) according to the invention, the specific resistance of each of the indium oxide wherein gallium undergoes substitution/solid-solution into indium sites and the indium gallate compound is low (in other words, high-resistance particles are not present). Thus, the target has a characteristic that arcing is not easily generated even if the applied power is increased. For this reason, in the example, a film can be formed at a high speed by the application of a high electric power.

Tungsten

In the example, tungsten is dispersed in the sputtering target. It is particularly preferred that tungsten undergoes substitution/solid-solution into indium sites of indium oxide.

That is to say, the form that tungsten is contained in the sputtering target may be a form that tungsten is dispersed as a tungsten oxide such as $WO_3$ or $WO_2$ in an indium oxide sintered body, or may be a form that tungsten is dispersed as a complex oxide between indium oxide and tungsten oxide such as $In_2W_3O_{12}$ in an indium oxide sintered body.

Particularly preferred is a form that tungsten atoms undergo substitution/solid-solution into indium sites of indium oxide, whereby tungsten is dispersed into an indium oxide sintered body at an atomic level. Such dispersion at an atomic level makes it possible that electric discharge in sputtering is made stable and the resistance of the transparent electroconductive film obtained by the sputtering is made lower.

Lanthanum

A part of lanthanum may be present in the form of only lanthanum oxide. When lanthanum oxide is present alone in this way, abnormal growth of the crystal of the indium oxide is restrained. Thus, the generation of nodule or the generation of overdischarge is restrained.

Example 2-9

In the example, measured results of contact resistance are shown.

Case of Glass/Al/Transparent Electrode

First, a mask 1102 (a kapton tape) for first film-formation was fitted onto a slide glass 1100, as illustrated in FIG. 3(1), and Al was formed into a film of 200 nm thickness. Thereafter, the mask was lifted off to form a given Al pattern 1104 (see FIG. 3(2)).

Next, the sputtering targets obtained in above Examples 2-1 to 2-8 were each set into a DC sputtering machine. A mask 1106 (the same kapton tape) for second film-formation was fitted thereto (see FIG. 4(1)). Each of the sputtering targets obtained in Examples 1 to 8 was used to carry out sputtering, thereby forming a thin film (transparent electrode) 108 of 200 nm thickness. Thereafter, the mask 1106 for second film-formation was lifted off to obtain a substrate 1110 for first contact resistance measurement (see FIG. 4(2)). This substrate was a substrate produced for measuring contact resistance. Thus, the substrate is called the substrate 1110 for (first) contact resistance measurement in present Example 2-9.

Figure 5:
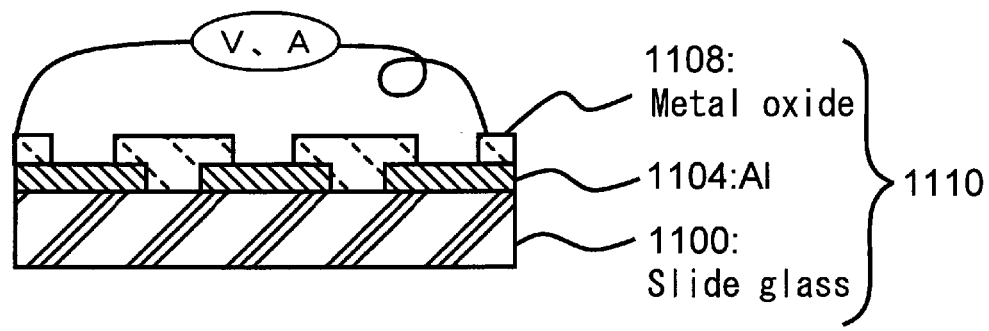
[FIG. 5] These (FIG. 5 (1) and FIG. 5 (2)) are each an explanatory view illustrating a situation of a contact resistance measurement in present Example 2-9.
Figure 5:
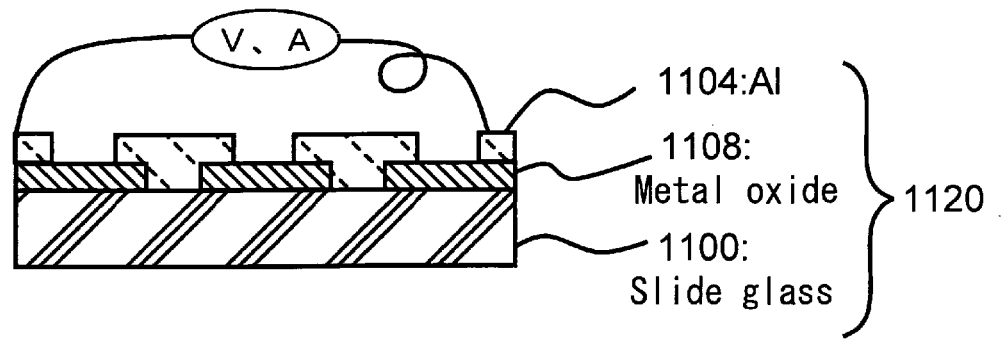

The substrate 1100 for contact resistance measurement was substantially rectangular. Terminals were set to both ends thereof, and then the resistance of the surface in the case of performing lamination into "glass/Al/transparent electrode" was measured. This situation is shown in FIG. 5(1). For example, the sputtering target produced in Example 2-1 was used to form a transparent electrode. The resistance value in this case was 32.5Ω. The numerical values in the case of using other Examples 2-2 to 2-8 are shown in Table 3.

In present Example 2-9, the transparent electroconductive film was used as an "electrode". Thus, this has been called the transparent electrode.

Case of Glass/Transparent Electrode/Al

The order of the formation of films was made as follows: transparent electrode/Al. That is, lamination into "glass/transparent electrode/Al" was performed. In order to measure the contact resistance in this case, a substrate 1120 for second contact resistance measurement was obtained. This substrate 1120 for second contact resistance measurement was different only in the order of the lamination of the Al pattern 1104 and the metal oxide 1108. The measured results of this substrate 1120 for second contact resistance measurement are also shown in Table 3. The method for the measurement, and so on are equal to those for the substrate 1110 for first contact resistance measurement. A situation thereof is shown in FIG. 5(2).

In the case of forming a film of a transparent electrode on Al, the surface of Al is oxidized to produce $Al_2O_3$. Accordingly, the measured resistance value becomes large.

Example 2-10

Preferred Example 2-10 of the invention will be described with reference to FIG. 1.

A metallic Al (99% Al and 1% Nd) was first deposited onto a light-transmissible glass substrate 1 by high-frequency sputtering so as to have a film thickness of 1500 Å. This was etched by photo-etching using a phosphoric acid-acetic acid-nitric acid-based aqueous solution as an etchant to form a gate electrode 2 and a gate electrode wiring each having a desired shape. Next, a silicon nitride (SiN) film, which would be a gate insulation film 3, was deposited thereon by glow discharge CVD to have a film thickness of 3000 Å. Subsequently, an amorphous Si:H (i) film 4 was deposited thereon to have a film thickness of 3500 Å, and further a silicon nitride (SiN) film 5, which would be a channel protective layer, was deposited thereon to have a film thickness of 3000 Å.

At the discharge gas at this time, a SiH$_4$—NH$_3$—N$_2$-based mixed gas was used about the SiN films 3 and 5 while a SiH$_4$—N$_2$-based mixed gas was used about the amorphous-Si:H (i) film 4. This SiN film 5 was made into a desired channel protective layer 5 by dry etching using a CHF gas. Subsequently, a SiH$_4$—H$_2$—PH$_3$-based mixed gas was used to deposit an amorphous-Si:H (n) film 6 into a film thickness of 3000 Å.

Next, a Cr/Al bi-layered film was deposited thereon. This bi-layered film was obtained by depositing Cr into a film thickness of 0.1 μm and Al into a film thickness of 0.3 μm in this order by vacuum deposition or sputtering. FIG. 1 shows that a source electrode 7 and a drain electrode 8 are each made of this bi-layered film.

Al in this bi-layered film was photo-etched with a H$_3$PO$_4$—CH$_3$COOH—HNO$_3$—H$_2$O-based etching solution while Cr in the bi-layered film was photo-etched with an aqueous solution of cerium (IV) ammonium nitrate. By the photo-etching, a desired pattern of the layer electrode 7 and a desired pattern of the drain electrode 8 were formed.

Furthermore, the amorphous-Si:H films were etched by using a combination of dry etching using a CHF gas and wet etching using an aqueous hydrazine (NH$_2$NH$_2$.H$_2$O) solution, so as to form a desired pattern of the amorphous-Si:H (i) film 4 and a desired pattern of the amorphous-Si:H (n) film 6.

Next, a silicon nitride (SiN) film, which would constitute an insulation film 10, was deposited by glow discharge CVD, so as to have a film thickness of 3000 Å. Thereafter, contact holes were made between the source and drain electrodes 7 and 8 and the transparent electrode or pixel electrode 9 by dry etching using CHF gas.

An amorphous transparent electroconductive film as obtained in Example 4, which was made mainly of indium oxide, zinc oxide, nickel oxide and cerium oxide, was deposited on this substrate, on which the patterns of the source electrode 7 and the drain electrode 8 made of the metallic Al were made, by sputtering. As the discharge gas, pure argon gas or argon gas into which O$_2$ gas was incorporated in a trace amount of about 1% by volume was used. In this manner, a transparent electrode film (transparent electroconductive film) 9 was deposited into a film thickness of 1200 Å. This In$_2$O$_3$—ZnO—NiO—CeO$_2$ film was analyzed by a X-ray diffraction method. As a result, no peak was observed, and the film was an amorphous film. The specific resistance of this film was about 6.25×10$^{-4}$ Ωcm. Thus, the film was a film capable of being satisfactorily used as an electrode.

This transparent electroconductive film was etched by photo-etching using a 3.5% by weight solution of oxalic acid in water as an etchant, so as to form a pixel electrode 9 having a desired pixel electrode pattern.

This pattern of the pixel electrode 9 was a pattern wherein the pixel electrode 9 was electrically connected to at least the source electrode 7 having the given pattern. By such etching, the pixel electrode 9 having the given pixel electrode pattern was formed. This pixel electrode 9 was a desired amorphous electrode.

At this time, the source electrode 7 and the drain electrode 8 of Al did not elute out. The gate line and electrode-leading-out sections of the source electrode/drain liens were covered with the transparent electrode.

The substrate at this stage corresponds to one example of the light-transmissible glass substrate in the claims.

Thereafter, a light-shielding film having a given light-shielding pattern was formed to complete an amorphous-SiTFT active matrix substrate.

This amorphous-SiTFT active matrix substrate was used to produce a TFT-LCD system flat display. This TFT-LCD system flat display was able to supply half-tone display (gray-scale display) without any problem, and exhibited a favorable performance.

In the above-mentioned examples, the sputtering target produced Example 2-4 was used. It was proved that the use of the sputtering targets produced in Examples 2-1 to 2-3 and 2-5 to 2-8 other than Example 2-4 gave preferred results and the resultants were able to be satisfactorily used as transparent electrode. The specific resistances of the transparent electroconductive films in the case that the sputtering targets in the examples other than Examples 2-4 were used are shown in Table 3.

SECOND GROUP COMPARATIVE EXAMPLES

Comparative examples of the second group will be described hereinafter. In each of the comparative examples, sputtering targets each having one out of compositions shown in Table 3 were produced and evaluated in the same manner as in Example 2-9.

Comparative Example 2-1

In$_2$O$_3$ powder having an average particle diameter of 1 μm or less and SnO$_2$ powder having an average particle diameter of 1 μm or less were used as starting powders to produce a sputtering target in the same way as in Examples 2-1 to 2-8.

The composition ratio of Sn, which is one in the third metal group M3 to indium ([Sn]/[Sn]+[In]), was 0.10. This is shown in Table 3 also.

The average diameter of crystal grains of the indium oxide was 12.8 μm, as shown in Table 3. This average diameter was obtained by image processing. The calculated value of the relative density of the sintered oxide of the present comparative example was specifically 99%.

Contact Resistance with Al

In the present comparative example also, the contact resistances with Al instructures of "glass/Al/transparent electrode" and "glass/transparent electrode/Al" were measured. The results are shown in Table 3.

Specific Resistance of the Transparent Electrode

In the present comparative example also, a liquid crystal display was produced in the same way as in Example 10. In the process therefor, the specific resistance of the transparent electrode was measured. The measured result is also shown in Table 3.

Comparative Example 2-2

In$_2$O$_3$ powder having an average particle diameter of 1 μm or less and ZnO powder having an average particle diameter of 1 μm or less were used as starting powders to produce a sputtering target in the same way as in above Examples 2-1 to 2-8.

The composition ratio of Zn, which is one in the third metal group M3 to indium ([Zn]/[Zn]+[In]), was 0.16. This is also shown in Table 3 also.

The average diameter of crystal grains of the indium oxide was 3.8 μm, as shown in Table 3. This average diameter was obtained by image processing. The calculated value of the relative density of the sintered oxide of the present comparative example was specifically 98%.

Contact Resistance with Al

In the present comparative example also, the contact resistances with Al in both structures of "glass/Al/transparent electrode" and "glass/transparent electrode/Al" were measured. The results are shown in Table 3.

Specific Resistance of the Transparent Electrode

In the present comparative example also, a liquid crystal display was produced in the same way as in Example 2-10. In the process therefor, the specific resistance of the transparent electrode was measured. The measured result is also shown in Table 3.

Comparative Example 2-3

$In_2O_3$ powder having an average particle diameter of 1 μm or less, and $WO_3$ powder and $CeO_2$ powder each having an average particle diameter of 1 μm or less were used as starting powders to produce a sputtering target in the same way as in Examples 2-1 to 2-8.

The composition ratio of W, which is one in the first metal group M1 to indium ([W]/[W]+[In]), was 0.25. The composition ratio of Cen, which is one in the second metal group M2, to indium ([Ce]/[Ce+[In]) was 0.25. These are shown in Table 3 also.

The average diameter of crystal grains of the indium oxide was 15 μm, as shown in Table 3. This average diameter was obtained by image processing. The calculated value of the relative density of the sintered oxide of the present comparative example was specifically 84%.

Contact Resistance with Al

In the present comparative example also, the contact resistances with Al in both structures of "glass/Al/transparent electrode" and "glass/transparent electrode/Al" were measured. The results were each 1 MΩ or more, as shown in Table 3.

Specific Resistance of the Transparent Electrode

In the present comparative example also, a liquid crystal display was produced in the same way as in Example 2-10. In the process therefor, the specific resistance of the transparent electrode was measured. The measured result was 1 MΩcm or more, as shown in Table 3.

Comparative Example 2-4

$In_2O_3$ powder having an average particle diameter of 1 μm or less, and $WO_3$ powder, $CeO_2$ and $SnO_2$ powder each having an average particle diameter of 1 μm or less were used as starting powders to produce a sputtering target in the same way as in Examples 2-1 to 2-8.

The composition ratio of W, which is one in the first metal group M1 to indium ([W]/[W]+[In]), was 0.25. The composition ratio of Ce, which is one in the second metal group M2, to indium ([Ce]/[Ce+[In]) was 0.25. The composition ratio of Sn, which is one in the third metal group M3, to indium ([Sn]/[Sn+[In]) was 0.4. These are shown in Table 3 also.

The calculated value of the relative density of the sintered oxide of the present comparative example was specifically 60%, as shown in Table 3.

Contact Resistance with Al

In the present comparative example also, the contact resistances with Al in both structures of "glass/Al/transparent electrode" and "glass/transparent electrode/Al" were measured. The results were each 1 MΩ or more, as shown in Table 3.

Specific Resistance of the Transparent Electrode

In the present comparative example also, a liquid crystal display was produced in the same way as in Example 2-10. In the process therefor, the specific resistance of the transparent electrode was measured. The measured result was 1 MΩcm or more, as shown in Table 3.

Example 2-11 (Modified Example 2-1)

In the above-mentioned examples, examples wherein one or two or more oxides of W, Mo, Nb, Ni, Pt and/or Pd was/ were one or more constituents have been described; it is also preferred to use a metal itself, which is not any oxide, in the first metal group as it is. The same effects and advantages as in each of the examples can be obtained.

Example 2-12 (Modified Example 2-2)

In above Examples 2-9 and 2-10, examples where Al was used have been described; it is also preferred to use Ag instead of Al. In the case of using Ag, the same effects and advantages as in the case of Al can be obtained.

Conclusion

The above has described Examples 2-1 to 2-12, which are preferred examples of the invention, and Comparative Examples 2-1 to 2-4.

When the transparent electroconductive film according to the present embodiment of the second group is used as a transparent electrode or pixel electrode in this way, contact resistances between the Al gate electrode and the transparent electrode and between the Al source/drain electrode and the pixel electrode can be controlled into small values. As a result, when this transparent electrode or pixel electrode is used, a liquid crystal display capable of displaying halftone images satisfactorily can be obtained.

THIRD GROUP: EXAMPLES

Preferred embodiments of the invention of the third group will be described hereinafter on the basis of the drawings.

Example 3-1

FIGS. 6 to 8 is an explanatory sectional view illustrating a producing process of a TFT array substrate 2100 (a TFT section and a terminal section) in present Example 3-1. In these FIGS. 6 to 8, reference number 2001 represents a transparent insulating substrate; 2002, a gate electrode; 2004, a gate insulation film; 2005, a semiconductor layer a-Si film; 2006, a semiconductor layer $n^+$ a-Si film; 2007a, a drain electrode; 2007b, a source electrode; 2009, an interlayer insulation film; 2010, a contact hole; 2011, a pixel electrode; 2021, the TFT section; 2022, the terminal section; and 2100, the TFT array substrate.

The pixel electrode 2002, the drain electrode 2007a and the source electrode 2007b each correspond to one example of the first conductor described in the claims, and the pixel electrode 2011 corresponds to one example of the second conductor described in the claims.

The TFT section 2021 is formed near a crossing portion of a gate wiring and a source wiring which are formed on the TFT array substrate 2100 to be orthogonal to each other, and functions as a switching element for driving liquid crystal. On the other hand, the terminal section 2022 is electrically connected to the TFT section 2021 through the gate wiring. The terminal section 2022 is arranged outside a display area and has a function of inputting signals from the outside into the pixel electrode.

Figure 6A:
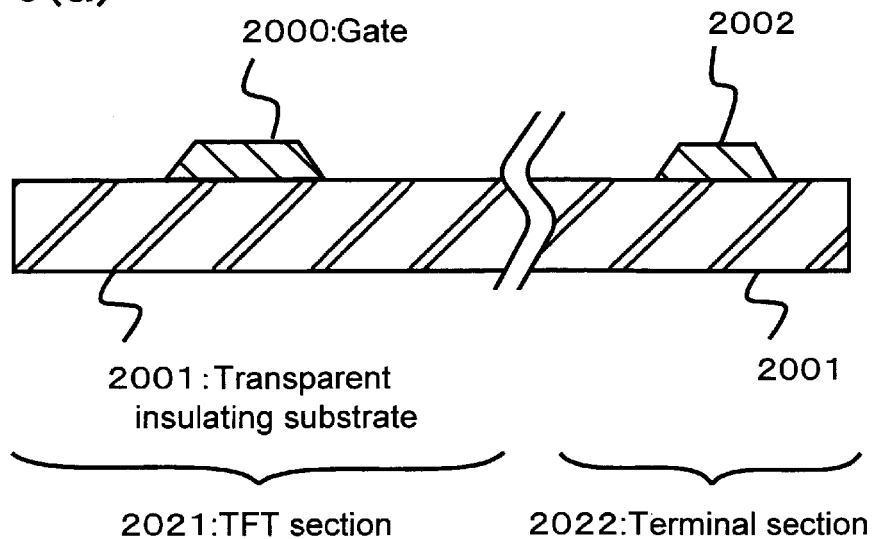
[FIG. 6] These (FIG. 6 (a) and FIG. 6 (b)) are explanatory sectional views illustrating the step of producing a TFT array substrate in present Examples.

On the basis of FIGS. 6 to 8, the following will describe a process for producing the TFT array substrate 2100 of present Example 3-1 successively. First, a thin film made of an Al alloy containing 1.2% by weight of W, which is a material of the first conductor, was formed on the transparent insulating substrate 200 in an atmosphere of pure Ar to have a thickness of about 2000 Å. This film corresponds to one example of the Al layer described in the claims. This thin film was subjected to resist-patterning by photolithography, and then etched with an etching solution based on phosphoric acid, nitric acid and acetic acid as illustrated in FIG. 6(a) to form a gate wiring (not illustrated) and the gate electrode 2002.

When the gate electrode 2002, and the drain electrode 2007*a* and source electrode 2007*b*, which will be described later, were each formed into a film form by sputtering in present Example 3-1, it is needless to state that a sputtering target made of the Al alloy containing W was used as a sputtering target. The action of forming the gate electrode 2002 and so on in this way corresponds to the first conductor forming step described in the claims.

Figure 6B:
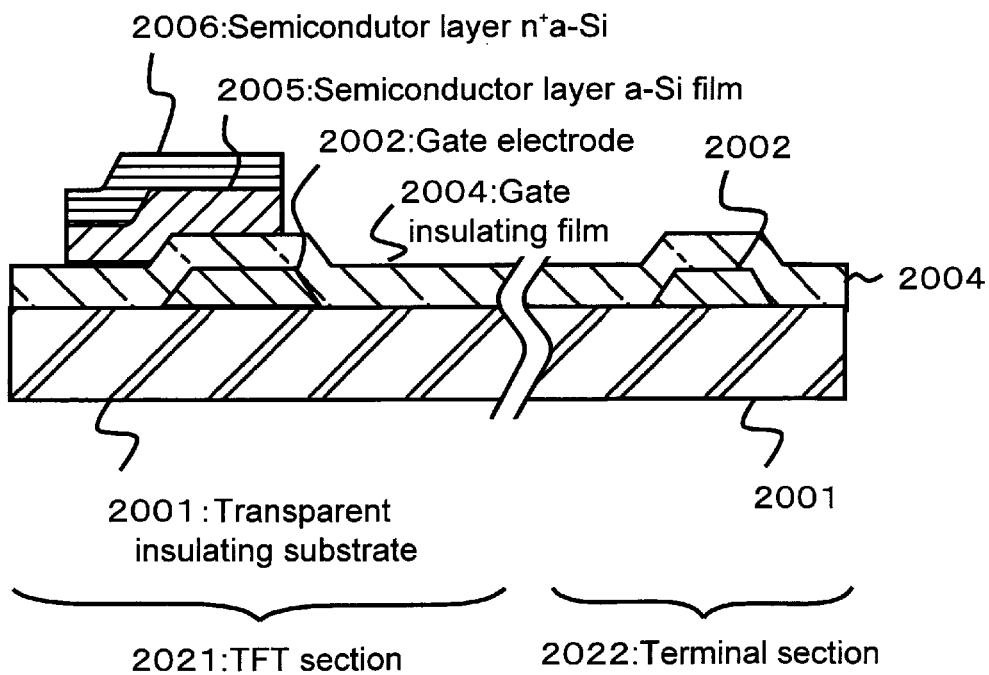

Next, the gate insulation film 2004 made of silicon nitride (SiNx) or silicon oxide (SiO$_2$) was formed into a thickness of about 4000 Å by chemical vapor deposition (hereinafter, referred to as CVD), so as to cover the whole of the transparent insulating substrate 2001. The semiconductor layer a-Si film 2005 was formed thereon, and further the semiconductor layer n$^+$ a-Si film 2006 was formed thereon. As illustrated in FIG. 6(b), the semiconductor layer a-Si film 2005 and the semiconductor layer n$^+$ a-Si film 2006 were patterned to form the semiconductor layer a-Si film 2005 having a thickness of about 1500 Å and the semiconductor layer n$^+$ a-Si film 2006 having a low resistance and a thickness of about 300 Å successively.

Figure 7A:
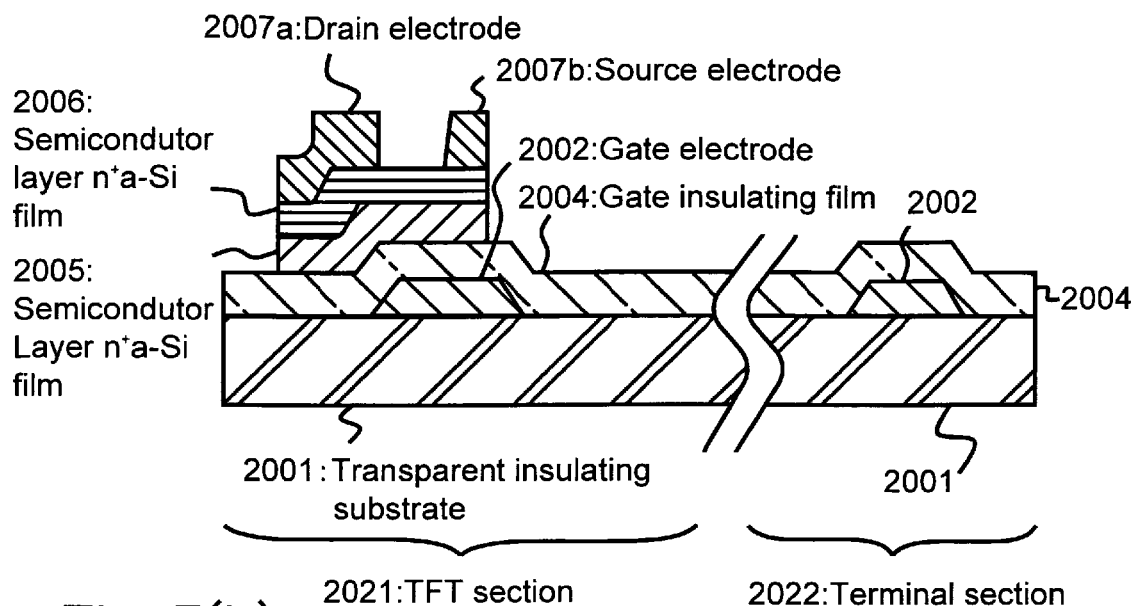
[FIG. 7] These (FIG. 7 (a) and FIG. 7 (b)) are different explanatory sectional views illustrating the step of producing the TFT array substrate in present Examples.

Next, a thick film made of an Al alloy containing 1.2% by weight of W was formed into a thickness of 3000 Å by sputtering, so as to have cover the semiconductor layer n$^+$ a-Si film 2006 (Table 4). This thin film corresponds to one example of the Al layer described in the claims. As illustrated in FIG. 7(a), this thin film was patterned in the same manner as the gate electrode 2002, so as to form the drain electrode 2007*a* and the source electrode 2007*b*. In this case, it is preferred to use Ar gas as the sputtering gas. The action of forming the drain electrode 2007*a* and the drain electrode 2007*b* in this way corresponds to one example of the first conductor forming step described in the claims.

The specific resistances of the pixel electrode 2002, the drain electrode 2007*a* and the source electrode 2007*b* were measured. The values thereof were each 5.2 μΩcm (Table 4).

Figure 7B:
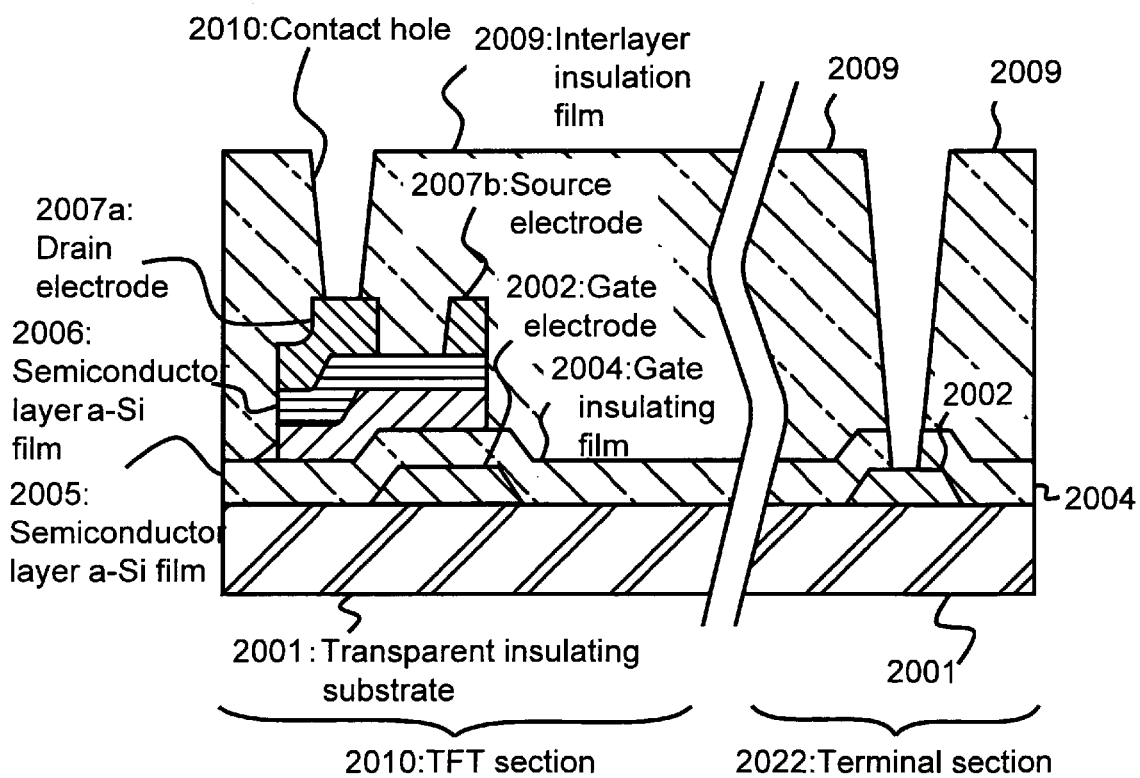

Next, the interlayer insulation film 2009 was formed to cover the whole of the transparent insulating substrate 2001. This interlayer insulation film 2009 corresponds to one example of the insulation film described in the claims. The action of forming the interlayer insulation film 2009 in this way corresponds to one example of the insulation film forming step described in the claims. Thereafter, this interlayer insulation film 2009 was patterned as illustrated in FIG. 7(b), so as to make the contact holes 2010. That is, as illustrated in FIG. 7(b), the contact holes 2010 were made in the interlayer insulation film 2009 and over the gate electrode 2002 in the terminal section 22 and the drain electrode 2007*b* in the TFT section 21. The action of making the contact holes 2010 in the interlayer insulation film 2009 corresponds to the contact hole making step described in the claims.

It is preferred that the interlayer insulation film 2009 is made of any one or both of a silicon nitride film and an acrylic transparent resin.

Furthermore, an ITO film was formed as a transparent electroconductive film into a thickness of about 1000 Å on the interlayer insulation film 2009 by sputtering (Table 4). As illustrated in FIG. 8, this ITO film was patterned to form the pixel electrode 2011. In this way, the TFT array substrate 2100 was produced. At this time, the pixel electrode 2011 was electrically connected to each of the gate electrode 2002, the drain electrode 2007*a* and the source electrode 2007*b* through the contact holes 2010 made in the interlayer insulation film 2009. The action of forming the pixel electrode 2011 to be electrically connected to each of the gate electrode 2002, the drain electrode 2007*a* and the source electrode 2007*b* through the contact holes 2010 in this way corresponds to one example of the electrode connecting step described in the claims.

The transparent electroconductive film made of the ITO film is substantially the same as the transparent film electrode described in the claims. In the claims, attention is paid to the function of the film, and thus the transparent film electrode is called. On the other hand, in the example, attention is paid to the nature of the film, and thus the transparent electroconductive film is called.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007*a* or the source electrode 2007*b*. The value was 420Ω. These values are shown in Table 4.

Example 3-2

Films were formed and patterned in the same way as in above Example 3-1 except that the gate electrode 2002, the drain electrode 2007*a* and the source electrode 2007*b* in above Example 3-1 were each made of an Al alloy containing 2.5% by weight of Mo instead of the Al alloy containing 1.2% by weight of W, so as to form the gate electrode 2002, the drain electrode 2007*a*, the source electrode 2007*b* and the others over the transparent insulating substrate 2001, as illustrated in FIG. 7(a). About the formed gate electrode 2002, drain electrode 2007*a* and source electrode 2007*b*, the specific resistance thereof was measured in the same way as in above Example 3-1. As a result, the value was 4.8 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007*a* or the source electrode 2007*b*. The value was 380Ω. These values are shown in Table 4.

Example 3-3

Films were formed and patterned in the same way as in above Example 3-1 except that the gate electrode 2002, the drain electrode 2007*a* and the source electrode 2007*b* in above Example 3-1 were each made of an Al alloy containing 1.4% by weight of La instead of the Al alloy containing 1.2% by weight of W, so as to form the gate electrode 2002, the drain electrode 2007*a*, the source electrode 2007*b* and the others over the transparent insulating substrate 2001, as illustrated in FIG. 7(a). About the formed gate electrode 2002, drain electrode 2007*a* and source electrode 2007*b*, the specific resistance thereof was measured in the same way as in above Example 3-1. As a result, the value was 5.3 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 430Ω. These values are shown in Table 4.

Example 3-4

Films were formed and patterned in the same way as in above Example 3-1 except that the gate electrode 2002, the drain electrode 2007a and the source electrode 2007b in above Example 3-1 were each made of an Al alloy containing 1.2% by weight of Nb instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 6.4 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of IZO was formed on the interlayer insulation film 2009, thereby producing the TFT array substrate 2100.

About the resultant TFT array substrate 2100, the specific resistance of the pixel electrode 2011 was measured. As a result, the value was 360 μΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 560Ω. These values are shown in Table 4.

Example 3-5

Films were formed and patterned in the same way as in above Example 3-1 except that the gate electrode 2002, the drain electrode 2007a and the source electrode 2007b in above Example 3-1 were each made of an Al alloy containing 1.1% by weight of Fe instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 5.4 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 520Ω. These values are shown in Table 4.

Example 3-6

Films were formed and patterned in the same way as in above Example 3-1 except that the gate electrode 2002, the drain electrode 2007a and the source electrode 2007b in above Example 3-1 were each made of an Al alloy containing 0.8% by weight of Pd instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 4.8 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 620Ω. These values are shown in Table 4.

Example 3-7

Films were formed and patterned in the same way as in above Example 3-1 except that the gate electrode 2002, the drain electrode 2007a and the source electrode 2007b in above Example 3-1 were each made of an Al alloy containing 0.7% by weight of Pt instead of the Al alloy containing 1.2% by weight of W. so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 5.6 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 580Ω. These values are shown in Table 4.

Example 3-8

Films were formed and patterned in the same way as in above Example 3-1 except that the gate electrode 2002, the drain electrode 2007a and the source electrode 2007b in above Example 3-1 were each made of an Al alloy containing 1.8% by weight of Ce instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 4.2 µΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of IZO was formed on the interlayer insulation film 2009, thereby producing the TFT array substrate 2100.

About the resultant TFT array substrate 2100, the specific resistance of the pixel electrode 2011 was measured. As a result, the value was 360 µΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 560Ω. These values are shown in Table 4.

Example 3-9

Films were formed and patterned in the same way as in above Example 3-1 except that the gate electrode 2002, the drain electrode 2007a and the source electrode 2007b in above Example 3-1 were each made of an Al alloy containing 1.3% by weight of Ho instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 4.4 µΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 µΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 440Ω. These values are shown in Table 4.

Example 3-10

Films were formed and patterned in the same way as in above Example 3-1 except that the gate electrode 2002, the drain electrode 2007a and the source electrode 2007b in above Example 3-1 were each made of an Al alloy containing 0.8% by weight of Er instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 7.2 µΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of IZO was formed on the interlayer insulation film 2009, thereby producing the TFT array substrate 2100.

About the resultant TFT array substrate 2100, the specific resistance of the pixel electrode 2011 was measured. As a result, the value was 360 µΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 640Ω. These values are shown in Table 4.

Example 3-11

Films were formed and patterned in the same way as in above Example 3-1 except that the gate electrode 2002, the drain electrode 2007a and the source electrode 2007b in above Example 3-1 were each made of an Al alloy containing 0.4% by weight of Ce and further containing 1.2% by weight of Mo instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 5.6 µΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of IZO was formed on the interlayer insulation film 2009, thereby producing the TFT array substrate 2100.

About the resultant TFT array substrate 2100, the specific resistance of the pixel electrode 2011 was measured. As a result, the value was 360 µΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 620Ω. These values are shown in Table 4.

Comparative Example 3-1

Films were formed and patterned in the same way as in above Example 3-1 except that the gate electrode 2002, the drain electrode 2007a and the source electrode 2007b in above Example 3-1 did not contain W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 2.1 µΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a Kelvin pattern was used to measure the electric resistance value (contact resistance value) in a contact surface portion between the pixel electrode 2011 and the gate electrode 2002, the drain electrode 2007a or the source electrode 2007b. The value was 1 MΩ or more. These values are shown in Table 4.

In the case that the pixel electrode 2002, the drain electrode 2007a and the source electrode 2007b neither contained, as their materials, one nor more metals selected from the metal group M1 consisted of W, Mo, La, Nb, Fe, Pd, Pt, Ce, Ho and Er, the electric resistance value (contact resistance value) in a contact surface portion between the pixel electrode 2011 and the gate electrode 2002, the drain electrode 2007a or the source electrode 2007b exhibited a high value.

Kelvin pattern was used to measure the electric resistance value (contact resistance value) in a contact surface portion between the pixel electrode 2011 and the gate electrode 2002, the drain electrode 2007a or the source electrode 2007b. The value was 1 MΩ or more. These values are shown in Table 4.

In the case that the pixel electrode 2002, the drain electrode 2007a and the source electrode 2007b neither contained, as their materials, one nor more metals selected from the metal group M1 consisted of W, Mo, La, Nb, Fe, Pd, Pt, Ce, Ho and Er, the electric resistance value (contact resistance value) in a contact surface portion between the pixel electrode 2011 and the gate electrode 2002, the drain electrode 2007a or the source electrode 2007b exhibited a high value.

TABLE 4

| | Added metal species | Addition amount wt % | Specific resistance of Al alloy μΩcm | Transparent electroconductive film | Specific resistance of transparent electroconductive film μΩcm | Contact resistance value Ω |
|---|---|---|---|---|---|---|
| Example 3-1 | W | 1.2 | 5.2 | ITO | 220 | 420 |
| Example 3-2 | Mo | 2.5 | 4.8 | ITO | 220 | 380 |
| Example 3-3 | La | 1.4 | 5.3 | ITO | 220 | 430 |
| Example 3-4 | Nb | 1.2 | 6.4 | IZO | 360 | 560 |
| Example 3-5 | Fe | 1.1 | 5.4 | ITO | 220 | 520 |
| Example 3-6 | Pd | 0.8 | 4.8 | ITO | 220 | 620 |
| Example 3-7 | Pt | 0.7 | 5.6 | ITO | 220 | 580 |
| Example 3-8 | Ce | 1.8 | 4.2 | IZO | 360 | 560 |
| Example 3-9 | Ho | 1.3 | 4.4 | ITO | 220 | 440 |
| Example 3-10 | Er | 0.8 | 7.2 | IZO | 360 | 640 |
| Example 3-11 | Ce, Mo | 0.4, 1.2 | 5.6 | IZO | 360 | 620 |
| Comparative Example 3-1 | — | — | 2.1 | ITO | 220 | 1M or more |
| Comparative Example 3-2 | Nd | 0.8 | 2.4 | ITO | 220 | 1M or more | group M1 consisted of W, Mo, La, Nb, Fe, Pd, Pt, Ce, Ho and Er, the electric resistance value (contact resistance value) in a contact surface portion between the pixel electrode 2011 and the gate electrode 2002, the drain electrode 2007a or the source electrode 2007b exhibited a high value, as described above.

Comparative Example 3-2

Films were formed and patterned in the same way as in above Example 3-1 except that the gate electrode 2002, the drain electrode 2007a and the source electrode 2007b in above Example 3-1 were each made of an Al alloy containing 0.8% by weight of Nd instead of the Al alloy containing 1.2% by weight of W, so as to form the gate electrode 2002, the drain electrode 2007a, the source electrode 2007b and the others over the transparent insulating substrate 2001, as illustrated in FIG. 7(a). About the formed gate electrode 2002, drain electrode 2007a and source electrode 2007b, the specific resistance thereof was measured in the same way as in above Example 3-1. As a result, the value was 2.4 μΩcm (Table 4).

As illustrated in FIG. 7(b), the interlayer insulation film 2009 and the contact holes 2010 were made in the same way as in above Example 3-1. Next, as illustrated in FIG. 8, the pixel electrode 2011 (Table 4) made of ITO was formed on the interlayer insulation film 2009, thereby producing the TFT array substrate 2100.

About the resultant TFT array substrate 2100, the specific resistance of the pixel electrode 2011 was measured. As a result, the value was 220 μΩcm. As illustrated in FIG. 9, a As is evident from Table 4, in the TFT array substrates 2100 in present Examples 3-1 to 3-11, their pixel electrode 2002, drain electrode 2007a and source electrode 2007b were each made of the Al alloy containing one or more metals selected from the metal group M1 consisted of W, Mo, La, Nb, Fe, Pd, Pt, Ce, Ho and Er. In the case that the electrodes 2002, 2007a and 2007b were each made of such a material, the electric resistance value (contact resistance value) of the contact surface portions between these electrodes 2002, 2007a and 2007b, and the pixel electrode 2011 was low and exhibited a favorable value. In particular, in the case that the gate electrode 2002, the drain electrode 2007a and the source electrode 2007b were each made of the Al alloy containing Mo, the contact resistance value became the lowest value, which was about 380Ω at 50 μm□.

Each of the TFT array substrates 2100 of present Examples 3-1 to 3-11 was thermally treated at 230° C. for 30 minutes, and then the contact resistance thereof was measured in the same way as in above-mentioned Example 3-1 to 3-11. The value was about 650Ω. Furthermore, the same TFT array substrates 2100 were each thermally treated at 300° C. for 60 minutes, and then the contact resistance thereof was measured in the same way as in above-mentioned Example 3-1 to 3-11. The value was about 900Ω. It was proved that the TFT array substrates 2100 of present Examples 3-1 to 3-11 had a far lower contact resistance and a better heat resistance than conventional TFT array substrates (contact resistance: 1×E8 to 1×E12Ω).

Each of the values in Table 4 was a value which was peculiarly optimized by means of the measured devices, and thus it is not limited to the value.

In order to obtain a favorable contact resistance in each of Examples, it is preferred that the content of the one or more metal (s) selected from the metal group M1 consisted of W, Mo, La, Nb, Fe, Pd, Pt, Ce, Ho and Er in the gate electrode 2002, the drain electrode 2007a and the source electrode 2007b is from 0.5 to 5% by weight.

In each of Examples, as the material of the gate electrode 2002, the drain electrode 2007a and the source electrode 2007b, there was used an Al alloy containing one or more metals the metal group M1 consisted of W, Mo, La, Nb, Fe, Pd, Pt, Ce, Ho and Er; it is also preferred to add the third metal to this Al alloy. The first metal is Al, and the second metal is the one or two or more metal(s) selected from the metal group M1.

The third metal added to the gate electrode 2002, the drain electrode 2007a and the source electrode 2007b is desirably Cu, Si or a rare earth element in order to restrain hillocks or improve the corrosion resistance. When any one of the metals is added, it is preferred to control the addition amount of the third metal to such an extent that the specific resistance of these electrodes 2002, 2007a and 2007b is not more than 10 μΩcm in order to make use of a characteristic that the electric resistance of Al is low.

In the case that the gate electrode 2002, the drain electrode 2007a and the source electrode 2007b is made of an Al alloy consisting only of one or more metals selected from the metal group M1 consisted of W, Mo, La, Nb, Fe, Pd, Pt, Ce, Ho and Er, effects of restraining hillocks or improving the corrosion resistance can be obtained in the same manner as in the case of adding the third metal. Therefore, in particular, in the case of adding none of the third metal, the generation of hillocks or the corrosion can be restrained as well.

In above Examples 3-1 to 3-11, examples wherein the pixel electrode 2011 is made of ITO or IZO has been described. However, the technical scope of the invention is not limited thereto. In the case that the pixel electrode 2011 is a transparent electroconductive film made mainly of any one of $In_2O_3$, $SnO_2$, $ZnO_2$ and so on, the same effects and advantages can be produced.

In above Examples 3-1 to 3-11, examples wherein the pixel electrode 2011 was connected directly to the gate electrode 2002 and the drain electrode 2007a have been described; of course, it is preferred that this second electrode is connected to wirings of the above-mentioned Al alloy. It is also preferred that the TFT array substrate 2100 of the example has, on its semiconductor layer n+ a-Si film 2006, a channel layer.

Example 3-12

About each of the TFT array substrates 2100 produced in above Examples 3-1 to 3-11, a counter substrate having a counter electrode, a color filter and others was stuck thereto. Furthermore, a liquid crystal material was injected into the space between the TFT substrate 2100 and the counter substrate to sandwich this liquid crystal material, thereby forming a liquid crystal layer. In this way, a TFT array active matrix-based liquid crystal display (denoted as a TFT-LCD device) was obtained.

According to present Example 3-12, one or more metals selected from the metal group M1 consisted of W, Mo, La, Nb, Fe, Pd, Pt, Ce, Ho and Er were used as the raw material for wirings of the TFT array substrate 2100, the gate electrode 2002, the drain electrode 2007a and the source electrode 2007b. For this reason, these electrodes, and so on each had a low resistance. The pixel electrode 2011 made of the IZO film (or the ITO film) had a structure connected directly to the gate electrode 2002, the drain electrode 2007a and the source electrode 2007b made mainly of Al without forming any metal layer made mainly of a component other than Al, that is, any metal layer having a high specific resistance. Therefore, each of the liquid crystal displays of present Examples 3-12 had a high numerical aperture and a high performance. Since the gate electrode 2002, the drain electrode 2007a and the source electrode 2007b were excellent in etchability, they had better productivity and were able to be produced at lower costs than those in the prior art.

FOURTH GROUP: EXAMPLES

Preferred embodiments of the invention of the fourth group will be described hereinafter on the basis of the drawings.

In the present embodiment, production of sputtering targets which are each necessary for forming a transparent electroconductive film in a TFT array substrate used in a liquid crystal display will firstly be described in the following item A. (Examples 4-1 to 4-7). In this item A., examples wherein W and Mo in the first group M1 were used will be described. In item B., comparative examples will be described. In item C., the measured result of the contact resistance between each transparent electroconductive film and Al will be shown. In item D., production of a TFT array substrate will be described. In item E., the other metals in first group M1, that is, Ni, Nb, Fe, Pt, Pd and lanthanoids will be described (Examples 4-10 to 4-23).

A. Formation Of Sputtering Targets

Example 4-1

$In_2O_3$ powder having an average particle diameter of 1 μm or less and $WO_3$ powder having an average particle diameter of 1 μm or less were formulated to set the atom number ratio of tungsten/indium to 0.003, and put into a pot made of resin. Furthermore, pure water was added thereto. They were mixed with a wet ball mill using hard $ZrO_2$ ball mill. The time for the mixing was set to 20 hours. The resultant mixed slurry was taken out, filtrated, dried and granulated. The resultant granulated product was molded by cold isostatic press under a pressure of 294 MPa (8 t/cm²).

Next, this molded product was sintered as follows. First, in a sintering furnace, the product was sintered at 1500° C. in an atmosphere wherein oxygen was introduced at a rate of 5 L/min. per 0.1 m³ of the volume inside the furnace for 5 hours. At this time, the temperature was raised at 1° C./min. up to 1000° C., and at 3° C./min. from 1000 to 1500° C. Thereafter, the introduction of oxygen was stopped, and the temperature was lowered at 10° C./min. from 1500 to 1300° C. The temperature of 1300° C. was then kept in an atmosphere wherein argon gas was introduced at a rate of 10 L/min. per 0.1 m³ of the volume inside the furnace for 3 hours. The product was naturally cooled, thereby obtaining an $In_2O_3$ sintered body containing tungsten and having a relative density of 90% or more.

A sputtering surface of the sintered body was polished with a cup grindstone and worked into a diameter of 100 mm and a thickness of 5 mm. This was stuck to a backing plate by use of an indium-based alloy to obtain a sintered body target 4-1. The theoretical density in this case was calculated out from fractions by weight of $In_2O_3$ crystal (bixbite-based structure) having no oxygen defects, and W oxide. The relative density was calculated out from the theoretical density (Table 5). The content of W in the sintered body was quantitatively analyzed by ICP emission analysis. As a result, it was ascertained that the charge composition at the time of mixing the starting powders was maintained. A specific value of the ascertained atomic composition ratio is shown in Table 5.

It is preferred that tungsten is dispersed, in particular, tungsten undergoes substitution/solid-solution into indium sites of indium oxide. That is, the form that tungsten is contained in the target may be a form that tungsten is dispersed as a tungsten oxide such as $WO_3$ or $WO_2$ in the indium oxide sintered body, or may be a form that tungsten is dispersed as a complex oxide between indium oxide and tungsten oxide such as $In_2W_3O_{12}$ in the indium oxide sintered body. By dispersing in this way, the average diameter of the crystal grains was made into 4.8 µm. This average diameter was obtained by image processing.

Preferred is a form that tungsten atoms undergo substitution/solid-solution into indium sites of indium oxide, whereby tungsten is dispersed into the indium oxide sintered body at an atomic level. By the atomic level dispersion, electric discharge is made stable during sputtering processing. Thus, the atomic level dispersion is an effective method for lowering the resistance of the resultant transparent electroconductive thin film. This transparent electroconductive thin film corresponds to one example of the electroconductive oxide in the claims.

In the present patent, M1 means the group consisted of W, Mo, Ni, Nb, Fe, Pt, Pd, and lanthanoids (the group being called the first group). In particular, in the following table, M1 represents any one of W, Mo, Ni, Nb, Fe, Pt, Pd, and lanthanoids. [M1] represents the number of the atoms of W, Mo, Ni, Nb, Fe, Pt, Pd, or a lanthanoid. [In] represents the number of the atoms of In. Thus, [M1]/([In]+[M1]) in Table 5 represents the atomic composition ratio of any one of the metals in the first group.

L/min. per 0.1 $m^3$ of the volume inside the furnace. At the same time, the molded body was sintered at 1500° C. for 5 hours. At this time, the temperature was raised at 1° C./min. up to 1000° C., and at 3° C./min. from 1000 to 1500° C. After the end of the sintering, the introduction of oxygen was stopped, and the temperature was lowered at 10° C./min. from 1500 to 1300° C. The temperature of 1300° C. was then kept for 3 hours while Ar was introduced into the furnace at a rate of 10 L/min. per 0.1 $m^3$ of the volume inside the furnace. Thereafter, the product was naturally cooled, thereby obtaining a sintered body 4-2 containing Mo and having a density of 90% or more. The theoretical density in this case was calculated out from fractions by weight of $In_2O_3$ crystal (bixbite-based structure) having no oxygen defects, and Mo oxide. The relative density was calculated out from the theoretical density (Table 5). The content of Mo in the sintered body was quantitatively analyzed by ICP emission analysis. As a result, it was ascertained that the charge composition at the time of mixing the starting powders was maintained. A specific value of the ascertained atomic composition ratio is shown in Table 5. Next, a sputtering surface of the sintered body was polished with a cup grindstone and worked into a diameter of 152 mm and a thickness of 5 mm.

The form that the molybdenum element is contained in the target may be a form that molybdenum is dispersed as a molybdenum oxide such as $MoO_3$ or $MoO_2$ in the indium oxide sintered body, or may be a form that molybdenum is dispersed as a complex oxide of indium and molybdenum, such as $InMo_4O_6$, $In_2Mo_3O_{12}$, or $In_{11}Mo_4O_{62}$, in the indium oxide sintered body.

TABLE 5

| Example | M1 | [M1]/ ([In] + [M1]) | M2 | [M2]/ ([In] + [M2]) | Relative density % | Average particle diameter mm | Transparent electrode specific resistance mΩ cm | Contact resistance with Al Ω Glass/Al/ transparent electrode | Glass/ transparent electrode/Al |
|---|---|---|---|---|---|---|---|---|---|
| 4-1 | W | 0.02 | — | — | 95 | 4.8 | 485 | 35.2 | 32.6 |
| 4-2 | Mo | 0.07 | — | — | 96 | 4.6 | 522 | 37.8 | 36.4 |
| 4-3 | W | 0.03 | Sn | 0.10 | 97 | 4.2 | 243 | 28.7 | 26.7 |
| 4-4 | Mo | 0.05 | Sn | 0.10 | 97 | 4.5 | 263 | 29.8 | 27.6 |
| 4-5 | W | 0.02 | Zn | 0.17 | 96 | 4.2 | 382 | 32.5 | 30.4 |
| 4-6 | W | 0.05 | Ge | 0.03 | 96 | 4.8 | 428 | 33.6 | 31.7 |
| 4-7 | W | 0.05 | Ga | 0.02 | 96 | 4.6 | 467 | 34.9 | 32.9 |
| Comparative Example 4-1 | — | — | Sn | 0.10 | 99 | 12.8 | 185 | 84.7 | 29.4 |
| Comparative Example 4-2 | — | — | Zn | 0.16 | 98 | 3.8 | 295 | 88.5 | 35.4 |

Example 4-2

In present Example 4-2, $In_2O_3$ powder having an average particle diameter of 1 µm or less, and $MoO_3$ powder having an average particle diameter of 1 µm or less were used as starting powders. The $In_2O_3$ powder, and the $MoO_3$ powder were put at a given ratio into a pot made of resin, and mixed with a wet ball mill. At this time, hard $ZrO_2$ balls were used, and the time for the mixing was set to 20 hours. The resultant mixed slurry was taken out, filtrated, dried and granulated. The granulated product was filled into a circular mold, and was molded into a disk shape by cold isostatic press under a pressure of 3 ton/$cm^2$.

Next, this molded product was put into an atmosphere-adjusting furnace, and then sintered. At the time of the sintering, oxygen was introduced into the furnace at a rate of 5

Preferred is a form that molybdenum atoms undergo substitution/solid-solution into indium sites of indium oxide, whereby molybdenum is dispersed into the indium oxide sintered body at an atomic level. In this case, electric discharge is stable in sputtering, and thus the case is effective for obtaining a low-resistance film. This low-resistance film corresponds to one example of the electroconductive oxide in the claims.

By dispersing in this way, the average diameter of the crystal grains was made into 4.6 µm. This diameter was obtained by image processing.

Example 4-3

In present Example 4-3, $In_2O_3$ powder, $SnO_2$ powder, and $WO_3$ powder each having an average particle diameter of 1

µm or less were used as starting powders of a sputtering target. First, the In$_2$O$_3$ powder, SnO$_2$ powder, and WO$_3$ powder were weighed into given amounts, and the weighed powders were mixed, put into a pot made of resin, and mixed with a wet ball mill using water as a medium. At this time, hard ZrO$_2$ balls were used, and the time for the mixing was set to 20 hours. Thereafter, the resultant mixed slurry was taken out, filtrated, dried and granulated. The thus-obtained granulated product was put into a mold, and was molded into a given form by cold isostatic press under a pressure of 3 ton/cm$^2$, thereby obtaining molded products.

Next, the resultant molded products were each sintered through the following steps. Oxygen was caused to flow into a sintering furnace at a rate of 5 L/min. per 0.1 m$^3$ of the volume inside the furnace, and the temperature of 1500° C. was kept for 5 hours. At this time, the temperature was raised at 1° C./min. up to 1000° C., and at 3° C./min. from 1000 to 1500° C. Thereafter, the inflow of oxygen was stopped, and the temperature was lowered at 10° C./min. from 1500 to 1300° C. Thereafter, Ar was caused to flow into the furnace at a rate of 10 L/min. per 0.1 m$^3$ of the volume inside the furnace, and the temperature of 1300° C. was then kept for 3 hours. Thereafter, the product was naturally cooled. The density of the resultant sintered body was measured in accordance with Archimedes' method using water. The relative density thereof was calculated from the theoretical density thereof (see Table 5). The theoretical density in this case was calculated out from fractions by weight of In$_2$O$_3$ crystal (bixbite-based structure) having no oxygen defects, Sn oxide, and W oxide. The contents of Sn and W in the sintered body were quantitatively analyzed by ICP emission analysis. As a result, it was ascertained that the charge composition at the time of mixing the starting powders was maintained. A specific value of the ascertained atomic composition ratio is shown in Table 5.

Next, a sputtering surface of each of the resultant sintered bodies was polished with a cup grindstone and worked into a diameter of 152 mm and a thickness of 5 mm, thereby obtaining a sintered body target for a transparent electroconductive thin film. An In-based alloy was used to stick this target to a backing plate to make a target 4-3 for sputtering.

The form that tin, and tungsten are incorporated into the target may be a form that they are dispersed as a tin oxide (SnO, SnO$_2$ or Sn$_3$O$_4$), and a tungsten oxide (WO$_3$, WO$_2$ or W$_2$O$_7$), or may be a form that they are dispersed as complex oxides between indium oxide and tin oxide, and between indium oxide and tungsten oxide. However, preferred is a form that tin and tungsten atoms undergo substitution/solid-solution into indium sites of indium oxide, whereby they are dispersed into the indium oxide sintered body at an atomic level. This is because electric discharge is made stable in sputtering and a homogeneous film low in resistance is obtained according to this form. This low-resistance film corresponds to one example of the electroconductive oxide in the claims.

By dispersing in this way, the average diameter of the crystal grains was made into 4.2 µm. This diameter was obtained by image processing.

In the present patent, M2 means the group consisted of Sn, Zn, Ge and Ga (the group being called the second group). In particular, in Table 5, M2 is used as a symbol representing any one of Sn, Zn, Ge and Ga. [M2] represents the number of the atoms of any one of Sn, Zn, Ge and Ga. [In] represents the number of the atoms of In. Thus, [M2]/([In]+[M2]) in Table 5 represents the atomic composition ratio of any one of the metals in the second group.

Example 4-4

In present Example 4-4, In$_2$O$_3$ powder, SnO$_2$ powder, and MoO$_3$ powder each having an average particle diameter of 1 µm or less were used as starting powders of a sputtering target. First, the In$_2$O$_3$ powder, SnO$_2$ powder, and MoO$_3$ powder were weighed into given amounts, and the weighed powders were mixed, put into a pot made of resin, and mixed with a wet ball mill using water as a medium. At this time, hard ZrO$_2$ balls were used, and the time for the mixing was set to 20 hours. Thereafter, the mixed slurry was taken out, filtrated, dried and granulated. The resultant granulated product was put into a mold, and was molded into a given form by cold isostatic press under a pressure of 3 ton/cm$^2$, thereby obtaining molded products.

Next, the resultant molded products were each sintered through the following steps.

First, oxygen was caused to flow into a sintering furnace at a rate of 5 L/min. per 0.1 m$^3$ of the volume inside the furnace, and the temperature of 1500° C. was kept for 5 hours. At this time, the temperature was raised at 1° C./min. up to 1000° C., and at 3° C./min. from 1000 to 1500° C. Thereafter, the inflow of oxygen was stopped, and the temperature was lowered at 10° C./min. from 1500 to 1300° C. Thereafter, Ar was caused to flow into the furnace at a rate of 10 L/min. per 0.1 m$^3$ of the volume inside the furnace, and the temperature of 1800° C. was then kept for 3 hours. Thereafter, the product was naturally cooled. The density of the resultant sintered body was measured in accordance with Archimedes' method using water. The relative density thereof was calculated from the theoretical density thereof (see Table 5). The theoretical density in this case was calculated out from fractions by weight of In$_2$O$_3$ crystal (bixbite-based structure) having no oxygen defects, Sn oxide, and Mo oxide. The contents of Sn and Mo in the sintered body were quantitatively analyzed by ICP emission analysis. As a result, it was ascertained that the charge composition at the time of mixing the starting powders was maintained. A specific value of the ascertained atomic composition ratio is shown in Table 5.

Next, a sputtering surface of each of the resultant sintered bodies was polished with a cup grindstone and worked into a diameter of 152 mm and a thickness of 5 mm, thereby obtaining a sintered body target for a transparent electroconductive thin film. An In-based alloy was used to stick this target to a backing plate to make a target for sputtering.

The form that tin and molybdenum are incorporated into the target may be a form that they are dispersed as a tin oxide (SnO, SnO$_2$ or Sn$_3$O$_4$), and a molybdenum oxide (MoO$_3$, MoO$_2$ or Mo2O7), or may be a form that they are dispersed as complex oxides between indium oxide and tin oxide, and between indium oxide and molybdenum oxide. Preferred is a form that tin and molybdenum atoms undergo substitution/solid-solution into indium sites of indium oxide, whereby they are dispersed into the indium oxide sintered body at an atomic level since electric discharge is made stable in sputtering and a homogeneous film low in resistance is obtained. This low-resistance film corresponds to one example of the electroconductive oxide in the claims.

By dispersing in this way, the average diameter of the crystal grains was made into 4.5 µm. This diameter was obtained by image processing.

On the other hand, the process for producing the sintered body target of the invention is not particularly limited except that a mixture wherein indium oxide, tin oxide, and molybdenum oxide are mixed in given amounts is used. A known method is used to mix the three components, mold the mixture and sinter the molded product. Thereafter, the sintered body is shaped, whereby the sintered body target can be produced. Components other than the three components may be added to the sintered body target as long as the objects of the invention are not damaged.

Example 4-5

In present Example 4-5, $In_2O_3$ powder, $ZnO_2$ powder, and $WO_3$ powder each having an average particle diameter of 1 μm or less were used as starting powders of a sputtering target. First, the $In_2O_3$ powder, $ZnO_2$ powder, and $WO_3$ powder were weighed into given amounts, and the weighed powders were mixed, put into a pot made of resin, and mixed with a wet ball mill using water as a medium. At this time, hard $ZrO_2$ balls were used, and the time for the mixing was set to 20 hours. Thereafter, the resultant mixed slurry was taken out, filtrated, dried and granulated. The resultant granulated product was put into a mold, and was molded into a given form by cold isostatic press under a pressure of 3 ton/cm², thereby obtaining molded products. Next, the resultant molded products were each sintered through the following steps.

First, oxygen was caused to flow into a sintering furnace at a rate of 5 L/min. per 0.1 m³ of the volume inside the furnace, and the temperature of 1500° C. was kept for 5 hours. At this time, the temperature was raised at 1° C./min. up to 1000° C., and at 3° C./min. from 1000 to 1500° C. Thereafter, the inflow of oxygen was stopped, and the temperature was lowered at 10° C./min. from 1500 to 1300° C. Thereafter, Ar was caused to flow into the furnace at a rate of 10 L/min. per 0.1 m³ of the volume inside the furnace, and the temperature of 1300° C. was then kept for 3 hours. Thereafter, the product was naturally cooled.

The density of the resultant sintered body was measured in accordance with Archimedes' method using water. The relative density thereof was calculated from the theoretical density thereof (see Table 5). The theoretical density in this case was calculated out from fractions by weight of $In_2O_3$ crystal (bixbite-based structure) having no oxygen defects, Zn oxide, and W oxide. The contents of Zn and W in the sintered body were quantitatively analyzed by ICP emission analysis. As a result, it was ascertained that the charge composition at the time of mixing the starting powders was maintained. A specific value of the ascertained atomic composition ratio is shown in Table 5.

Next, a sputtering surface of each of the resultant sintered bodies was polished with a cup grindstone and worked into a diameter of 152 mm and a thickness of 5 mm, thereby obtaining a sintered body target for a transparent electroconductive thin film. An In-based alloy was used to stick this target to a backing plate to make a target 4-5 for sputtering.

The form that zinc and tungsten are incorporated into the target may be a form that they are dispersed as a zinc oxide (ZnO), and a tungsten oxide ($WO_3$, $WO_2$ or $W_2O_7$), or may be a form that they are dispersed as complex oxides between indium oxide and zinc oxide ($In_2Zn_2O_5$, $In_2Zn_3O_6$, $In_2Zn_5O_7$ or $In_2Zn_7O_9$), and between indium oxide and tungsten oxide. However, more preferred is a form that tungsten atoms undergo substitution/solid-solution into indium sites of indium oxide, whereby they are dispersed into the indium oxide sintered body at an atomic level since electric discharge is made stable in sputtering and a homogeneous film low in resistance is obtained. This low-resistance film corresponds to one example of the electroconductive oxide in the claims.

By dispersing in this way, the average diameter of the crystal grains was made into 4.2 μm. This diameter was obtained by image processing.

Example 4-6

In present Example 4-6, $In_2O_3$ powder having an average particle diameter of 1 μm or less and $GeO_2$ powder and $WO_3$ powder each having an average particle diameter of 1 μm or less were used as starting powders of a sputtering target. First, the $In_2O_3$ powder, $GeO_2$ powder, and $WO_3$ powder were formulated into a given ratio so as to give a sintered body having a composition of a Ge/In atomic ratio and a W/In atomic ratio shown in Table 5, and then the resultant was put into a pot made of resin and mixed with a wet ball mill. At this time, hard $ZrO_2$ balls were used, and the time for the mixing was set to 24 hours. After the mixing, the resultant slurry was taken out, filtrated, dried and granulated. The granulated product was molded by cold isostatic press under a pressure of 3 ton/cm².

Next, this molded product was sintered at 1300° C., in an atmosphere wherein oxygen was introduced into the air inside a sintering furnace at a rate of 5 liter/minute per 0.1 m³ of the volume inside the furnace, for 3 hours. At this time, the temperature was raised at 1° C./minute. When the product was cooled after the sintering, the introduction of oxygen was stopped. The temperature was then lowered to 1000° C. at 10° C./minute.

A cracked part of the resultant sintered body was crushed into pieces, and then powder X-ray diffraction measurement was carried out. As a result, only diffraction peaks resulting from an indium oxide phase having a bixbite-based structure and an $In_2Ge_2O_7$ phase having a thortveitite-based structure were observed. Accordingly, the resultant sintered body was judged as a sintered oxide having the characteristics of the invention. EPMA analysis of the fine structure of this sintered body demonstrated that germanium underwent solid solution into the indium oxide phase. By dispersing in this way, the average diameter of the crystal grains was made into 4.3 μm. This diameter was obtained by image processing. This sintered body was worked into a diameter of 101 mm and a thickness of 5 mm, and a sputtering surface thereof was polished with a cup grindstone, thereby producing a target. In particular, metallic indium was used to bond the target to a backing plate made of oxygen-free copper to make a sputtering target.

When germanium oxide particles are present in a sputtering target, the target is electrified with argon ions radiated from plasma since the specific resistance of the germanium oxide particles is high. As a result, arcing is caused. The tendency that this phenomenon is caused becomes more remarkable as the electric power applied to the target is made higher to make the amount of the radiated argon ions larger.

On the other hand, in the sputtering target according to the invention, the specific resistance of each of the indium oxide wherein germanium undergoes substitution/solid-solution into indium sites and the indium germanate compound is low (in other words, high-resistance particles are not present); thus, the arcing is not generated even if the applied power is increased. For this reason, according to the example, the electric energy of the applied electric power can be made large so that a film can be formed at a high speed.

The reason why the element of Ge is incorporated into the sintered oxide of the invention is that the electroconductivity is improved in the case of forming a film from such a target. Specifically, germanium of quadrivalence occupies sites of indium of quadrivalence in the indium oxide film, thereby discharging carrier electrons to increase the electroconductivity.

As described above, in the invention, the germanium element in the target is specified to set the atomic ratio of Ge/In into the range of 0.01 to 0.3 (inclusive). The reason therefor is that if the ratio is out of the range, the resistance value of the resultant thin film increases.

On the other hand, about tungsten also, it is preferred that tungsten is "dispersed", in particular, tungsten undergoes substitution/solid-solution into indium sites of indium oxide. That is to say, the form that tungsten is contained in the target may be a form that tungsten is dispersed as a tungsten oxide such as $WO_3$ or $WO_2$ in the indium oxide sintered body. The form may be a form that tungsten is dispersed as a complex oxide between indium oxide and tungsten oxide such as $In_2W_3O_{12}$ in the indium oxide sintered body. By dispersing in this way, the average diameter of the crystal grains was made into 4.8 μm. This diameter was obtained by image processing.

It is preferred that tungsten atoms undergo substitution/solid-solution into indium sites of indium oxide, whereby tungsten is dispersed into the indium oxide sintered body at an atomic level. The atomic-level dispersion is effective since the dispersion makes electric discharge in sputtering stable and makes the resistance of the resultant transparent electroconductive thin film low. This low-resistance film corresponds to one example of the electroconductive oxide in the claims.

Example 4-7

In present Example 4-7, $In_2O_3$ powder, $GeO_2$ powder and $WO_3$ powder were used as starting powders. These powders each had an average particle diameter of 1 μm or less.

First, the three powders, i.e., the $In_2O_3$ powder, $GeO_2$ powder and $WO_3$ powder were formulated into a given ratio so as to give a sintered body having a composition of a Ge/In atomic ratio and W/In shown in Table 5, and then the resultant was put into a pot made of resin and mixed with a wet ball mill. At this time, hard $ZrO_2$ balls were used, and the time for the mixing was set to 24 hours. After the mixing, the resultant slurry was taken out, filtrated, dried and granulated. The granulated product was molded by cold isostatic press under a pressure of 3 ton/$cm^2$.

Next, this molded product was sintered at 1300° C., in an atmosphere wherein oxygen was introduced into the air inside a sintering furnace at a rate of 5 liter/minute per 0.1 $m^3$ of the volume inside the furnace, for 3 hours. At this time, the temperature was raised at 1° C./minute. When the product was cooled after the sintering, the introduction of oxygen was stopped. The temperature was then lowered to 1000° C. at 10° C./minute.

A cracked part of the resultant sintered body was crushed into pieces, and then powder X-ray diffraction measurement was carried out. As a result, only a diffraction peak resulting from an indium oxide phase having a bixbite-based structure was observed. Accordingly, the resultant was judged as a sintered oxide having the characteristics of the invention. EPMA analysis of the fine structure of this sintered body demonstrated that gallium underwent solid solution into the indium oxide phase. By dispersing in this way, the average diameter of the crystal grains was made into 4.6 μm. This diameter was obtained by image processing. This sintered body was worked into a diameter of 101 mm and a thickness of 5 mm, and a sputtering surface thereof was polished with a cup grindstone, thereby producing a target. Metallic indium was used to bond this target to a backing plate made of oxygen-free copper.

When gallium oxide particles are present in a target, the target is generally electrified with argon ions radiated from plasma since the specific resistance of the gallium oxide particles is high. As a result, arcing is caused. This tendency becomes more remarkable as the electric power applied to the target is made higher to make the amount of the radiated argon ions larger.

On the other hand, in the above-mentioned target according to the invention, the specific resistance of each of the indium oxide wherein gallium undergoes substitution/solid-solution into indium sites and the indium gallate compound is low. In other words, high-resistance particles are not present; thus, the arcing is hardly generated even if the applied power is increased. For this reason, a film can be formed at a high speed by applying a high electric power.

It is preferred that tungsten is "dispersed", in particular, tungsten undergoes substitution/solid-solution into indium sites of indium oxide. That is to say, the form that tungsten is contained in the target may be a form that tungsten is dispersed as a tungsten oxide such as $WO_3$ or $WO_2$ in the indium oxide sintered body. The form may be a form that tungsten is dispersed as a complex oxide between indium oxide and tungsten oxide such as $In_2W_3O_{12}$ in the indium oxide sintered body. By dispersing in this way, the average diameter of the crystal grains was made into 4.8 μm. This diameter was obtained by image processing.

It is preferred that tungsten atoms undergo substitution/solid-solution into indium sites of indium oxide, whereby tungsten is dispersed into the indium oxide sintered body at an atomic level. The reason therefor is that the atomic-level dispersion is effective since the dispersion makes electric discharge in sputtering stable and makes the resistance of the resultant transparent electroconductive thin film low. This low-resistance film corresponds to one example of the electroconductive oxide in the claims.

B. Comparative Examples

Examples for comparison with above Examples 4-1 to 4-7 will be described hereinafter. The content of the comparative examples is also shown in Table 5.

Comparative Example 4-1

A sputtering target was produced in the same way as in above Example 4-3 except the following:

A different point from Example 4-3 was that $WO_3$ was not used as any raw material so that tungsten (W) was not contained in the sputtering target. The other matters were the same as in Example 4-3. The relative density of the produced sputtering target was 99%. The average particle diameter was 12.8 μm (Table 5). These measurements were performed in the same way as in Example 4-3.

Comparative Example 4-2

A sputtering target was produced in the same way as in above Example 4-5 except the following:

A different point from Example 4-5 was that $WO_3$ was not used as any raw material so that tungsten (W) was not contained in the sputtering target. Another different point was that the atomic composition ratio of Zn ([Zn]/[Zn]+[In]) was 0.16 wherein the [Zn] represents the number of the atoms of zinc and the [In] represents the number of the atoms of indium. The other matters were the same as in Example 4-5. The relative density of the produced sputtering target was 98%. The average particle diameter was 3.8 μm (Table 5). These measurements were performed in the same way as in Example 4-5.

C. Resistance of the Case of Adopting Each of the Transparent Electroconductive Films Example 4-8

Each of the sputtering targets obtained in above Examples 4-1 to 4-7 was fitted to a DC sputtering apparatus. A mask (a kapton tape) for first film-formation was fitted onto a slide glass, and Al was formed into a film of 200 nm thickness.

Thereafter, the mask was lifted off to form a given Al pattern. A mask (a kapton tape) for second film-formation was fitted thereto. Each of the sputtering targets was used to form a transparent electroconductive film (transparent electrode) of 200 nm thickness. The mask for film-formation was lifted off to obtain a given substrate for contact resistance measurement. This transparent electroconductive film corresponds to one example of the electroconductive oxide in the claims. Terminals were taken out from both ends of the substrate, and then the resistance of the "glass/Al/transparent electrode" was measured. The result is together shown in Table 5.

A substrate of "glass/transparent electrode/Al", for contact resistance measurement, was also obtained by forming the films in order of the transparent electrode and Al. Similarly, the measured result of the resistance of this substrate is together shown in Table 5.

About the sputtering targets obtained in above Comparative Examples 4-1 to 4-2 also, the same measurement was made. The results are also shown in Table 5.

As shown in Table 5 also, in the case of forming a film of a transparent electrode on Al, the surface of Al is oxidized to produce $Al_2O_3$. Thus, the resistance value generally becomes large. In other words, as shown in Table 5, in the electrodes containing none of W, Mo, Ni, Nb, Fe, Pt, Pd and lanthanoids (the comparative examples), the measured resistance value of the "glass/Al/transparent electrode" is large (see Comparative Examples 4-1 and 4-2 in Table 5). In light of this matter, a transparent electrode wherein the contact resistance can be made small can be provided by incorporating W, Mo, Ni, Nb, Fe, Pt, Pd and/or lanthanoids. Ni, Nb, Fe, Pt, Pd and lanthanoids will be detailed in Examples 4-10 to 4-22 below.

D. Production of a TFT Array Substrate

Example 4-9

An example wherein a TFT array substrate was produced on the basis of the invention will be described with reference to FIG. 10.

First, a metallic Al (99% Al and 1% Nd) is first deposited onto a light-transmissible glass substrate 3001 by high-frequency sputtering, so as to have a film thickness of 1500 Å. This is etched by photo-etching using a phosphoric acid-acetic acid-nitric acid-based aqueous solution as an etchant to form a gate electrode 3002 having a desired shape and a gate electrode wiring 3002a connected to the gate electrode 3002.

Next, a silicon nitride (SiN) film, for forming a gate insulation film 3003, is deposited thereon by glow discharge CVD, so as to have a film thickness of 3000 Å. Subsequently, an α-Si:H (i) film 3004 is deposited thereon to have a film thickness of 3500 Å, and further a silicon nitride (SiN) film, which will be a channel protective layer 3005, is deposited thereon to have a film thickness of 3000 Å. As the discharge gas at this time, a $SiH_4$—$NH_3$—$N_2$-based mixed gas is used when the SiN films, which will be the gate insulation film 3003 and the channel protective layer 3005 are formed. A $SiH_4$—$N_2$-based mixed gas is used when the α-Si:H (i) film 3004 is formed.

Next, this SiN film, which will be the channel protective layer 3005, is dry-etched using a CHF gas, so as to form the channel protective layer 3005 having a desired shape. A situation of this channel protective layer 3005 is illustrated in FIG. 10.

Subsequently, a $SiH_4$—$H_2$—$PH_3$-based mixed gas is used to deposit an α-Si:H (n) film 3006 into a film thickness of 3000 Å. Next, a Cr/Al bi-layered film is formed thereon by depositing Cr into a film thickness of 0.1 μm and Al into a film thickness of 0.3 μm successively by vacuum deposition or sputtering.

About this bi-layer, its Al and its Cr are etched by photo-etching with a $H_3PO_4$—$CH_3COOH$—$HNO_3$—$H_2O$-based etching solution and an aqueous solution of cerium (IV) ammonium nitrate, respectively. By the photo-etching, a desired pattern of the layer electrode 3007 and a desired pattern of the drain electrode 3008 are formed. Furthermore, the α-Si:H (i) film 3004 and the α-Si:H (n) film 3006 are etched by using a combination of dry etching using a CHF-based gas and wet etching using an aqueous hydrazine ($NH_2NH_2.H_2O$) solution, so as to form a desired pattern of the α-Si:H (i) film 3004 and a desired pattern of the α-Si:H (n) film 3006. Next, a transparent resin resist 3016 is used to form a protection film. In present Example 4-9, the bi-layered film of Cr and Al is used; it is also preferred that Mo, Ti or the like is used instead of Cr (see FIG. 10).

Thereafter, photo-etching is used to make contact holes 3012 between the source and drain electrodes 3007 and 3008 and a transparent electrode, that is, a pixel electrode (a pixel electrode pattern 3009), and so forth.

An amorphous transparent electroconductive film is deposited on this substrate, on which the patterns of the source electrode 3007 and the drain electrode 3008 made of the metallic Al are made, by sputtering using a sputtering target made mainly of indium oxide, zinc oxide, and tungsten oxide and obtained in Example 4-5. This amorphous transparent electroconductive film is also made mainly of indium oxide, zinc oxide and tungsten oxide. In this way, the pixel electrode pattern 3009 and so forth are formed. This pixel electrode pattern 3009 corresponds to one example of the "transparent electrode" in the claims. The amorphous transparent electroconductive film, which is a similar thereto but is a raw material thereof, corresponds to one example of the "electroconductive oxide" in the claims.

In a manner of using, as the discharge gas, pure argon gas or argon gas into which $O_2$ gas was incorporated in a trace amount of about 1% by volume, a transparent electrode film, which would become the pixel electrode pattern 3009 and so on later by etching, was deposited into a film thickness of 1200 Å. This $In_2O_3$—ZnO-$WO_3$ film was analyzed by a X-ray diffraction method. As a result, no peak was observed, and the film was an amorphous film. The specific resistance of this film was about $3.8 \times 10^{-4}$ Ωcm. Thus, the film was a film capable of being satisfactorily used as an electrode. This film was etched by photo-etching using a 3.5% by weight solution of oxalic acid in water as an etchant, in such a manner that the film would be electrically connected to at least the pattern of the source electrode 3007. In this way, the pixel electrode 3009, which was made of the desired amorphous electrode, was formed. At this time, the source electrode 3007 and the drain electrode 3008 of Al hardly eluted out by the etching solution. A gate-line-leading-out section 14 and a source/drain-line-leading-out section 3010 are also covered with the transparent electrode (see FIG. 10). In this way, a TFT array substrate is completed. This TFT array substrate corresponds to one example of the TFT substrate in the claims.

The 3.5% by weight solution of oxalic acid in water is used as the etchant herein. It is also preferred to use, as the etchant, an aqueous solution containing phosphoric acid/acetic acid/nitric acid, or an aqueous solution containing cerium ammonium nitrate. In the case of using these aqueous solutions, the same effects and advantages as in the case of oxalic acid are obtained.

Figure 10:
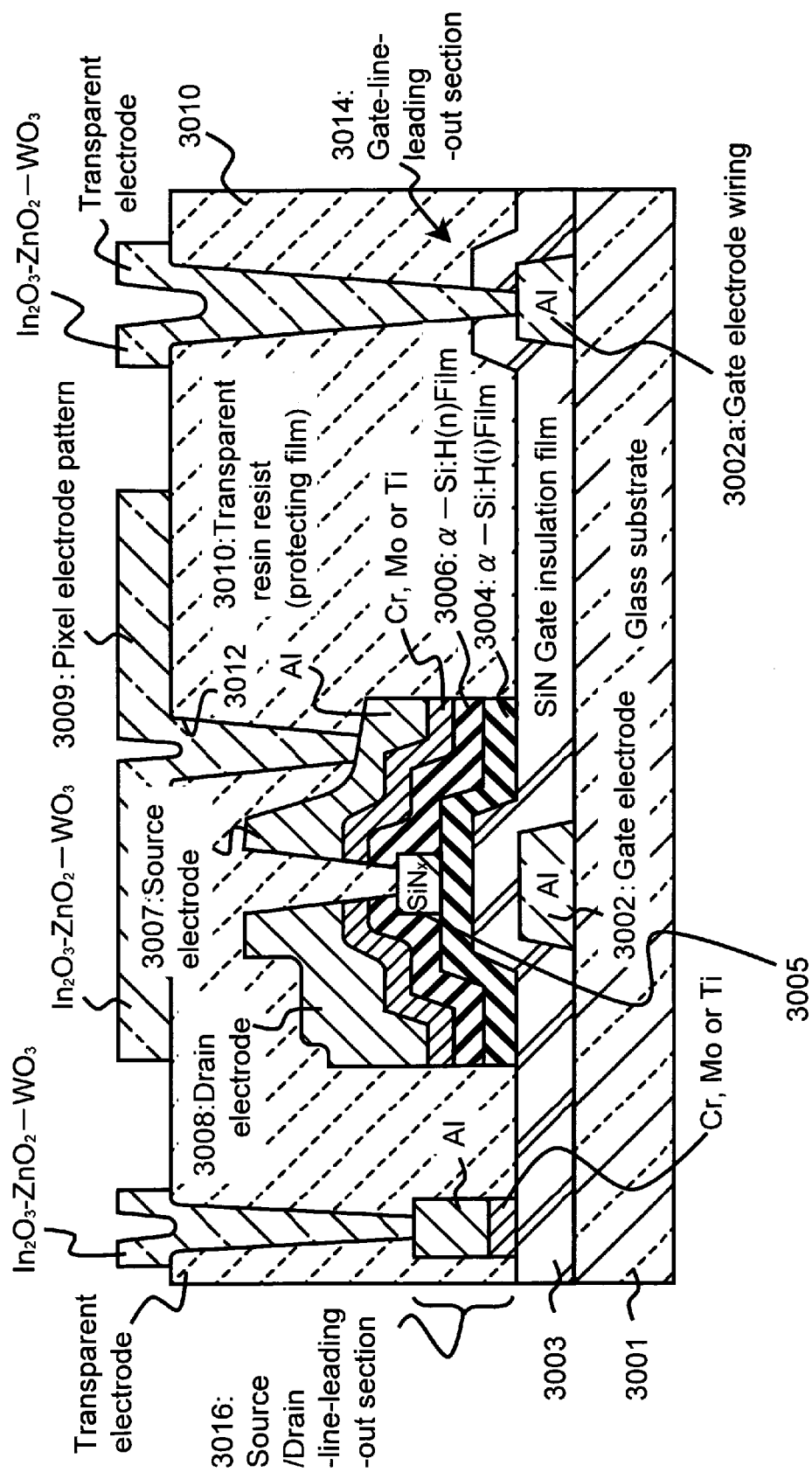
[FIG. 10] This is a sectional view of a vicinity of an α-SiTFT at a stage when the formation of a pattern of a pixel electrode is ended in the process of producing a liquid crystal flat display in the present embodiment.

In FIG. 10, only one TFT (thin film transistor) is illustrated. Actually, however, plural TFTs are arranged on a substrate to make an array structure. Since the structures of the TFTs are equal to each other, only a sectional view of the single TFT is illustrated in FIG. 10.

Thereafter, a light-shielding pattern is further formed subsequently to the state illustrated in FIG. 10, so as to complete an α-SiTFT active matrix substrate. This substrate is used to produce a TFT-LCD system flat display. The produced display can give halftone display (gray-scale display) without any problem. This TFT-LCD system flat display corresponds to one example of the liquid crystal display in the claims.

In present Example 4-9, there has been described an example wherein the sputtering target produced in Example 4-5 is used to produce a TFT array substrate and further it is used to make a liquid crystal display; it is also preferred to use sputtering targets of other Examples 4-1 to 4-7 to produce TFT array substrates. It is also preferred that the TFT array substrates are each used to make a liquid crystal display. In the same manner as described above, a liquid crystal display wherein halftone display (gray-scale display) is satisfactorily attained is obtained.

E. Examples about Ni, Nb, Fe, Pt, Pd and Lanthanoids

Hereinafter, examples about Ni, Nb, Fe, Pt, Pd and lanthanoids in the first group will be described.

In each of Example 4-10 to Example 4-23, which will be described below, the steps described in Examples 4-1 or 4-2, and Examples 4-3 and 4-5 were carried out to produce sputtering targets, and measure the relative densities and the average particle diameters thereof. The results are shown in Table 6. The same manner as in Example 4-8 was used to measure the contact resistance with Al. The results are also shown in Table 6.

A transparent electrode having a composition described in each of Example 4-10 to Example 4-23, which will be described below, was used to produce a liquid crystal display in the same manner as in Example 4-9. As a result, the display operated without any problem in the same manner as in above Embodiment 4-9, and was able to give halftone display satisfactorily.

The steps in Examples 4-1 or 4-2, and Example 4-3 or 4-5 were carried out, and the contact resistances with Al were measured by the method of Example 4-8. The devices operated without any problem in the same manner as the TFT device of Example 4-9.

Example 4-10

In present Example 4-10, Ni was adopted from the first group M1. Ga was adopted from the second group M2. The atomic composition ratio of Ni ([Ni]/[In]+[Ni]) was 0.03, and the atomic composition ratio of Ga ([Ga]/[In]+[Ga]) was 0.02. The relative density of the produced sputtering target was 97%. The average particle diameter was 2.1 μm (see Table 6).

Next, the resistance value was measured in the same way as in above Example 4-8. As a result, the specific resistance of the transparent electrode was 480 μΩcm (see Table 6).

The contact resistance with Al was 22.4Ω when glass, Al and the transparent electrode were laminated on glass in the order of "glass/Al/transparent electrode". The contact resistance with Al was 26.6Ω when the same were laminated on glass in the order of "glass/transparent electrode/Al" (see Table 6).

Example 4-11

In present Example 4-11, Ni was adopted from the first group M1. Zn was adopted from the second group M2. The atomic composition ratio of Ni ([Ni]/[In]+[Ni]) was 0.05, and the atomic composition ratio of Zn ([Zn]/[In]+[Zn]) was 0.08. The relative density of the produced sputtering target was 96%. The average particle diameter was 2.2 μm (see Table 6).

Next, the resistance value was measured in the same way as in above Example 4-8. As a result, the specific resistance of the transparent electrode was 562 μΩcm (see Table 6).

The contact resistance with Al was 21.3Ω when glass, Al and the transparent electrode were laminated on glass in the order of "glass/Al/transparent electrode". The contact resistance with Al was 25.4Ω when the same were laminated on glass in the order of "glass/transparent electrode/Al" (see Table 6).

TABLE 6

| Example | M1 | [M1]/ ([In] + [M1]) | M2 | [M2]/ ([In] + [M2]) | Relative density % | Average particle diameter mm | Transparent electrode specific resistance mΩ cm | Contact resistance with Al Ω Glass/Al/ transparent electrode | Contact resistance with Al Ω Glass/ transparent electrode/Al |
|---|---|---|---|---|---|---|---|---|---|
| 4-10 | Ni | 0.03 | Ga | 0.02 | 97 | 2.1 | 480 | 22.4 | 26.6 |
| 4-11 | Ni | 0.05 | Zn | 0.08 | 96 | 2.2 | 562 | 21.3 | 25.4 |
| 4-12 | Nb | 0.04 | Ge | 0.03 | 95 | 3.1 | 435 | 32.7 | 35.5 |
| 4-13 | Nb | 0.04 | Sn | 0.05 | 96 | 3.5 | 386 | 31.5 | 34.6 |
| 4-14 | Ce | 0.03 | — | — | 96 | 2.3 | 493 | 35.3 | 38.3 |
| 4-15 | Ce | 0.05 | Sn | 0.05 | 97 | 2.8 | 387 | 33.2 | 36.4 |
| 4-16 | Ho | 0.03 | — | — | 95 | 3.6 | 425 | 42.0 | 43.0 |
| 4-17 | Ho | 0.04 | Zn | 0.10 | 96 | 2.5 | 463 | 42.3 | 43.5 |
| 4-18 | Er | 0.04 | — | — | 95 | 3.7 | 487 | 39.9 | 43.8 |
| 4-19 | Fe | 0.04 | — | — | 97 | 4.3 | 456 | 28.4 | 34.2 |
| 4-20 | Fe | 0.05 | Zn | 0.10 | 95 | 4.2 | 450 | 29.6 | 35.4 |
| 4-21 | Pd | 0.03 | — | — | 96 | 4.1 | 564 | 37.6 | 47.6 |
| 4-22 | Pt | 0.03 | — | — | 95 | 4.2 | 657 | 23.7 | 26.8 |
| 4-23 | La | 0.10 | Zn | 0.30 | 98 | 2.2 | 620 | 23.0 | 39.3 |

The steps in Examples 4-1 or 4-2, and Example 4-3 or 4-5 were carried out, and the contact resistances with Al were measured by the method of Example 4-8. The devices operated without any problem in the same manner as the TFT device of Example 4-9.

Example 4-12

In present Example 4-12, Nb was adopted from the first group M1. Ge was adopted from the second group M2. The atomic composition ratio of Nb ([Nb]/[In]+[Nb]) was 0.04, and the atomic composition ratio of Ge ([Zn]/[In]+[Zn]) was 0.03. The relative density of the produced sputtering target was 95%. The average particle diameter was 3.1 μm (see Table 6).

Next, the resistance value was measured in the same way as in above Example 4-8. As a result, the specific resistance of the transparent electrode was 435 μΩcm (see Table 6).

The contact resistance with Al was 32.7Ω when glass, Al and the transparent electrode were laminated on glass in the order of "glass/Al/transparent electrode". The contact resistance with Al was 35.5Ω when the same were laminated on glass in the order of "glass/transparent electrode/Al" (see Table 6).

Example 4-13

In present Example 4-13, Nb was adopted from the first group M1. Sn was adopted from the second group M2. The atomic composition ratio of Nb ([Nb]/[In]+[Nb]) was 0.04, and the atomic composition ratio of Sn ([Sn]/[In]+[Sn]) was 0.05. The relative density of the produced sputtering target was 96%. The average particle diameter was 3.5 μm (see Table 6).

Next, the resistance value was measured in the same way as in above Example 4-8. As a result, the specific resistance of the transparent electrode was 386 μΩcm (see Table 6).

The contact resistance with Al was 31.5Ω when glass, Al and the transparent electrode were laminated on glass in the order of "glass/Al/transparent electrode". The contact resistance with Al was 34.6Ω when the same were laminated on glass in the order of "glass/transparent electrode/Al" (see Table 6).

Example 4-14

In present Example 4-14, Ce was adopted from the first group M1. No metal in the second group M2 was used. The atomic composition ratio of Ce ([Ce]/[In]+[Ce]) was 0.03. The relative density of the produced sputtering target was 96%. The average particle diameter was 2.3 μm (see Table 6).

Next, the resistance value was measured in the same way as in above Example 4-8. As a result, the specific resistance of the transparent electrode was 493 μΩcm (see Table 6).

The contact resistance with Al was 35.3Ω when glass, Al and the transparent electrode were laminated on glass in the order of "glass/Al/transparent electrode". The contact resistance with Al was 38.3Ω when the same were laminated on glass in the order of "glass/transparent electrode/Al" (see Table 6).

Example 4-15

In present Example 4-15, Ce was adopted from the first group M1. Sn was adopted from the second group M2. The atomic composition ratio of Ce ([Ce]/[In]+[Ce]) was 0.05, and the atomic composition ratio of Sn ([Sn]/[In]+[Sn]) was 0.05. The relative density of the produced sputtering target was 97%. The average particle diameter was 2.8 μm (see Table 6).

Next, the resistance value was measured in the same way as in above Example 4-8. As a result, the specific resistance of the transparent electrode was 387 μΩcm (see Table 6).

The contact resistance with Al was 33.2Ω when glass, Al and the transparent electrode were laminated on glass in the order of "glass/Al/transparent electrode". The contact resistance with Al was 36.4Ω when the same were laminated on glass in the order of "glass/transparent electrode/Al" (see Table 6).

Example 4-16

In present Example 4-16, Ho (holmium) was adopted from the first group M1. No metal in the second group M2 was used. The atomic composition ratio of Ho ([Ho]/[In]+[Ho]) was 0.03. The relative density of the produced sputtering target was 95%. The average particle diameter was 3.6 μm (see Table 6).

Next, the resistance value was measured in the same way as in above Example 4-8. As a result, the specific resistance of the transparent electrode was 425 μΩcm (see Table 6).

The contact resistance with Al was 42.0Ω when glass, Al and the transparent electrode were laminated on glass in the order of "glass/Al/transparent electrode". The contact resistance with Al was 43.0Ω when the same were laminated on glass in the order of "glass/transparent electrode/Al" (see Table 6).

Example 4-17

In present Example 4-17, Ho (holmium) was adopted from the first group M1. Zn was adopted from the second group M2. The atomic composition ratio of Ho ([Ho]/[In]+[Ho]) was 0.04, and the atomic composition ratio of Zn ([Zn]/[In]+[Zn]) was 0.10. The relative density of the produced sputtering target was 96%. The average particle diameter was 2.5 μm (see Table 6).

Next, the resistance value was measured in the same way as in above Example 4-8. As a result, the specific resistance of the transparent electrode was 463 μΩcm (see Table 6).

The contact resistance with Al was 42.3Ω when glass, Al and the transparent electrode were laminated on glass in the order of "glass/Al/transparent electrode". The contact resistance with Al was 43.5Ω when the same were laminated on glass in the order of "glass/transparent electrode/Al" (see Table 6).

Example 4-18

In present Example 4-18, Er (erbium) was adopted from the first group M1. No metal in the second group M2 was used. The atomic composition ratio of Er ([Er]/[In]+[Er]) was 0.04. The relative density of the produced sputtering target was 95%. The average particle diameter was 3.7 μm (see Table 6).

Next, the resistance value was measured in the same way as in above Example 4-8. As a result, the specific resistance of the transparent electrode was 487 μΩcm (see Table 6).

The contact resistance with Al was 39.9Ω when glass, Al and the transparent electrode were laminated on glass in the order of "glass/Al/transparent electrode". The contact resistance with Al was 43.8Ω when the same were laminated on glass in the order of "glass/transparent electrode/Al" (see Table 6).

Example 4-19

In present Example 4-19, Fe was adopted from the first group M1. No metal in the second group M2 was used. The atomic composition ratio of Fe ([Fe]/[In]+[Fe]) was 0.04. The relative density of the produced sputtering target was 97%. The average particle diameter was 4.3 μm (see Table 6).

Next, the resistance value was measured in the same way as in above Example 4-8. As a result, the specific resistance of the transparent electrode was 456 μΩcm (see Table 6).

The contact resistance with Al was 28.4Ω when glass, Al and the transparent electrode were laminated on glass in the order of "glass/Al/transparent electrode". The contact resistance with Al was 34.2Ω when the same were laminated on glass in the order of "glass/transparent electrode/Al" (see Table 6).

Example 4-20

In present Example 4-20, Fe (holmium) was adopted from the first group M1. Zn was adopted from the second group M2. The atomic composition ratio of Fe ([Fe]/[In]+[Fe]) was 0.05, and the atomic composition ratio of Zn ([Zn] [In]+[Zn]) was 0.10. The relative density of the produced sputtering target was 95%. The average particle diameter was 4.2 μm (see Table 6).

Next, the resistance value was measured in the same way as in above Example 4-8. As a result, the specific resistance of the transparent electrode was 450 μΩcm (see Table 6).

The contact resistance with Al was 29.6Ω when glass, Al and the transparent electrode were laminated on glass in the order of "glass/Al/transparent electrode". The contact resistance with Al was 35.4Ω when the same were laminated on glass in the order of "glass/transparent electrode/Al" (see Table 6).

Example 4-21

In present Example 4-21, Pd (palladium) was adopted from the first group M1. No metal in the second group M2 was used. The atomic composition ratio of Pd ([Pd]/[In]+[Pd]) was 0.03. The relative density of the produced sputtering target was 96%. The average particle diameter was 4.1 μm (see Table 6).

Next, the resistance value was measured in the same way as in above Example 4-8. As a result, the specific resistance of the transparent electrode was 564 μΩcm (see Table 6).

The contact resistance with Al was 37.6Ω when glass, Al and the transparent electrode were laminated on glass in the order of "glass/Al/transparent electrode". The contact resistance with Al was 47.6Ω when the same were laminated on glass in the order of "glass/transparent electrode/Al" (see Table 6).

Example 4-22

In present Example 4-22, Pt (platinum) was adopted from the first group M1. No metal in the second group M2 was used. The atomic composition ratio of Pt ([Pt]/[In]+[Pt]) was 0.03. The relative density of the produced sputtering target was 95%. The average particle diameter was 4.2 μm (see Table 6).

Next, the resistance value was measured in the same way as in above Example 4-8. As a result, the specific resistance of the transparent electrode was 657 μΩcm (see Table 6).

The contact resistance with Al was 23.7Ω when glass, Al and the transparent electrode were laminated on glass in the order of "glass/Al/transparent electrode". The contact resistance with Al was 26.8Ω when the same were laminated on glass in the order of "glass/transparent electrode/Al" (see Table 6).

Example 4-23

In present Example 4-23, La (lanthanum) was adopted from the first group M1. Zn was adopted from the second group M2. The atomic composition ratio of La ([La]/[In]+[La]) was 0.10, and the atomic composition ratio of Zn ([Zn]/[In]+[Zn]) was 0.18. The relative density of the produced sputtering target was 98%. The average particle diameter was 2.2 μm (see Table 6).

Next, the resistance value was measured in the same way as in above Example 4-8. As a result, the specific resistance of the transparent electrode was 620 μΩcm (see Table 6).

The contact resistance with Al was 23.0Ω when glass, Al and the transparent electrode were laminated on glass in the order of "glass/Al/transparent electrode". The contact resistance with Al was 39.3Ω when the same were laminated on glass in the order of "glass/transparent electrode/Al" (see Table 6).

F. Variations

As the above-mentioned examples, there have been described examples using only one from W, Mo, Ni, Nb, Fe, Pt, Pd and lanthanoids in the first group M1; needless to say, the same effects and advantages are produced when two or more therefrom are used.

As the above-mentioned examples, there have been described exampled using only one from Sn, Zn, Ge and Ga in the second group M2; needless to say, the same effects and advantages are produced when two or more therefrom are used.

FIG. 1
   SOURCE/DRAIN-LEADING-OUT SECTION
   PIXEL SECTION
   GATE-WIRING SECTION (LEADING-OUT SECTION)
FIG. 3
   FIRST FILM-FORMATION
   1102: KAPTON TAPE
   1100: SLIDE GLASS
   AFTER FIRST FILM-FORMATION (LIFTING-OFF OF KAPTON TAPE)
FIG. 4
   SECOND FILM-FORMATION
   1106: KAPTON TAPE
   1100: SLIDE GLASS
   AFTER SECOND FILM-FORMATION (LIFTING-OFF OF KAPTON TAPE)
FIG. 5
   RESISTANCE MEASUREMENT
   1108: METAL OXIDE
   1100: SLIDE GLASS
FIG. 6
   2000: GATE
   2001: TRANSPARENT INSULATING SUBSTRATE
   2002: GATE ELECTRODE
   2004: GATE INSULATING
   2005: SEMICONDUCTOR LAYER a-Si FILM
   2006: SEMICONDUCTOR LAYER $n^+$a-Si
   2021: TFT SECTION
   2022: TERMINAL SECTION
FIG. 7
   2004: GATE INSULATION FILM
   2007a: DRAIN ELECTRODE
   2007b: SOURCE ELECTRODE
   2009: INTERLAYER INSULATION FILM
   2010: CONTACT HOLE
   OTHERS: SEE FIG. 6

FIG. 8
- 2002: GATE
- 2007b: SOURCE
- 2005, 2006: SEMICONDUCTOR LAYER
- 2011: PIXEL ELECTRODE
- OTHERS: SEE FIGS. 6 & 7

FIG. 9
- Wiring of a Kelvin pattern
- Al ALLOY WIRING PATTERN
- METAL OXIDE WIRING PATTERN FIG. 10
- TRANSPARENT ELECTRODE
- 3016: SOURCE/DRAIN-LINE-LEADING-OUT SECTION
- 3009: PIXEL ELECTRODE PATTERN
- 3010: TRANSPARENT RESIN RESIST (PROTECTING FILM)
- 3014: GATE-LINE-LEADING-OUT SECTION
- 3006: α-Si:H (n) FILM
- 3003: SiN GATE INSULATION FILM
- 3002a: GATE ELECTRODEwiring
- 3001: GLASS SUBSTRATE
- OTHERS: SEE THE ABOVE FIG. 11
- Q is Cr, Mo or Ti.
- OTHERS: SEE THE ABOVE

The invention claimed is:

1. A sputtering target, which is made mainly of indium oxide, and comprises:
a first metal group M1 consisting of Pt, or an oxide or oxides of Pt, and
an oxide or oxides of one or two metal(s) selected from a second metal group M2 consisting of Ho and Er, and wherein the value of [M1]/([M1]+[In]), which is the relationship of the first metal group M1 consisting of Pt, or the metal oxide(s) to indium oxide, is from 0.005 to 0.2, wherein the [M1] represents the number of the atoms of the first metal group, and the [In] represents the number of the atoms of metallic indium.

2. The sputtering target according to claim 1, wherein the value of [M2]/([M2]+[In]), which is the relationship of the oxide(s) of one or two metal(s) selected from the second metal group M2 of lanthanoid-based metals to indium oxide, is from 0.005 to 0.2, and
wherein, the [M2] represents the number of the atoms of one or two metal(s) selected from the second metal group.

3. A sputtering target, which is made of indium oxide, and comprises:
a first metal group M1 consisting of Pt, or an oxide or oxides of Pt,
an oxide or oxides of one or two metal(s) selected from a second metal group M2 consisting of Ho, and Er, and
an oxide or oxides of one or two or more metal(s) selected from the third metal group M3 consisting of Zn, Sn, Zr, Ga and Ge, and wherein the value of [M1]/([M1]+[In]), which is the atomic composition ratio of the first metal group M1 consisting of Pt, or the metal oxide(s) to indium oxide, is from 0.005 to 0.2, wherein the [M1] represents the number of the atoms of the first metal group, and the [In] represents the number of the atoms of metallic indium.

4. The sputtering target according to claim 3, wherein
the value of [M2]/([M2]+[In]), which is the atomic composition ratio of the oxide(s) of one or two metal(s) selected from the second metal group M2 consisting of lanthanoid-based metals to indium oxide, is from 0.005 to 2, and
the value of [M3]/([M3]+[In]), which is the atomic composition ratio of the oxide(s) of the metal(s) selected from a third metal group M3 consisting of Zn, Sn, Zr, Ga and Ge to indium oxide, is from 0.005 to 2, and
wherein the [M2] represents the number of the atoms of one or two metal(s) selected from the second metal group, and the [M3] represents the number of the atoms of the metal(s) selected from the third metal group.

5. A sputtering target used at the time of producing a transparent electrode which is used in a TFT substrate for a liquid crystal display and is for driving the liquid crystal by sputtering, the transparent electrode being capable of being jointed electrically to an electrode or wiring made mainly of Al, and the sputtering target being made of an electroconductive oxide comprising:
indium oxide, and
one or two metal(s) selected from a first metal group M1 consisting of Fe, and Pt, or an oxide or oxides of the metal(s), and
an oxide or oxides of one or two metal(s) selected from a second metal group M2 consisting of Ho and Er, and wherein the value of [M1]/([In]+[M1]), which is the atomic composition ratio of the oxide(s) of one or two metal(s) selected from the first group M1 to indium in the electroconductive oxide, is from 0.005 to 0.2 wherein the [M1] represents the number of the atoms of one or two metal(s) selected from the first group M1 and the [In] represents the number of the atoms of indium.

6. The sputtering target according to claim 5, wherein the electroconductive oxide comprises an oxide or oxides of one or two or more metal(s) selected from the third group M3 consisting of tin, zinc, germanium, and gallium beside indium oxide.

7. The sputtering target according to claim 6, wherein [M3]/([In]+[M3]), which is the atomic composition ratio of the oxide(s) of the metal(s) selected from the third group M3 to indium in the electroconductive oxide, is from 0.01 to 0.3 wherein the M3 represents the number of the atoms of one or two or more metal(s) selected from the third group M3, that is, the number of the atoms of any one or any two or more of tin, zinc, germanium, and gallium, and the [In] represents the number of the atoms of indium.

* * * * *